US009715957B2

(12) United States Patent
Wang et al.

(10) Patent No.: US 9,715,957 B2
(45) Date of Patent: Jul. 25, 2017

(54) IRON NITRIDE PERMANENT MAGNET AND TECHNIQUE FOR FORMING IRON NITRIDE PERMANENT MAGNET

(71) Applicant: Regents of the University of Minnesota, Minneapolis, MN (US)

(72) Inventors: Jian-Ping Wang, Shoreview, MN (US); Yanfeng Jiang, Minneapolis, MN (US)

(73) Assignee: Regents of the University of Minnesota, Minneapolis, MN (US)

( * ) Notice: Subject to any disclaimer, the term of this patent is extended or adjusted under 35 U.S.C. 154(b) by 0 days.

(21) Appl. No.: 14/766,101

(22) PCT Filed: Feb. 6, 2014

(86) PCT No.: PCT/US2014/015104
§ 371 (c)(1),
(2) Date: Aug. 5, 2015

(87) PCT Pub. No.: WO2014/124135
PCT Pub. Date: Aug. 14, 2014

(65) Prior Publication Data
US 2015/0380135 A1 Dec. 31, 2015

Related U.S. Application Data

(60) Provisional application No. 61/762,147, filed on Feb. 7, 2013.

(51) Int. Cl.
*H01F 1/10* (2006.01)
*H01F 1/08* (2006.01)
(Continued)

(52) U.S. Cl.
CPC ............ *H01F 1/10* (2013.01); *B22D 11/001* (2013.01); *B22D 11/0622* (2013.01); *B22F 7/08* (2013.01);
(Continued)

(58) Field of Classification Search
None
See application file for complete search history.

(56) References Cited

U.S. PATENT DOCUMENTS 5,032,947 A 7/1991 Li et al.
5,068,147 A 11/1991 Hori et al.
(Continued)

FOREIGN PATENT DOCUMENTS

CN 1156516 A 8/1997
CN 1621549 A 6/2005
(Continued)

OTHER PUBLICATIONS

Gao, R. Feng, W., Chen, W, Wang, B., Han, G., and Zhang, P, Chin. Sci. Bul., v47(14), Jul. 2002, pp. 1166-1169.*
(Continued)

*Primary Examiner* — Kevin Bernatz
(74) *Attorney, Agent, or Firm* — Baker & Hostetler, LLP

(57) ABSTRACT

A bulk permanent magnetic material may include between about 5 volume percent and about 40 volume percent $Fe_{16}N_2$ phase domains, a plurality of nonmagnetic atoms or molecules forming domain wall pinning sites, and a balance soft magnetic material, wherein at least some of the soft magnetic material is magnetically coupled to the $Fe_{16}N_2$ phase domains via exchange spring coupling. In some examples, a bulk permanent magnetic material may be formed by implanting N+ ions in an iron workpiece using ion implantation to form an iron nitride workpiece, pre-annealing the iron nitride workpiece to attach the iron nitride workpiece to a substrate, and post-annealing the iron nitride workpiece to form $Fe_{16}N_2$ phase domains within the iron nitride workpiece.

35 Claims, 37 Drawing Sheets

(51) Int. Cl.
H01F 1/055 (2006.01)
H01F 1/147 (2006.01)
H01F 1/34 (2006.01)
H01F 41/02 (2006.01)
C22C 38/00 (2006.01)
B22F 7/08 (2006.01)
C23C 8/26 (2006.01)
C23C 8/80 (2006.01)
C23C 14/48 (2006.01)
C22C 29/16 (2006.01)
B22D 11/00 (2006.01)
B22D 11/06 (2006.01)
H01F 1/057 (2006.01)

(52) U.S. Cl.
CPC ............ *C22C 29/16* (2013.01); *C22C 38/001* (2013.01); *C23C 8/26* (2013.01); *C23C 8/80* (2013.01); *C23C 14/48* (2013.01); *H01F 1/055* (2013.01); *H01F 1/086* (2013.01); *H01F 1/147* (2013.01); *H01F 1/34* (2013.01); *H01F 41/0253* (2013.01); *C22C 2202/02* (2013.01); *H01F 1/0579* (2013.01)

(56) References Cited

U.S. PATENT DOCUMENTS

| | | | |
|---|---|---|---|
| 5,137,588 | A | 8/1992 | Wecker et al. |
| 5,330,554 | A | 7/1994 | Koyano et al. |
| 5,449,417 | A | 9/1995 | Shimizu et al. |
| 6,139,765 | A * | 10/2000 | Kitazawa ............ H01F 1/0557 148/104 |
| 6,217,672 | B1 | 4/2001 | Zhang |
| 6,319,485 | B1 | 11/2001 | Nagatomi et al. |
| 6,457,629 | B1 | 10/2002 | White |
| 6,778,358 | B1 | 8/2004 | Jiang et al. |
| 7,238,439 | B2 | 7/2007 | Sasaki et al. |
| 2002/0117102 | A1 | 8/2002 | Takahashi et al. |
| 2002/0191354 | A1 | 12/2002 | Yoshikawa et al. |
| 2002/0197530 | A1 | 12/2002 | Tani et al. |
| 2005/0208320 | A1 | 9/2005 | Masada et al. |
| 2006/0105170 | A1 | 5/2006 | Dobson et al. |
| 2006/0112873 | A1 | 6/2006 | Uchida et al. |
| 2008/0166584 | A1 | 7/2008 | Deligianni et al. |
| 2009/0042063 | A1 | 2/2009 | Inoue et al. |
| 2009/0087688 | A1 | 4/2009 | Masaki |
| 2010/0035086 | A1 | 2/2010 | Inoue et al. |
| 2010/0104767 | A1 | 4/2010 | Sskuma et al. |
| 2010/0288964 | A1 | 11/2010 | Pirich et al. |
| 2011/0059005 | A1 | 3/2011 | Sankar et al. |
| 2011/0074531 | A1 | 3/2011 | Yamashita et al. |
| 2012/0090543 | A1 | 4/2012 | Cheong |
| 2012/0145944 | A1 | 6/2012 | Komuro et al. |
| 2012/0153212 | A1 | 6/2012 | Liu |
| 2013/0126775 | A1* | 5/2013 | Abe ............ H01F 1/01 252/62.55 |
| 2013/0140076 | A1 | 6/2013 | Lee et al. |
| 2014/0001398 | A1 | 1/2014 | Takahashi et al. |
| 2014/0290434 | A1 | 10/2014 | Matthiesen |
| 2014/0299810 | A1* | 10/2014 | Wang ............ B32B 15/011 252/62.55 |
| 2015/0380135 | A1 | 12/2015 | Wang et al. |
| 2015/0380158 | A1 | 12/2015 | Brady et al. |
| 2016/0042846 | A1 | 2/2016 | Wang et al. |
| 2016/0042849 | A1 | 2/2016 | Wang et al. |
| 2016/0141082 | A1 | 5/2016 | Wang et al. |
| 2016/0189836 | A1 | 6/2016 | Takahashi et al. |

FOREIGN PATENT DOCUMENTS

| | | |
|---|---|---|
| CN | 102576591 A | 7/2012 |
| CN | 103339694 A | 10/2013 |
| CN | 103827986 A | 5/2014 |
| CN | 105849834 A | 6/2014 |
| EP | 0509361 A2 | 10/1992 |
| EP | 0633581 A1 | 1/1995 |
| EP | 0994493 A2 | 4/2000 |
| EP | 1548760 A2 | 6/2005 |
| EP | 1675133 A2 | 6/2006 |
| EP | 2492927 A1 | 8/2012 |
| EP | 2666563 A1 | 11/2013 |
| EP | 2696356 A1 | 2/2014 |
| JP | S1143557 A | 7/1986 |
| JP | S1157634 A | 7/1986 |
| JP | S2232101 A | 10/1987 |
| JP | S3132701 A | 6/1988 |
| JP | H02173209 A | 7/1990 |
| JP | H02212320 A | 8/1990 |
| JP | H03100124 A | 4/1991 |
| JP | H04217305 A | 8/1992 |
| JP | H05269503 A | 10/1993 |
| JP | H05311390 A | 11/1993 |
| JP | H05326239 A | 12/1993 |
| JP | H0696947 A | 4/1994 |
| JP | H06267722 A | 9/1994 |
| JP | 2000176513 A | 6/2000 |
| JP | 2001135508 A | 5/2001 |
| JP | 2001176715 A | 6/2001 |
| JP | 2002334695 A | 11/2002 |
| JP | 2004319923 A | 11/2004 |
| JP | 2005183932 A | 7/2005 |
| JP | 2007070669 A | 3/2007 |
| JP | 2007273038 A | 10/2007 |
| JP | 2008311518 A | 12/2008 |
| JP | 2009259402 A | 11/2009 |
| JP | 2012246174 A | 12/2012 |
| JP | 2013069926 A | 4/2013 |
| JP | 2013080922 A | 5/2013 |
| KR | 1020120091091 A | 8/2012 |
| TW | 272293 B | 3/1996 |
| TW | I303072 B | 11/2008 |
| TW | 201249564 A | 12/2012 |
| TW | 201447934 A | 12/2014 |
| WO | WO 2011049080 A1 | 4/2011 |
| WO | WO 2012159096 A2 | 11/2012 |
| WO | WO 2013026007 A2 | 2/2013 |
| WO | WO 2013042721 A1 | 3/2013 |
| WO | WO 2013090895 A1 | 6/2013 |
| WO | WO 2014124135 A2 | 8/2014 |
| WO | 2014210027 A1 | 12/2014 |
| WO | WO 2014210027 A1 | 12/2014 |
| WO | 2015148810 A1 | 10/2015 |
| WO | 2016022685 A1 | 2/2016 |
| WO | 2016022711 A1 | 2/2016 |
| WO | 2016122712 A1 | 8/2016 |
| WO | 2016122971 A1 | 8/2016 |
| WO | 2016122987 A1 | 8/2016 |

OTHER PUBLICATIONS

Gaimsditch, M., Camley, R., Fullerton, E., Jiang, S., Dader, S., and Sowers, C., J. App. Phs., v85(8), Apr. 1999, pp. 5901-5904.*
International Search Report and Written Opinion of counterpart International Application No. PCT/US2014/015104, mailed Nov. 27, 2014, 11 pp.
Slater, "Electronic Structure of Alloys," Journal of Applied Physics, vol. 8, No. 6, Jun. 1937, 8 pp.
Kikkawa et al., "Fine Fe16N2 powder prepared by low-temperature nitridation," Materials Research Bulletin, vol. 43, ScienceDirect, Feb. 19, 2008, 8 pp.
Zayak et al., "First-principles investigations of homogenous lattice-distortive strain and shuffles in Ni2MnGA," Journal of Physics: Condensed Matter, vol. 15, No. 2, Jan. 22, 2003, 8 pp.
Bogaerts et al., "Monte Carlo simulation of an analytical glow discharge: motion of electrons, ions and fast neutrals in the cathode dark space," Spectrochimica Acta, vol. 50B, No. 1, Jan. 1995, 20 pp.
Gagnoud et al., "Electromagnetic Modelling of Induction Melting Devices in Cold Crucible," IEEE Transactions on Magnetics, vol. 24, No. 1, Jan. 1988, 5 pp.

(56) References Cited

OTHER PUBLICATIONS

Sakuma, "Electronic and Magnetic Structure of Iron Nitride, Fe16N2 (invited)," Journal of Applied Physics, vol. 79, No. 8, Apr. 15, 1996, 8 pp.
Becke, "Density-Functional Exchange-Energy Approximation With Correct Asymptotic Behavior," Physical Review A General Physics, vol. 38, No. 6, Sep. 15, 1988, 4 pp.
Floris et al., "Vibrational Properties of MnO and NiO from DFT + U-Based Density Functional Perturbation Theory," Physical Review B Condensed Matter, vol. 84, Oct. 2011, 6 pp.
Liechtenstein et al., "Density-Functional Theory and Strong Interactions: Orbital Ordering in Mott-Hubbard Insulators," Physical Review B Condensed Matter, vol. 52, No. 8, Aug. 15, 1995, 5 pp.
Vasil'Ev et al., "Structural and Magnetic Phase Transitions in Shape-Memory Alloys Ni2+xMn1-xGa," Physical Review B: Condensed Matter and Materials Physics, vol. 59. No. 2, Jan. 1, 1999, pp. 1113-1120.
Sozinov et al., "Crystal Structures and Magnetic Anisotropy Properties of Ni—Mn—Ga Martensitic Phases With Giant Magnetic-Field-Induced Strain," IEEE Transactions on Magnetics, vol. 38, No. 5, Sep. 2002, pp. 2814-2816.
Zayak et al., "Switchable Ni—Mn—Ga Heusler nanocrystals," Journal of Applied Physics vol. 104, No. 7, Oct. 2008, 6 pp.
Likhachev et al., "Modeling the Strain Response, Magneto-Mechanical Cycling Under the External Stress, Work Output and Energy Losses in Ni—Mn—Ga," Mechanics of Materials, vol. 38, May 2006 pp. 551-563.
Morisako et al., "Magnetic Anisotropy and Soft Magnetism of Iron Nitride Thin Films Prepared by Facing-Target Sputtering," Journal of Applied Physics, vol. 69, No. 8, Apr. 15, 1991, pp. 5619-5621.
Jordan et al., "Magnetic Fluid Hyperthermia (MFH): Cancer Treatment with AC Magnetic Field Induced Excitation of Biocompatible Superparamagnetic Nanoparticles," Journal of Magnetism and Magnetic Materials vol. 201, Jul. 1, 1999 pp. 413-419.
Chakrabarti et al., "Influence of Ni Doping on the Electronic Structure of Ni2MnGa," Physical Review B vol. 72, Aug. 5, 2005, 4 pp.
Kirby et al., "Anomalous ferromagnetism in TbMnO3 thin films," Journal of Applied Physics, vol. 105, No. 7, Apr. 2009, 5 pp.
"2014 Titans of Technology—Jian-Ping Wang," Minneapolis/St. Paul Business Journal, Sep. 19, 2014, 18 pp.
Brady et al., "The Formation of Protective Nitride Surfaces for PEM Fuel Cell Metallic Bipolar Plates," Journal of the Minerals, Aug. 2006, pp. 50-57.
Himmetoglu, et al., "First-Principles Study of Electronic and Structural Properties of CuO," Physical Review B. vol. 84, Sep. 14, 2011, 8 pp.
Wedel et al., "Low Temperature Crystal Structure of Ni—Mn—Ga Alloys," Journal of Alloys and Compounds, vol. 290, Aug. 30, 1999 pp. 137-143.
Min, "Enhancement of Fe Magnetic Moments in Ferromagnetic Fe16B2, Fe16C2, and Fe16N2," International Journal of Modern Physics B. vol. 7, No. 1-3, Jan. 1993, pp. 729-732.
Bozorth, "Atomic Moments of Ferromagnetic Alloys," The Physical Review, vol. 79, No. 5, Sep. 1, 1950. pp. 887.
Rong et al., "Fabrication of Bulk Nanocomposite Magnets Via Severe Plastic Deformation and Warm Compaction," Applied Physics Letters, vol. 96, No. 10, Mar. 8, 2010, 3 pp.
Lorenz et al., "Precise Determination of the Bond Percolation Thresholds and Finite-Size Scaling Corrections for the sc, fcc, and bcc Lattices," Physical Review E, vol. 57, No. 1, Jan. 1998, pp. 230-236.
Majkrzak, "Polarized Neutron Reflectometry," Physica B: Condensed Matter, vol. 173, No. 1 & 2, Aug. 1991, 16 pp.
Opeil et al., "Combined Experimental and Theoretical Investigation of the Premartensitic Transition in Ni2MnGa," Physical Review Letters, vol. 100, Apr. 25, 2008, 4 pp.
Gao et al., "Quantitative Correlation of Phase Structure With the Magnetic Moment in rf Sputtered Fe—N Films," Journal of Applied Physics, vol. 73, No. 10, May 15, 1993, pp. 6579-6581.
Ortiz et al., "Epitaxial Fe16N2 Films Grown by Sputtering," Applied Physics Letters, vol. 65. No. 21, Nov. 21, 1994, pp. 2737-2739.
Cheng et al., "Tempering of Iron-Carbon-Nitrogen Martensites," Metallurgical Transactions A: Physical Metallurgy and Materials Science, vol. 23A, No. 4, Apr. 1992, pp. 1129-1145.
Chikazumi, "Physics of Ferromagnetism," Oxford Science Publications, Ed. 2, 1999, pp. 199-203. (Applicant points out, in accordance with MPEP 609.04(a), that the year of publication, 1999, is sufficiently earlier than the effective U.S. filing date, Feb. 7, 2013, so that the particular month of publication is not in issue).
Wehrenberg et al., "Shock Compression Response of α"-Fe16N2 Nanoparticles," Journal of Applied Physics, vol. 111, No. 8, Apr. 23, 2012, 8 pp.
Ceperley et al., "Ground State of the Electron Gas by a Stochastic Method," Physical Review Letters, vol. 45, No. 7, Aug. 18, 1980, pp. 566-569.
Borsa et al., "Phase Identification of Iron Nitrides and Iron Oxy-Nitrides with Mössbauer Spectroscopy," Hyperfine Interactions, vol. 151/152, Dec. 2003, pp. 31-48.
Cook, "Strain Induced Martensite Formation in Stainless Steel," Metallurgical Transactions A, vol. 18A, No. 2, Feb. 1987, pp. 201-210.
Sun et al., "Epitaxial Single Crystal Fe16N2 Films Grown by Facing Targets Sputtering," Journal of Applied Physics, vol. 79, No. 8, Apr. 15, 1996, pp. 5440-5442.
Ping et al., "Partitioning of Ga and Co Atoms in a Fe3B/Nd2Fe14B Nanocomposite Magnet," Journal of Applied Physics, vol. 83, No. 12, Jun. 15, 1998, pp. 7769-7775.
Scherlis et al., "Simulation of Heme Using DFT +U: A Step Toward Accurate Spin-State Energetics," The Journal of Physical Chemistry, vol. 111, No. 25, Apr. 21, 2007, pp. 7384-7391.
Jugovic et al., "A Review of Recent Developments in the Synthesis Procedures of Lithium Iron Phosphate Powders," Journal of Power Sources, vol. 190, Feb. 6, 2009, pp. 538-544.
Fullerton et al., "Structure and Magnetic Properties of Exchange-Spring Sm-Co/Co Superlattices," Applied Physics Letters vol. 72, No. 3, Jan. 19, 1998, pp. 380-382.
Van Voorthuysen et al., "Low-Temperature Extension of the Lehrer Diagram and the Iron-Nitrogen Phase Diagram," Metallurgical and Materials Transactions A: Physical Metallurgy and Materials Science, vol. 33A, No. 8, Aug. 2002, pp. 2593-2598.
Kita et al., "Magnetic Properties of Core-Shell Type Fe16N2 Nanoparticles," Journal of Magnetism and Magnetic Materials, vol. 310, Nov. 21, 2006, pp. 2411-2413.
Kneller et al., "The Exchange-Spring Magnet: A New Material Principle for Permanent Magnets," IEEE Transaction on Magnetics, vol. 27, No. 4, Jul. 1991, pp. 3588-3600.
Lavernia et al., "The Rapid Solidification Processing of Materials: Science, Principles, Technology, Advances, and Applications," Journal of Material Science, vol. 45, Dec. 1, 2009, pp. 287-325.
Casoli et al., "Exchange-Coupled FePt/Fe Bilayers with Perpendicular Magnetization," IEEE Transactions on Magnetics, vol. 41, No. 10, Oct. 2005, pp. 3877-3879.
Zhou et al., "Phase Separation in LixFePO4 Induced by Correlation Effects," Physical Review B, vol. 69, May 12, 2004, 4 pp.
Zhou et al., "First-Principles Prediction of Redox Potentials in Transition-Metal Compounds with LDA+U," Physical Review B. vol. 70, Dec. 20, 2004, 8 pp.
Zhou et al., "The Li Intercalation Potential of LiMPO4 and LiMSiO4 Olivines with M=Fe, Mn, Co, Ni," Electrochemistry Communications, vol. 6, Sep. 25, 2004, pp. 1144-1148.
Zhou et al., "Configurational Electronic Entropy and the Phase Diagram of Mixed-Valence Oxides: The Case of LixFePO4," Physical Review Letters, vol. 97, Oct. 13, 2006, 4 pp.
Herzer, "Grain Size Dependence of Coercivity and Permeability in Nanocrystalline Ferromagnets," IEEE Transactions on Magnetics, vol. 26, No. 5, Sep. 1990, pp. 1397-1402.
Ludtka et al., "In Situ Evidence of Enhanced Transformation Kinetics in a Medium Carbon Steel Due to a High Magnetic Field," Scripta Materialia, vol. 51, Apr. 20, 2004, pp. 171-174.

(56) References Cited

OTHER PUBLICATIONS

Felcher, "Neutron Reflection as a Probe of Surface Magnetism," Physical Review B: Condensed Matter, vol. 24, No. 3, Aug. 1, 1981, pp. 1595-1598.
Speich et al., "Elastic Constants of Binary Iron-Base Alloys," Metallurgical Transactions, vol. 3, No. 8, Aug. 1972, pp. 2031-2037.
Fernando et al., "Magnetic Moment of Iron in Metallic Environments," Physical Review B, vol. 61, No. 1, Jan. 1, 2000, pp. 375-381.
Felcher, "Magnetic Depth Profiling Studies by Polarized Neutron Reflection," Physica B: Condensed Matter, vol. 192, Nos. 1 & 2, Oct. 1993, pp. 137-149.
Gaunt, "The Magnetic Properties of Platinum Cobalt Near the Equiatomic Composition Part II. Mechanism of Magnetic Hardening," The Philosophical Magazine, vol. 13, No. 123, Mar. 1966, pp. 579-588.
Takahashi et al., "α"-Fe16N2 Problem—Giant Magnetic Moment or Not," Journal of Magnetism and Magnetic Materials, vol. 208, No. 3, Jan. 11, 2000, pp. 145-157.
Shokrollahi et al., "Soft Magnetic Composite Materials (SMCs)," Journal of Materials Processing Technology, vol. 189, Feb. 20, 2007, pp. 1-12.
Sugita et al., "Magnetic and Electrical Properties of Single-Phase, Single-Crystal Fe16N2 Films Epitaxially Grown by Molecular Beam Epitaxy (Invited)," Journal of Applied Physics, vol. 79, No. 8, Apr. 15, 1996, pp. 5576-5581.
Takahashi et al., "Perpendicular Uniaxial Magnetic Anisotropy of Fe16N2(001) Single Crystal Films Grown by Molecular Beam Epitaxy," IEEE Transactions on Magnetics, vol. 35, No. 5, Sep. 1999, pp. 2982-2984.
Tanaka et al., "Electronic Band Structure and Magnetism of Fe16N2 Calculated by the FLAPW Method," Physical Review B: Condensed Matter and Materials Physics, vol. 62, No. 22, Dec. 1, 2000, pp. 15042-15046.
Zeng et al., "Exchange-Coupled Nanocomposite Magnets by Nanoparticle Self-Assembly," Nature, vol. 420, No. 6914, Nov. 28, 2002, pp. 395-398.
Du, "A Reevaluation of the Fe—N and Fe—C—N Systems," Journal of Phase Equilibria, vol. 14, No. 6, Aug. 24, 1993, pp. 682-693.
Jiang et al., "The Thermostability of the Fe16N2 Phase Deposited on a GaAs Substrate by Ion-Bean-Assisted Deposition," Journal of Physical Condensed Matter, vol. 6, Mar. 17, 1994, pp. L279-L282.
Jan et al., "Monte Carlo Simulations of Spin-1/2 Micelle and Microemulsion Models," Journal De Physique, vol. 49, No. 4, Apr. 1988, pp. 623-633.
Nelson, "Epitaxial Growth From the Liquid State and Its Application to the Fabrication of Tunnel and Laser Diodes," RCA Review, vol. 24, No. 4, Dec. 1963, pp. 603-615.
Shinno et al., "Effects of Film Thickness on Formation Processes of Fe16N2 in Nitrogen Ion-Implanted Fe Films," Surface and Coatings Technology vol. 103-104, May 1998, pp. 129-134.
Takahashi et al., "Ferromagnetic Resonance Studies of Fe16N2 Films with a Giant Magnetic Moment," Journal of Applied Physics, vol. 73, No. 10, May 15, 1993, pp. 6060-6062.
Shimba et al., "Preperation of Iron Nitride Fe16N2 Nanoparticles by Reduction of Iron Nitrate," J. Japan Inst. Metals, vol. 74, No. 3, 2010, 5 pp. (Applicant points out, in accorance with MPEP 60.04(a), that the year of publication, 2010, is sufficiently earlier than the effective U.S. filing date, Feb. 7, 2013, so that the particular motn of publication is not in issue).
Hook et al., "Magnetic Order," Solid State Physics, Ed. 2, Ch. 8, 1991, pp. 219-252. (Applicant points out, in accorance with MPEP 60.04(a), that the year of publication, 1991, is sufficiently earlier than the effective U.S. filing date, Feb. 7, 2013, so that the particular motn of publication is not in issue).
Hsu et al., "First-Principles Study for Low-Spin LaCoO3 with a Structurally Consistent Hubbard U," Physical Review B, vol. 79, Mar. 31, 2009, 9 pp.
Hsu et al., "Spin-State Crossover and Hyperfine Interactions of Ferric Iron in MgSiO3 Perovskite," Physical Review Letters, vol. 106, Mar. 18, 2011, 4 pp.
McCurrie, "Chapter 3: The Structure and Properties of Alinco Permanent Magnet Alloys," Handbook of Ferromagnetic Materials, vol. 3, 1982, 82 pp. (Applicant points out, in accorance with MPEP 60.04(a), that the year of publication, 1982, is sufficiently earlier than the effective U.S. filing date, Feb. 7, 2013, so that the particular motn of publication is not in issue).
Kulik et al., "Density Functional Theory in Transition-Metal Chemistry: A Self-Consistent Hubbard U Approach," Physical Review Letters, vol. 97, Sep. 8, 2006, 4 pp.
Bae et al., "Cost Effective Parallel-Branch Spiral Inductor with Enhanced Quality Factor and Resonance Frequency," Electronics and Telecommunications Research Institute, 2007, pp. 87-90. (Applicant points out, in accorance with MPEP 60.04(a), that the year of publication, 2007, is sufficiently earlier than the effective U.S. filing date, Feb. 7, 2013, so that the particular motn of publication is not in issue).
Galanakis et al., "Spin-Polarization and Electronic Properties of Half-Metallic Heusler Alloys Calculated from First Principles," Journal of Physics: Condensed Matter, vol. 19, No. 31, Jul. 3, 2007 (online), 16 pp.
Al-Omari et al., "Magnetic Properties of Nanostructured CoSm/FeCo Films," Physical Review B, vol. 52, No. 5, Aug. 1, 1995, pp. 3441-3447.
Mazin et al., "Insulating Gap in FeO: Correlations and Covalency," Physical Review B, vol. 55, No. 19, May 15, 1997, pp. 12822-12825.
Solovyev et al., "Corrected Atomic Limit in the Local-Density Approximation and the Electronic Structure of d Impurities in Rb," Physical Review B, vol. 50, No. 23, Dec. 15, 1994, pp. 16861-16871.
Campos et al., "Evaluation of the Diffusion Coefficient of Nitrogen in Fe4N1-x Nitride Layers During Microwave Post-Discharge Nitriding," Applied Surface Science, vol. 249, Dec. 30, 2004, pp. 54-59.
Issakov et al., "Fast Analytical Parameters Fitting of Planar Spiral Inductors," 2008 IEEE International Conference on Microwaves, Communications, Antennas and Electronic Systems, May 13-14, 2008, 10 pp.
Borchers et al., "Observation of Antiparallel Magnetic Order in Weakly Coupled Co/Cu Multilayers," Physical Review Letters, vol. 82, No. 13, Mar. 29, 1999, pp. 2796-2799.
Takahashi et al., "Structure and Magnetic Moment of α"-Fe16N2 Compound Films: Effect of Co and H on Phase Formation (Invited)," Journal of Applied Physics, vol. 79, No. 8, Apr. 15, 1996, pp. 5564-5569.
Buschbeck et al., "Full Tunability of Strain Along the fcc-bcc Bain Path in Epitaxial Films and Consequences for Magnetic Properties," Physical Review Letters, vol. 103, Nov. 20, 2009, 4 pp.
Chakhalian et al., "Magnetism at the Interface Between Ferromagnetic and Superconducting Oxides," Nature Physics, vol. 2, Apr. 1, 2006, pp. 244-248.
Cui et al., "Phase Transformation and Magnetic Anisotropy of an Iron-Palladium Ferromagnetic Shape-Memory Alloy," Acta Materialia, vol. 52, No. 1, Jan. 5, 2004, 35-47.
Davies et al., "Anisotropy Dependence of Irreversible Switching in Fe/SmCo and FeNi/FePt Exchange Spring Magnet Films," Applied Physics Letters, vol. 86, No. 26, Jun. 27, 2005, 3 pp.
Herbst et al., "Neodymium-Iron-Boron Permanent Magnets," Journal of Magnetism and Magnetic Materials, vol. 100, Nos. 1-3, Nov. 1991, pp. 57-78.
Fidler et al., "Recent Developments in Hard Magnetic Bulk Materials," Journal of Physics: Condensed Matter, vol. 16, Jan. 23, 2004, pp. 455-470.
Haenl et al., "Room-Temperature Ferroelectricity in Strain SrTiO3," Nature, vol. 430, Aug. 12, 2004, pp. 758-761.
Hoppler et al., "Giant Superconductivity-Induced Modulation of the Ferromagnetic Magnetization in a Cuprate-Manganite Superlattice," Nature Materials, vol. 8, Apr. 2009, pp. 315-319.
Coey, "The Magnetization of Bulk α"-Fe16N2 (Invited)," Journal of Applied Physics, vol. 76, No. 19, Nov. 15, 1994, pp. 6632-6636.

(56) References Cited

OTHER PUBLICATIONS

Coey, "Magic Moments in Magnetism," Physics World, vol. 6, No. 8, Aug. 1993, pp. 25-26.
Qiu et al., "Tuning the Crystal Structure and Magnetic Properties of FePt Nanomagnets," Advanced Materials, vol. 19, Jun. 6, 2007, pp. 1703-1706.
Wang, "FePt Magnetic Nanoparticles and Their Assembly for Future Magnetic Media," Proceedings of the IEEE, vol. 96, No. 11, Nov. 2008, pp. 1847-1863.
Qiu et al., "Monodispersed and Highly Ordered L10 FePt Nanoparticles Prepared in the Gas Phase," Applied Physics Letters, vol. 88, May 9, 2006, 3 pp.
Qiu et al., "In Situ Magnetic Field Alignment of Directly Ordered L10 FePt Nanoparticles," Applied Physics Letters, vol. 89, Nov. 29, 2006, 3 pp.
Liu et al., "High Energy Products in Rapidly Annealed Nanoscale Fe/Pt Multilayers," Applied Physics Letters, vol. 72, No. 4, Jan. 26, 1998, pp. 483-485.
Wang et al., "Fabrication of Fe16N2 Films by Sputtering Process and Experimental Investigation of Origin of Giant Saturation Magnetization in Fe16N2," IEEE Transactions on Magnetics, vol. 48, No. 5, May 2012, pp. 1710-1717.
Shi et al., "Diamond-Like Carbon Films Prepared by Facing-Target Sputtering," Thin Solid Films, vols. 420-421, Dec. 2, 2002, pp. 172-175.
Jiang et al., "Improving Exchange-Spring Nanocomposite Permanent Magnets," Applied Physics Letters, vol. 85, No. 22, Nov. 29, 2004, pp. 5293-5295.
Zhou et al., "Permanent-Magnet Properties of Thermally Processed FePt and FePt-Fe Multilayer Films," IEEE Transactions on Magnetics, vol. 38, No. 5, Sep. 2002, pp. 2802-2804.
MacLaren, "Role of Alloying on the Shape Memory Effect in Ni2MnGa," Journal of Applied Physics, vol. 91, No. 10, May 15, 2002, pp. 7801-7803.
Perdew et al., "Self-Interaction Correction to Density-Functional Approximations for Many-Electron Systems," Physical Review B, vol. 23, No. 10, May 15, 1981, pp. 5048-5079.
Dong et al., "Shape Memory and Ferromagnetic Shape Memory Effects in Single-Crystal Ni2MnGa Thin Films," Journal of Applied Physics, vol. 95, No. 5, Mar. 1, 2004, pp. 2593-2600.
Bland et al., "Ferromagnetic Moments in Metastable Magnetic Films by Spin-Polarized-Neutron Reflection," Physical Review Letters, vol. 58, No. 12, Mar. 23, 1987, pp. 1244-1247.
Bland et al., "Layer Selective Magnetometry in Ultrathin Magnetic Structures by Polarised Neutron Reflection," Journal of Magnetism and Magnetic Materials, vol. 165, Jun. 1997, pp. 46-51.
Ji et al., "Elemental Specific Study on FeCo—Au nanoparticles," Bulletin of the American Physical Society, APS Meeting 2010, vol. 55, No. 2, Mar. 15-19, 2010, 1 pp.
Coey, "Permanent Magnet Applications" Journal of Magnetism and Magnetic Materials, vol. 248, Apr. 24, 2002, pp. 441-456.
Zhang et al., "Polarizer angular dependence of spin transfer oscillation in magnetic tunnel junction," Bulletin of the American Physical Society, APS Meeting 2010, vol. 55, No. 2, Mar. 15-19, 2010, 1 pp.
Kronmüller et al., "Micromagnetic Analysis of the Magnetic Hardening Mechanisms in RE—Fe—B Magnets," Journal De Physique, C8, No. 12, Tome 49, Dec. 1988, 6 pp.
Tang et al., "Formation of Nanocrystalline Fe—N—B—Cu Soft Magnetic Ribbons," Journal of Non-Crystalline Solids, vol. 337, Sep. 9, 2003, pp. 276-279.
Chen et al., "Modeling of On-Chip Differential Inductors and Transformers/Baluns," IEEE Transactions on Electron Devices, vol. 54, No. 2, Feb. 2007, pp. 369-371.
Ji et al., "N Site Ordering Effect on Partially Ordered Fe16N2," Applied Physics Letters, vol. 98, No. 9, Feb. 28, 2011, 3 pp.
Ji et al., "Epitaxial High Saturation Magnetization FeN Thin Films on Fe(001) Seeded GaAs(001) Single Crystal Wafer Using Facing Target Sputterings," Journal of Applied Physics, vol. 109, No. 7, Apr. 2011, 6 pp.
Ji et al., "Theory of Giant Saturation Magnetization in α"-Fe16N2: Role of Partial Localization in Ferromagnetism of 3d Transition Metals," New Journal of Physics, vol. 12, Jun. 17, 2010, 8 pp.
Cho, "The Best Refrigerator Magnet Ever?," Science/AAAD News, Science Now, Mar. 19, 2010, retrieved from the internet http://news.sciencemag.org/physics/2010/03/best-refrigerator-magnet-ever?sms_ss=email, 2 pp.
Ji et al., "Perpendicular Magnetic Anisotropy and High Spin-Polarization Ratio in Epitaxial Fe—N Thin Films," Physical Review B, vol. 84, Dec. 14, 2011, 8 pp.
Ziegler, "SRIM—The Stopping and Range of Ions in Matter," retrieved from http://srim.org/ on Oct. 13, 2016, 4 pp.
Jiang et al., "FeN Foils by Nitrogen Ion-Implantation," Journal of Applied Physics, vol. 115, Mar. 12, 2014, 3 pp.
Jiang et al., "9 T High Magnetic Field Annealing Effects on FeN Bulk Sample," Journal of Applied Physics, vol. 115, Mar. 13, 2014, 3 pp.
"International Energy Outlook 2013," U.S. Energy Information Administration, Jul. 2013, 312 pp.
Croat, "Current Status of Rapidly Solidified Nd—Fe—B Permanent Magnets," IEEE Transactions on Magnetics, vol. 25, No. 5, Sep. 1989, pp. 3550-3554.
Perdew et al., "Generalized Gradient Approximation Made Simple," Physical Review Letters, vol. 77, No. 18, Oct. 28, 1996, pp. 3865-3868.
Guo et al., "A Broadband and Scalable Model for On-Chip Inductors Incorporating Substrate and Conductor Loss Effects," IEEE Radio Frequency Integrated Circuits Symposium, Jun. 12-14, 2005, pp. 593-596.
Jack, "The Occurrence and the Crystal Structure of α"-Iron Nitride; A New Type of Interstitial Alloy Formed During the Tempering of Nitrogen-Martensite," Proceedings of the Royal Society of London, vol. 208, Sep. 24, 1951, pp. 216-224.
Jack, "The Iron-Nitrogen System: The Preparation and the Crystal Structures of Nitrogen-Austenite (γ) and Nitrogen-Martensite (α')," Proceedings of the Royal Society of London, Mar. 13, 1951, pp. 200-217.
Yamanaka et al., "Humidity Effects in Fe16N2 Fine Powder Preparation by Low-Temperature Nitridation," Journal of Solid State Chemistry, vol. 183, Aug. 4, 2010, pp. 2236-2241.
Frisk, "A New Assessment of the Fe—N Phase Diagram" Calphad, vol. 11, No. 2, 1987, pp. 127-134. (Applicant points out, in accordance with MPEP 609.04(a), that the year of publication, 1987, is sufficiently earlier than the effective U.S. filing date, Feb. 7, 2013, so that the particular month of publication is not in issue).
Nakajima et al., "Large Magnetization Induced in Single Crystalline Iron Films by High-Dose Nitrogen Implantation," Applied Physics Letters, vol. 56, No. 1, Jan. 1, 1990, pp. 92-94.
Nakajima et al., "Nitrogen-Implantation-Induced Transformation of Iron to Crystalline Fe16N2 in Epitaxial Iron Films," Applied Physics Letters, vol. 54, No. 25, Jun. 19, 1989, pp. 2536-2538.
Nakajima et al., "Formation of Ferromagnetic Iron Nitrides in Iron Thin Films by High-Dose Nitrogen Ion Implantation," Journal of Applied Physics, vol. 65, No. 11, Jun. 1, 1989, pp. 4357-4361.
Kaneko et al., "Fe—Cr—Co Ductile Magnet With (BH)max = 8 MGOe," AIP Conference Proceedings, 1976, 2 pp. (Applicant points out, in accordance with MPEP 609.04(a), that the year of publication, 1976, is sufficiently earlier than the effective U.S. filing date, Feb. 7, 2013, so that the particular month of publication is not in issue).
Strnat, "Modern Permanent Magnets for Applications in Electro-Technology," Proceedings of the IEEE, vol. 78, No. 6, Jun. 1990, pp. 923-946.
Strnat et al., "Bonded Rare Earth-Cobalt Permanent Magnets," Proceedings of the 12$^{th}$ Rare Earth Research Conference, vol. 1, Jul. 18-22, 1976, 11 pp.
Strnat et al., "Rare Earth-Cobalt Permanent Magnets," Journal of Magnetism and Magnetic Materials, vol. 100, Nos. 1-3, Nov. 1991, pp. 38-56.
Yang et al., "The Effect of Strain Induced by Ag Underlayer on Saturation Magnetization of Partially Ordered Fe16N2 Thin Films," Applied Physics Letters, vol. 103, Dec. 12, 2013, 4 pp.

(56) References Cited

OTHER PUBLICATIONS

Lewis et al., "Perspectives on Permanent Magnetic Materials for Energy Conversion and Power Generation," Metallurgical and Materials Transactions A, vol. 44A, Jan. 2013, 19 pp.

Pauling, "The Nature of the Interatomic Forces in Metals," Physical Review, vol. 54, Dec. 1, 1938, pp. 899-904.

Davison et al., "Shock Compression of Solids," Physics Reports, vol. 55, No. 4, Apr. 1979, pp. 255-379.

Liu et al., "Nanocomposite Exchange-Spring Magnet Synthesized by Gas Phase Method: From Isotropic to Anisotropic," Applied Physics Letters, vol. 98, Jun. 3, 2011, 3 pp.

Liu et al., "Discovery of localized states of Fe 3D electrons in Fe16N2 and Fe8N films: an evidence of the existence of giant saturation magnetization," arXiv: 0909.4478, Sep. 2009, 13 pp.

Amato et al., "Exchange-Spring Behavior of Hard/Soft Magnetic Multilayers: Optimization Study of the Nanostructure," Physica B: Condensed Matter, vol. 275, Nos. 1-3, Jan. 2000, pp. 120-123.

Tijssens et al., "Towards an Improved Continuum Theory for Phase Transformations," Materials Science and Engineering, vol. 378, Sep. 23, 2003, pp. 453-458.

Komuro et al., "Epitaxial Growth and Magnetic Properties of Fe16N2 Films with High Saturation Magnetic Flux Density (Invited)," Journal of Applied Physics, vol. 67, No. 9, May 1, 1990, pp. 5126-5130.

Brady et al., "Alloy Design of Intermetallics for Protective Scale Formation and for use as Precursors for Complex Ceramic Phase Surfaces," Intermetallics, vol. 12, Apr. 1, 2004, pp. 779-789.

Brady et al., "Pre-Oxidized and Nitrided Stainless Steel Alloy Foil for Proton Exchange Membrane Fuel Cell Bipolar Plates: Part 1. Corrosion, Interfacial Contact Resistance, and Surface Structure," Journal of Power Sources, vol. 195, Mar. 20, 2010, pp. 5610-5618.

"Annual Energy Outlook 2015, with projects to 2040," U.S. Energy Information Administration, Apr. 2015, 154 pp.

Kim et al., "New Magnetic Material Having Ultrahigh Magnetic Moment," Applied Physics Letters, vol. 20, No. 12, Jun. 15, 1972, pp. 492-494.

Zhuge et al., "Preparation and Property of Iron Nitrides by Ball Mill Method," Journal of Functional Materials, vol. 31, No. 5, 2000, pp. 471-472 (Abstract Only (on last page)) (Applicant points out, in accordance with MPEP 609.04(a), that the year of publication, 2000, is sufficiently earlier than the effective U.S. filing date, Feb. 7, 2013, so that the particular month of publication is not in issue).

Takahashi et al., "Magnetic Moment of α"-Fe16N2 Films (Invited)," Journal of Applied Physics, vol. 76, No. 10, Nov. 15, 1994, pp. 6642-6647.

Takahashi et al., "Structure and Magnetic Moment of Fe16N2 Sputtered Film," Journal of Magnetism and Magnetic Materials, vol. 174, Nos. 1-2, Oct. 1, 1997, pp. 57-69.

Takahashi et al., "Magnetocrystalline Anisotropy for α'—Fe—C and α'—Fe—N Films," IEEE Transactions on Magnetics, vol. 37, No. 4, Jul. 2001, pp. 2179-2181.

Mühlethaler et al., "Improved Core-Loss Calculation for Magnetic Components Employed in Power Electronic Systems," IEEE Transactions on Power Electronics, vol. 27, No. 2, Feb. 2012, pp. 964-973.

Watanabe et al., "Perpendicular Magnetization of Epitaxial FePt(001) Thin Films with High Squareness and High Coercive Force," Japanese Journal of Applied Physics, vol. 35, No. 10A, Oct. 1, 1996, pp. 1264-1267.

Zhang et al., "Thermal Stability of Partially Ordered Fe16N2 Film on Non-Magnetic Ag Under Layer," Journal of Applied Physics, vol. 115, No. 17A, Mar. 20, 2014, 3 pp.

Uijttewaal et al., "Understanding the Phase Transitions of the Ni2MnGa Magnetic Shape Memory System from First Principles," Physical Review Letters, vol. 102, Jan. 23, 2009, 4 pp.

Pugaczowa-Michalska et al., "Electronic Structure and Magnetic Properties of Ni2MnGa1-xGex and Disordered Ni2MnSn Heusler Alloys," Acta Physica Polonica A, vol. 115, No. 1, Jan. 2009, pp. 241-243.

Brewer et al., "Magnetic and Physical Microstructure of Fe16N2 Films Grown Epitaxially on Si(001)," Journal of Applied Physics, vol. 81, No. 8, Apr. 15, 1997, pp. 4128-4130.

Abdellateef et al., "Magnetic Properties and Structure of the α"-Fe16N2 Films," Journal of Magnetism and Magnetic Materials, vol. 256, Nos. 1-3, Jan. 11, 2003, pp. 214-220.

Brewer et al., "Epitaxial Fe16N2 Films Grown on Si(001) by Reactive Sputtering," Journal of Applied Physics, vol. 79, No. 8, Apr. 15, 1996, pp. 5321-5323.

Van Genderen et al., "Atom Probe Analysis of the First Stage of Tempering of Iron-Carbon-Nitrogen Martensite," Zeitschrift Für Metallkunde, vol. 88, No. 5, May 1997, pp. 401-409.

Takahashi et al., "Impurity effect of carbon on structure and saturation magnetization of Fe—N films," Journal of Magnetism and Magnetic Materials, vol. 210, Sep. 1, 1999, pp. 333-340.

Huang et al., "Magnetism of α'—FeN Alloys and α"-(Fe16N2) Fe Nitrides," Journal of Magnetism and Magnetic Materials, vol. 135, Nov. 30, 1993, pp. 226-230.

Huang et al., "Spin-Density Distribution in Ferromagnetic α"-Fe16N2," Physical Review B: Condensed Matter, vol. 51, No. 5, Feb. 1, 1995, pp. 3222-3225.

Cococcioni et al., "Linear Response Approach to the Calculation of the Effective Interaction Parameters in the LDA+U Method," Physical Review B, vol. 71, Jan. 18, 2005, 16 pp.

Takahashi, "Discovery of Fe16N2 with Giant Magnetic Moment and Its Future View," IEEE Translation Journal on Magnetics in Japan, vol. 6, No. 12, Dec. 1991, pp. 1024-1038.

Zhang et al., "Strain Effect of Multilayer FeN Structure on GaAs Substrate," Journal of Applied Physics, vol. 113, No. 17, Apr. 10, 2013, 3 pp.

"New Compound Opens Way to EV Magnet without Rare Earths," Nikkei.com Morning Edition, Mar. 4, 2011, 1 pp.

Coey et al., "Magnetic nitrides," Journal of Magnetism and Magnetic Materials, vol. 200, Mar. 10, 1999, pp. 405-420.

Tomioka et al., "Iron Nitride Powder Produced as Substitute for Rare Metal," Nikkei Technology, Mar. 7, 2011, 2 pp.

Ji et al., "Direct Observation of Giant Saturation Magnetization in Fe16N2," arXiv: 1211.0553, Nov. 2012, 27 pp.

Zheng et al., "Iron Nitride Thin Films Deposited by Chloride Assisted Plasma Enhanced Chemical Vapour Deposition: Facile Stoichiometry Control and Mechanism Study," Journal of Applied Physics D: Applied Physics, vol. 42, No. 18, Sep. 21, 2009, 9 pp.

Ji et al., "Strain Induced Giant Magnetism in Epitaxial Fe16N2 Thin Film," Applied Physics Letters, vol. 102, Feb. 21, 2013, 4 pp.

Lanska et al., "Composition and Temperature Dependence of the Crystal Structure of Ni—Mn—Ga Alloys," Journal of Applied Physics, vol. 95, No. 12, Jun. 15, 2004, pp. 8074-8078.

Takahashi et al., "Growth Mechanism of FeN Films by Means of an Atmospheric Pressure Halide Chemical Vapor Deposition," Materials Chemistry and Physics, vol. 65, Jan. 18, 2000. pp. 113-116.

Ji et al., "Growth and Depth-Dependence of Saturation Magnetization of Iron Nitride Thin Films on MgO Substrate," Spin, vol. 2, No. 1, Mar. 2012, 4 pp.

"Nanocrystalline soft magnetic material, FINEMET," Materials Magic, Hiatchi Metals, Apr. 2005, 12 pp.

Gutfleisch et al., "Magnetic Materials and Devices for the 21st Century: Stronger, Lighter, and More Energy Efficient," Advanced Materials, vol. 23, 2011, Dec. 15, 2010, pp. 821-842.

Ferguson et al., "The Tempering of Fe—C—N Martensite" Scripta Metallurgica, vol. 18, No. 11, Nov. 1984, pp. 1189-1194.

Brown et al., "The Crystal Structure and Phase Transitions of the Magnetic Shape Memory Compound Ni2MnGa," Journal of Physics: Condensed Matter, vol. 14, No. 43, Oct. 18, 2002, pp. 10159-10171.

Bruno, "Tight-Binding Approach to the Orbital Magnetic Moment and Magnetocrystalline Anisotropy of Transition-Metal Monolayers," Physical Review B, vol. 39, No. 1, Jan. 1, 1989, pp. 865-868.

Blöchl, "Projector Augmented-Wave Method," Physical Review B, vol. 50, No. 24, Dec. 15, 1994, pp. 17953-17979.

Entel et al., "Ab Initio Modeling of Martensitic Transformation (MT) in Magnetic Shape Memory Alloys," Journal of Magnetism and Magnetic Materials, vol. 310, Nov. 27, 2006, pp. 2761-2763.

(56) References Cited

OTHER PUBLICATIONS

Hohenberg et al., "Inhomogeneous Electron Gas," Physical Review, vol. 136, No. 3B, Nov. 9, 1964, pp. 864-871.
Sit et al., "Realistic Quantitative Descriptions of Electron Transfer Reactions: Diabatic Free-Energy Surfaces from First-Principles Molecular Dynamics," Physical Review Letters, vol. 97, Jul. 11, 2006, 4 pp.
Paseka et al., "Structure and Magnetic Properties of Ball-Milled Iron Nitride Powders," Journal of Alloys and Compounds, vol. 274, Mar. 10, 1998, pp. 248-253.
Giannozzi et al., "Quantum ESPRESSO: A Modular and Open-Source Software Project for Quantum Simulations of Materials," Journal of Physics: Condensed Matter, vol. 21, Sep. 1, 2009, pp. 1-19.
Tong et al., "Low Temperature Wafer Direct Bonding," Journal of Microelectromechanical Systems, vol. 3, No. 1, Mar. 1994, pp. 29-35.
Fan et al., "Ferromagnetism at the Interfaces of Antiferromagnetic FeRh Epilayers," Physical Review B, vol. 82, Nov. 12, 2010, 5 pp.
Yao et al., "Formation and Magnetic Properties of Fe16N2 Films Prepared by Ion-Beam-Assisted Deposition," Journal of Magnetism and Magnetic Materials, vol. 177-181, Jan. 1998, pp. 1291-1292.
Skomski et al., "Giant Energy Product in Nanostructured Two-Phase Magnets," Physical Review B, vol. 48, No. 21, Dec. 1, 1993, pp. 15812-15816.
Tickle et al., "Magnetic and Magnetomechanical Properties of Ni2MnGa," Journal of Magnetism and Magnetic Materials, vol. 195, No. 3, Jun. 11, 1999, pp. 627-638.
Sabiryanov et al., "Electronic Structure and Magnetic Properties of Hard/Soft Multilayers," Journal of Magnetism and Magnetic Materials, vol. 177-181, Pt. 2, Jan. 1998, pp. 989-990.
Metzger et al., "Magnetism of $\alpha''$-Fe16N2 (Invited)," Journal of Applied Physics, vol. 76, No. 10, Nov. 15, 1994, pp. 6626-6631.
Kardonina et al., "Transformations in the Fe—N System," Metal Science and Heat Treatment, vol. 52, Nos. 9-10, Oct. 2010, pp. 5-15.
Chu et al., "Opportunities and Challenges for a Sustainable Energy Future," Nature, vol. 488, No. 7411, Aug. 16, 2012, pp. 294-303.
Blundell et al., "Polarized Neutron Reflection as a Probe of Magnetic Films and Multilayers," Physical Review B, vol. 46, No. 6, Aug. 1, 1992, pp. 3391-3400.
Zhang et al., "Energy Barriers and Hysteresis in Martensitic Phase Transformations," Acta Materialia, vol. 57, Jul. 17, 2009, pp. 4332-4352.
Kikkawa et al., "Particle Size Dependence in Low Temperature Nitridation Reaction for Fe16N2," Journal of Alloys and Compounds, vol. 449, Dec. 21, 2006 (online), pp. 7-10.
Okamoto et al., "Crystal Distortion and the Magnetic Moment of Epitaxially Grown $\alpha''$-Fe16N2," Journal of Magnetism and Magnetic Materials, vol. 208, Jul. 12, 1999, pp. 102-114.
Roy et al., "Depth Profile of Uncompensated Spins in an Exchange Bias System," Physical Review Letters, vol. 95, Jul. 21, 2005, 4 pp.
Uchida et al., "Magnetocrystalline Anisotropy Energies of Fe16N2 and Fe16C2," Journal of Magnetism and Magnetic Materials, vol. 310, Nov. 15, 2006, pp. 1796-1798.
Wang et al., "Properties of a New Soft Magnetic Material," Nature, vol. 407, Sep. 14, 2000, pp. 150-151.
Dudarev et al., "Electron-Energy-Loss Spectra and the Structural Stability of Nickel Oxide: An LSDA+U Study," Physical Review B, vol. 57, No. 3, Jan. 15, 1998, pp. 1505-1509.
Kart et al., "DFT Studies on Structure, Mechanics and Phase Behavior of Magnetic Shape Memory Alloys: Ni2MnGa," Physica Status Solidi, vol. 205, No. 5, Mar. 20, 1998, pp. 1026-1035.
Barman et al., "Structural and Electronic Properties of Ni2MnGa," Physical Review B, vol. 72, Nov. 8, 2005, 7 pp.
Atiq et al., "Preparation and the Influence of Co, Pt and Cr Additions on the Saturation Magnetization of $\alpha''$-Fe16N2 Thin Films," Journal of Alloys and Compounds, vol. 479, Feb. 23, 2009, pp. 755-758.
Okamoto et al., "Characterization of Epitaxially Grown Fe—N Films by Sputter Beam Method," Journal of Applied Physics, vol. 79, No. 3, Feb. 1, 1996, pp. 1678-1683.

Sugita et al., "Magnetic and Mössbauer Studies of Single-Crystal Fe16N2 and Fe—N Martensite Films Epitaxially Grown by Molecular Beam Epitaxy (Invited)," Journal of Applied Physics, vol. 76, No. 10, Nov. 15, 1994, pp. 6637-6641.
Sugita et al., "Giant Magnetic Moment and Other Magnetic Properties of Epitaxially Grown Fe16N2 Single-Crystal Films (Invited)," Journal of Applied Physics, vol. 70, No. 10, Nov. 15, 1991, pp. 5977-5982.
Toops et al., "Pre-Oxidized and Nitrided Stainless Steel Alloy Foil for Proton Exchange Membrane Fuel Cell Bipolar Plates. Part 2: Single-Cell Fuel Evaluation of Stamped Plates," Journal of Power Sources, vol. 195, Mar. 19, 2010, pp. 5619-5627.
Klemmer et al., "Magnetic Hardening and Coercivity Mechanisms in L1 Ordered FePd Ferromagnets," Scripta Metallurgica et Materialia, vol. 33, Nos. 10-11, Dec. 1, 1995, pp. 1793-1805.
Ohtani et al., "Magnetic Properties of Mn—Al—C Permanent Magnet Alloys," IEEE Transactions on Magnetics, vol. MAG-13, No. 5, Sep. 1977, pp. 1328-1330.
Osaka et al., "A Soft Magnetic CoNiFe Film With High Saturation Magnetic Flux Density and Low Coercivity," Nature, vol. 392, Apr. 23, 1998, pp. 796-798.
Schrefl et al., "Exchange Hardening in Nano-Structured Two-Phase Permanent Magnets," Journal of Magnetism and Magnetic Materials, vol. 127, Jul. 12, 1993, pp. 273-277.
Kakeshita et al., "Effect of Magnetic Fields on Athermal and Isothermal Martensitic Transformations in Fe—Ni—Mn Alloys," Materials Transactions, vol. 34, No. 5, Dec. 9, 1992, pp. 415-422.
Koyano et al., "Magnetization of $\alpha'$ Iron Nitride Produced Through the fcc→bct Martensitic Transformation in High Magnetic Field," Journal of Applied Physics, vol. 100, No. 3, Aug. 1, 2006, 5 pp.
Oku et al., "Small-Angle Polarized Neutron Scattering Study of Spherical Fe16N2 Nano-Particles for Magnetic Recording Tape," Physica B, vol. 404, Sep. 1, 2009, pp. 2575-2577.
Shimoda et al., "High-Energy Cast Pr—Fe—B Magnets," Journal of Applied Physics, vol. 64, No. 10, Nov. 15, 1988, pp. 5290-5292.
Weber et al., "Search for Giant Magnetic Moments in Ion-Beam-Synthesized $\alpha''$-Fe16N2," Thin Solid Films, vol. 279, Nos. 1-2, Jun. 1996, pp. 216-220.
Watanabe et al., "A New Challenge: Grain Boundary Engineering for Advanced Materials by Magnetic Field Application," Journal of Materials Science, vol. 41, No. 23, Oct. 24, 2006 (online), pp. 7747-7759.
Takahashi et al., "Preparation of FeN Thin Films by Chemical Vapor Deposition Using a Chloride Source," Materials Letters, vol. 42, No. 6, Mar. 2000, pp. 380-382.
Stern et al., "Electronic and Structural Properties of Fe3Pd—Pt Ferromagnetic Shape Memory Alloys," Journal of Applied Physics, vol. 91, No. 10, May 15, 2002, pp. 7818-7820.
Qian et al., "NiZn Ferrite Thin Films Prepared by Facing Target Sputtering," IEEE Transactions Magnetics, vol. 33, No. 5, Sep. 1997, pp. 3748-3750.
Takahashi et al., "New Soft Magnetic Material of a'-Fe—C With High Bs," Journal of Magnetism and Magnetic Materials, vol. 239, Nos. 1-3, Feb. 1, 2002, pp. 479-483.
Inoue et al., "Enhancement of the Formation of Fe16N2 on Fe Films by Co Additions (Invited)," Journal of Applied Physics, vol. 76, No. 10, Nov. 15, 1994, pp. 6653-6655.
Tsuchiya et al., "Spin Transition in Magnesiowüstite in Earth's Lower Mantle," Physical Review Letters, vol. 94, May 18, 2006, 4 pp.
Liu et al., "Nucleation Behavior of Bulk Ni—Cu Alloy and Pure Sb in High Magnetic Fields," Journal of Crystal Growth, vol. 321, Mar. 2, 2011, pp. 167-170.
Liu et al., "Effects of High Magnetic Fields on Solidification Microstructure of Al—Si Alloys," Journal of Material Science, vol. 46, Oct. 22, 2010, pp. 1628-1634.
Okunev et al., "The Low-Temperature Electric Conductivity of YBaCuO and LaSrMnO Dielectric Films Obtained by a Pulsed Laser Sputter Deposition Technique," Technical Physics Letters, vol. 26, No. 10, May 6, 2000, pp. 903-906.
Anisimov et al., "Density-Functional Calculation of Effective Coulomb Interactions in Metals," Physical Review B, vol. 43, No. 10, Apr. 1, 1991, pp. 7570-7574.

(56) References Cited

OTHER PUBLICATIONS

Anisimov et al., "Band-Structure Description of Mott Insulators (NiO, MnO, FeO, CoO)," Journal of Physics: Condensed Matter, vol. 2, No. 17, Apr. 30, 1990, pp. 3973-3987.
Anisimov et al., "First-Principles Calculations of the Electronic Structure and Spectra of Strongly Correlated Systems: the LDA+U Method," Journal of Physics: Condensed Matter, vol. 9, No. 4, Jan. 27, 1997, pp. 767-808.
Anisimov et al., "Band Theory and Mott Insulators: Hubbard U Instead of Stoner I," Physical Review B, vol. 44, No. 3, Jul. 15, 1991, pp. 943-954.
Campo et al., "Extended DFT + U + V Method With On-Site and Inter-Site Electronic Interactions," Journal of Physics: Condensed Matter, vol. 22, Jan. 19, 2010 (online), 12 pp.
Nimura et al., "Facing Targets Sputtering System for Depositing Co-Cr Perpendicular Magnetic Recording Media," Journal of Vacuum Science Technology, vol. 5, No. 1, Jan. 1987, pp. 109-110.
Lauter et al., "Highlights from the Magnetism Reflectometer at the SNS," Physica B, vol. 404, Sep. 1, 2009, pp. 2543-2546.
Godlevsky et al., "Soft Tetragonal Distortions in Ferromagnetic Ni2MnGa and Related Materials from First Principles," Physical Review B, vol. 63, Mar. 2, 2001, 5 pp.
Hou et al., "SmCo5/Fe Nanocomposites Synthesized from Reductive Annealing of Oxide Nanoparticles," Applied Physics Letters, vol. 91, Oct. 12, 2007, 3 pp.
Zhang et al., "Shift of the Eutectoid Point in the Fe-C Binary System by a High Magnetic Field," Journal of Physics D: Applied Physics, vol. 40, Oct. 19, 2007, pp. 6501-6506.
Pickett et al., "Reformulation of the LDA + U Method for a Local-Orbital Basis," Physical Review B, vol. 58, No. 3, Jul. 15, 1998, pp. 1201-1209.
Kohn et al., "Self-Consistent Equations Including Exchange and Correlation Effects," Physical Review, vol. 140, No. 4A, Nov. 15, 1965, pp. 1133-1138.
Gong et al., "Mechanically Alloyed Nanocomposite Magnets," Journal of Applied Physics, vol. 75, No. 10, May 15, 1994, pp. 6649-6651.
Li et al., "Effect of Assistant rf Field on Phase Composition of Iron Nitride Film Prepared by Magnetron Sputtering Process," Journal of Vacuum Science & Technology A, vol. 24, No. 1, Dec. 23, 2005 (online), pp. 170-173.
Liu et al., "Nanocrystalline Soft Magnetic Ribbon with $\alpha''$-Fe16N2 Nanocrystallites Embedded in Amorphous Matrix," Journal of Magnetism and Magnetic Materials, vol. 320, Jun. 10, 2008, pp. 2752-2754.
Wallace et al., "Enhanced Fe Moment in Nitrogen Martensite and Fe16N2 (Invited)," Journal of Applied Physics, vol. 76, No. 10, Nov. 15, 1994, pp. 6648-6652.
Wang et al., "Searching, Fabricating and Characterizing Magnetic Materials With Giant Saturation Magnetization," TMRC 2014, Aug. 11, 2014, 2 pp.
Wang et al., "Growth, Structural, and Magnetic Properties of Iron Nitride Thin Films Deposited by dc Magnetron Sputtering," Applied Surface Science, vol. 220, May 20, 2003, pp. 30-39.
Yamamoto et al., "Formation of Fe16N2 in Deformed Iron by Ion Implantation Method," Proceedings of 1998 International Conference on Ion Implantation Technology, Jun. 22-26, 1998, 4 pp.
Rui et al., "In-Cluster-Structured Exchange-Coupled Magnets with High Energy Densities," Applied Physics Letters, vol. 89, Sep. 19, 2006, 3 pp.
Bao et al., "Synthesis and Properties of $\alpha''$-Fe16N2 in Magnetic Particles," Journal of Applied Physics, vol. 75, No. 10, May 15, 1994, pp. 5870-5872.

Office Action from counterpart Canadian Application No. 2,899,827, dated Aug. 24, 2015, 5 pp.
Communication pursuant to Rules 161(2) and 162 EPC from counterpart European Application No. 14749390.2, dated Oct. 21, 2015, 2 pp.
Notice of Reasons for Rejection, and translation thereof, from counterpart Japanese Application No. 2015-557069, dated Jan. 19, 2016, 7 pp.
Allowance of Patent, and translation thereof, from counterpart Korean Application No. 10-2015-7023844, dated Feb. 2, 2016, 3 pp.
Office Action, and translation thereof, from counterpart Korean Application No. 10-2015-7023844, dated Oct. 26, 2015, 7 pp.
Office Action, and translation thereof, from counterpart Taiwan Application No. 103104150, dated Mar. 10, 2016, 4 pp.
Search Report, and translation thereof, from counterpart Taiwan Application No. 103104150, dated Jan. 19, 2016, 2 pp.
International Preliminary Report on Patentability from International Application No. PCT/US2014/015104, mailed Aug. 20, 2015, 8 pp.
Stäblein, "Chapter 7: Hard Ferrites and Plastoferrites," Handbook of Ferromagnetic Materials, vol. 3, 1982, 162 pp. (Applicant points out, in accordance with MPEP 609.04(a), that the year of publication, 1982, is sufficiently earlier than the effective U.S. filing date, Feb. 7, 2013, so that the particular month of publication is not in issue).
Response to Office Action dated Aug. 24, 2015, from counterpart Canadian Application No. 2899827, filed Feb. 18, 2016, 19 pp.
Response to the Communication pursuant to Rules 161 and 162(2) EPC dated Oct. 21, 2015, from counterpart European Application No. 14749390.2, filed Apr. 19, 2016, 13 pp.
Coey et al., "The Magnetization of a$\Delta$-Fe16N2," Journal of Physics: Condensed Matter, vol. 6, 2004, pp. 23-28. Per MPEP 609.09(a), Applicant points out that the year of publication is sufficiently earlier than the effective U.S. filing date and any foreign priority date so that the particular month of publication is not in issue.
The Notice of Reasons for Rejection, and translation thereof, from counterpart Japanese Application No. 2015-557069, drafted Aug. 10, 2016 and mailed Aug. 16, 2016, 7 pp.
Partial Supplementary Search Report from counterpart European Application No. 14749390.2-1556, dated Jan. 13, 2017, 9 pp.
Gao et al., "Exchange-coupling interaction and effective anisotropy in nanocomposite permanent materials," Chinese Science Bulletin, vol. 47, No. 14, Jul. 2002, 4 pp.
Huang et al., "Synthesis and characterization of Fe16N2 in bulk form," Journal of Applied Physics, vol. 75, No. 10, May 15, 1994, 4 pp.
Tsubakino et al., "High resolution transmission electron microscopic study of the formation of Fe16N2 in bulk iron by on implantation," Material Letters 26, Elsevier, Feb. 1996, pp. 155-159.
Tsubakino et al., "Formation of Fe16N2 in iron sheet by an ion implantation method," Materials Chemistry and Physics 54, Elsevier, Jul. 1998, pp. 301-304.
Notification of the First Office Action from counterpart Chinese Application No. 201480019465, dated Jan. 17, 2017, 16 pp.
Tsubakino, "High Resolution Transmission Electron Microscopic Study of the Formation of Fe16N2 in Bulk Iron by Ion Implantation", Materials Letters, 1996, 26, pp. 155-199.
Tsubakino, "Formulation of Fe16N2 in Iron Sheet by an Ion Implantation Method" Materials Chemistry and Physics, 1998- 54, pp. 301-304.
Jack, "The Synthesis, Structure, and Characterization of a"-Fe16N2 (invited)", Journal of Applied Physics, 1994, 76, pp. 6620-6625.
Piekoszewski, "Interaction of Nitrogen Atoms in Expanded Austenite Formed in Pure Iron by Intense Nitrogen Plasma Pulses", Nukleonika, 2004, 49, pp. 57-60.

\* cited by examiner

IRON NITRIDE PERMANENT MAGNET AND TECHNIQUE FOR FORMING IRON NITRIDE PERMANENT MAGNET This application is a national stage entry under 35 U.S.C. §371 of International Application No. PCT/US2014/015104, filed Feb. 6, 2014, which claims the benefit of U.S. Provisional Application Ser. No. 61/762,147, filed Feb. 7, 2013, the entire contents of each of which are incorporated by reference herein.

GOVERNMENT INTEREST

This invention was made with Government support under contract number DE-AR0000199 awarded by DOE, Office of ARPA-E. The government has certain rights in the invention.

TECHNICAL FIELD

Background

Permanent magnets play a role in many electro-mechanical systems, including, for example, alternative energy systems. For example, permanent magnets are used in electric motors or generators, which may be used in vehicles, wind turbines, and other alternative energy mechanisms. Many permanent magnets in current use include rare earth elements, such as neodymium, which result in high energy product. These rare earth elements are in relatively short supply, and may face increased prices and/or supply shortages in the future. Additionally, some permanent magnets that include rare earth elements are expensive to produce. For example, fabrication of NdFeB magnets generally includes crushing material, compressing the material, and sintering at temperatures over 1000° C., all of which contribute to high manufacturing costs of the magnets.

SUMMARY

The disclosure describes bulk permanent magnets that include $Fe_{16}N_2$ and techniques for forming bulk permanent magnets that include $Fe_{16}N_2$. Bulk $Fe_{16}N_2$ permanent magnets may provide an alternative to permanent magnets that include a rare earth element because $Fe_{16}N_2$ has high saturation magnetization and magnetic anisotropy constant. The high saturation magnetization and magnetic anisotropy constants result in a magnetic energy product that may be higher than rare earth magnets. For example, experimental evidence gathered from thin film $Fe_{16}N_2$ permanent magnets suggests that bulk $Fe_{16}N_2$ permanent magnets may have desirable magnetic properties, including an energy product of as high as about 134 MegaGauss*Oerstads (MGOe), which is about two times the energy product of NdFeB (which has an energy product of about 60 MGOe). Additionally, iron and nitrogen are abundant elements, and thus are relatively inexpensive and easy to procure. The high energy product of $Fe_{16}N_2$ magnets may provide high efficiency for applications in electric motors, electric generators, and magnetic resonance imaging (MRI) magnets, among other applications.

As used herein, a bulk material may include a smallest dimension (e.g., height, width, or length) that is greater than about 100 nanometers (nm). In some examples, a bulk material may include a smallest dimension that is greater than about 1 micrometer (μm), or greater than about 100 μm.

In one aspect, the disclosure describes a bulk permanent magnetic material comprising between about 5 volume percent and about 40 volume percent $Fe_{16}N_2$ phase domains; a plurality of nonmagnetic atoms or molecules forming domain wall pinning sites; and a balance soft magnetic material, wherein at least some of the soft magnetic material is magnetically coupled to the $Fe_{16}N_2$ phase domains via exchange spring coupling.

In another aspect, the disclosure describes a method that includes implanting N+ ions in an iron workpiece using ion implantation to form an iron nitride workpiece; pre-annealing the iron nitride workpiece to attach the iron nitride to a substrate; and post-annealing the iron nitride workpiece to form $Fe_{16}N_2$ phase domains within the iron nitride workpiece.

In an additional aspect, the disclosure describes a method that includes forming a plurality of workpiece including iron nitride material, each of the plurality of workpieces including between about 5 volume percent and about 40 volume percent of $Fe_{16}N_2$ phase domains, introducing additional iron or nonmagnetic material between the plurality of workpieces or within at least one of the plurality of workpieces of iron nitride material, and sintering together the plurality of workpieces of iron nitride to form a bulk magnet including iron nitride with between about 5 volume percent and about 40 volume percent of $Fe_{16}N_2$ phase domains.

In a further aspect, the disclosure describes a method that includes forming a plurality of textured iron nitride workpieces by implanting N+ ions in a textured iron workpiece using ion implantation to form a textured iron nitride workpiece comprising between about 8 atomic percent and about 15 atomic percent N+ ions, and post-annealing the textured iron nitride workpiece to form a volume fraction of between about 5 volume percent and about 40 volume percent of $Fe_{16}N_2$ phase domains within the textured iron nitride workpiece, with a balance soft magnetic material including $Fe_8N$, wherein at least some of the $Fe_{16}N_2$ phase domains are magnetically coupled to at least one of the $Fe_8N$ domains by exchange spring coupling. In accordance with this aspect of the disclosure, the method also includes introducing nonmagnetic material between a first workpiece of the plurality of workpieces and a second workpiece of the plurality of workpieces or within at least one of the plurality of workpieces of iron nitride, and sintering together the plurality of workpieces of iron nitride to form a bulk magnet including iron nitride with between about 5 volume percent and about 40 volume percent of $Fe_{16}N_2$ phase domains, wherein the nonmagnetic material forms domain wall pinning sites within the bulk magnet.

In another aspect, the disclosure describes a method that includes forming a plurality of textured iron nitride workpieces by mixing nitrogen in molten iron to result in a concentration of nitrogen atoms in the molten iron between about 8 atomic percent and about 15 atomic percent, fast belt casting the molten iron to form a textured iron nitride workpiece, and post-annealing the textured iron nitride workpiece to form a volume fraction of between about 5 volume percent and about 40 volume percent of $Fe_{16}N_2$ phase domains within the textured iron nitride workpiece, with a balance soft magnetic material including $Fe_8N$, wherein at least some of the $Fe_{16}N_2$ phase domains are magnetically coupled to at least one of the $Fe_8N$ domains by exchange spring coupling. In accordance with this aspect of the disclosure, the method also includes introducing nonmagnetic material between a first workpiece of the plurality of workpieces and a second workpiece of the plurality of workpieces or within at least one of the plurality of workpieces of iron nitride and sintering together the plurality of workpieces of iron nitride to form a bulk magnet including iron nitride with between about 5 volume percent and about 40 volume percent of $Fe_{16}N_2$ phase domains, wherein the nonmagnetic material forms domain wall pinning sites within the bulk magnet.

In a further aspect, the disclosure describes a method including forming a plurality of workpieces of iron nitride material, each of the plurality of workpieces including between about 5 volume percent and about 40 volume percent of $Fe_{16}N_2$ phase domains; introducing a plurality of nonmagnetic atoms or molecules between the plurality of workpieces or within at least one of the plurality of workpieces of iron nitride material; and sintering together the plurality of workpieces of iron nitride to form a bulk permanent magnetic material including iron nitride with between about 5 volume percent and about 40 volume percent of $Fe_{16}N_2$ phase domains, the plurality of nonmagnetic atoms or molecules forming domain wall pinning sites, and a balance soft magnetic material, wherein at least some of the soft magnetic material is magnetically coupled to the $Fe_{16}N_2$ phase domains via exchange spring coupling.

The details of one or more examples are set forth in the accompanying drawings and the description below. Other features, objects, and advantages of the disclosure will be apparent from the description and drawings, and from the claims.

DETAILED DESCRIPTION

Figure 1:
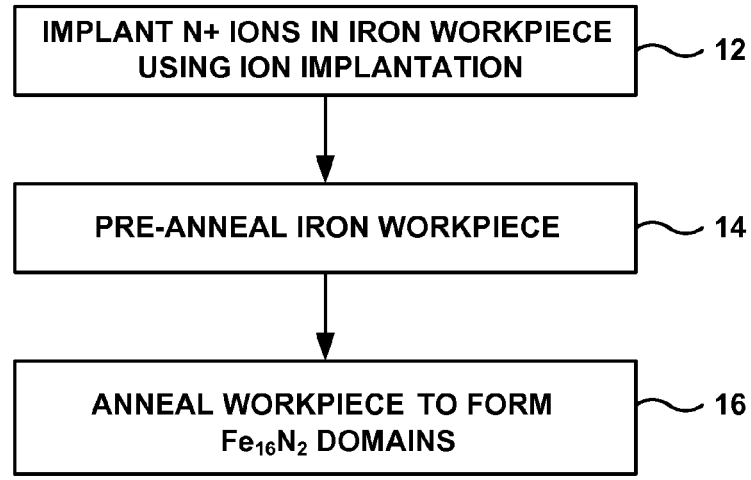
FIG. 1 is a flow diagram illustrating an example technique for forming a permanent magnetic including $Fe_{16}N_2$ magnetically hard domains and $Fe_8N$ magnetically soft domains using ion implantation.

The disclosure describes permanent magnets that include $Fe_{16}N_2$ phase domains and techniques for forming permanent magnets that include $Fe_{16}N_2$ phase domains. In particular, the techniques described herein are used to form bulk permanent magnets that include $Fe_{16}N_2$ phase domains. In some examples, the $Fe_{16}N_2$ phase domains may present in combination with other phases, such as phases of magnetically soft material. The $Fe_{16}N_2$ phase may be magnetically coupled to the magnetically soft material by exchange spring coupling, which may effectively harden the magnetically soft material and provide magnetic properties for the bulk material similar to those of a bulk material formed of $Fe_{16}N_2$. The disclosure also describes techniques for producing bulk magnets including $Fe_{16}N_2$ phase, alone or in combination with other material phases.

Magnets that include a $Fe_{16}N_2$ phase may provide a relatively high energy product, for example, as high as about 134 MGOe when the $Fe_{16}N_2$ permanent magnet is anisotropic. In examples in which the $Fe_{16}N_2$ magnet is isotropic, the energy product may be as high as about 33.5 MGOe. The energy product of a permanent magnetic is proportional to the product of remanent coercivity and remanent magnetization. For comparison, the energy product of $Nd_2Fe_{14}B$ permanent magnet may be as high as about 60 MGOe. A higher energy product can lead to increased efficiency of the permanent magnet when used in motors, generators, or the like.

Additionally, permanent magnets that include a $Fe_{16}N_2$ phase may not include rare earth elements, which may reduce a materials cost of the magnet and may reduce an environmental impact of producing the magnet. In some examples, using the techniques described herein may also reduce an environmental impact of the producing permanent magnets compared to processes used to make rare earth magnets, as the current techniques may not include use or a powder phase or high temperature sintering steps.

However, $Fe_{16}N_2$ is a metastable phase, which competes with other stable phases of Fe—N. Hence, forming a bulk material including a high volume fraction of $Fe_{16}N_2$ may be difficult. The magnetic material including $Fe_{16}N_2$ phase domains described in this disclosure overcomes this difficulty by forming a magnetic material including $Fe_{16}N_2$ domains and domains of other, magnetically soft materials. The magnetically hard $Fe_{16}N_2$ domains magnetically couple to the magnetically soft materials by exchange spring coupling and effectively harden the magnetically soft materials. To achieve exchange spring coupling throughout the volume of the magnetic material, the $Fe_{16}N_2$ domains may be distributed throughout the magnetic material, e.g., at a nanometer or micrometer scale.

As described herein, magnetic materials including $Fe_{16}N_2$ domains and domains of other, magnetically soft materials may include a volume fraction of $Fe_{16}N_2$ domains of less than about 40 volume percent (vol. %). For example, the magnetically hard $Fe_{16}N_2$ phase may constitute between about 5 vol. % and about 40 vol. % of the total volume of the magnetic material, or between about 5 vol. % and about 20 vol. % of the total volume of the magnetic material, or between about 10 vol. % and about 20 vol. % of the total volume of the magnetic material, or between about 10 vol. % and about 15 vol. % of the total volume of the magnetic material, or about 10 vol. % of the total volume of the magnetic material, with the remainder of the volume being magnetically soft materials. The magnetically soft materials may include, for example, Fe, FeCo, $Fe_8N$, or combinations thereof.

In some examples, such as when the magnetically soft material includes Fe or $Fe_8N$, the crystallographic texture of the $Fe_{16}N_2$ and the Fe or $Fe_8N$ domains may be coherent. In other words, there may be a lattice match between the domains, including an aligned magnetic easy axis. This may facilitate efficient exchange-spring coupling between the magnetically hard $Fe_{16}N_2$ domains and the magnetically soft Fe or $Fe_8N$ domains, particularly across phase boundaries.

In some examples, the magnetic material may be a bulk magnetic material. As used herein, the phrases "bulk magnetic material" and "bulk permanent magnetic material" refer to magnetic materials and permanent magnetic materials whose smallest dimension (e.g., length, height, or width) is greater than about 100 nm. In other examples, a "bulk magnetic material" and "bulk permanent magnetic material" may have a smallest dimension (e.g., length, height, or width) that is greater than about 1 μm, or greater than about 100 μm.

The magnetic material described herein may possess a relatively large energy product, such as greater than about 10 MGOe. In some examples, the magnetic material described herein may possess an energy product greater than about 30 MGOe, greater than about 60 MGOe, between about 60 MGOe and about 135 MGOe, greater than about 65 MGOe, or greater than about 100 MGOe. This may be achieved by include $Fe_{16}N_2$ phase domains that are exchange spring coupled to magnetically soft domains, alone or in combination with dopant elements (e.g., atoms) or compounds (e.g., molecules) that form domain wall pinning sites within the magnetic material.

The disclosure also describes multiple processes for forming bulk permanent magnets that include $Fe_{16}N_2$ domains. In some examples, the techniques may include using ion implantation to implant N+ ions in a crystallographically textured iron workpiece. In other examples, the N+ ions may be introduced into liquid Fe from a reactant, such as ammonia, ammonium azide, or urea, followed by casting to form a textured workpiece including iron and nitrogen ions.

Regardless of the method of forming, the workpiece including the iron and nitrogen ions may be annealed to form the $Fe_{16}N_2$ phase within the $Fe_8N$ phase. The annealing may occur at relatively low temperatures (e.g., between about 150° C. and about 250° C. or below about 214° C.) for between about 5 hours and about 100 hours to form $Fe_{16}N_2$ phase within the $Fe_8N$ phase. During the annealing, the iron nitride material may be strained to facilitate conversion of the body-centered cubic (bcc) iron crystals into body-centered tetragonal (bct) iron nitride crystals.

In some instances, multiple workpieces of the $Fe_{16}N_2$+$Fe_8N$ material may be combined, with or without introduction of magnetically soft or nonmagnetic dopant materials, and pressed together to form a bulk permanent magnet. The magnetically soft or nonmagnetic materials may be provided as workpieces of the material, using ion implantation into the workpieces of $Fe_{16}N_2$+$Fe_8N$ material, or using cluster implantation into the workpieces of $Fe_{16}N_2$+$Fe_8N$ material.

The magnetically soft or nonmagnetic materials may produce domain wall pinning sites within the material, which may increase a magnetic coercivity of the material.

Figure 9:
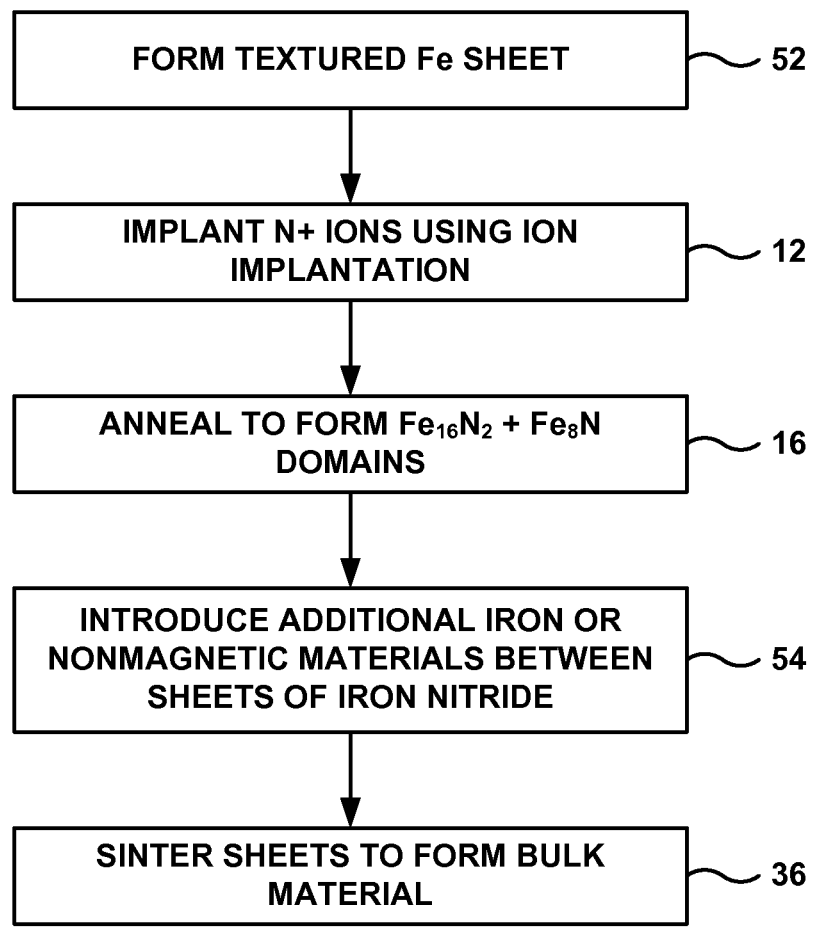
FIG. 9 is a flow diagram illustrating an example technique for forming a bulk material including $Fe_{16}N_2$ magnetically hard domains exchange-spring coupled with $Fe_8N$ magnetically soft domains, with domain wall pinning sites.
Figure 13:
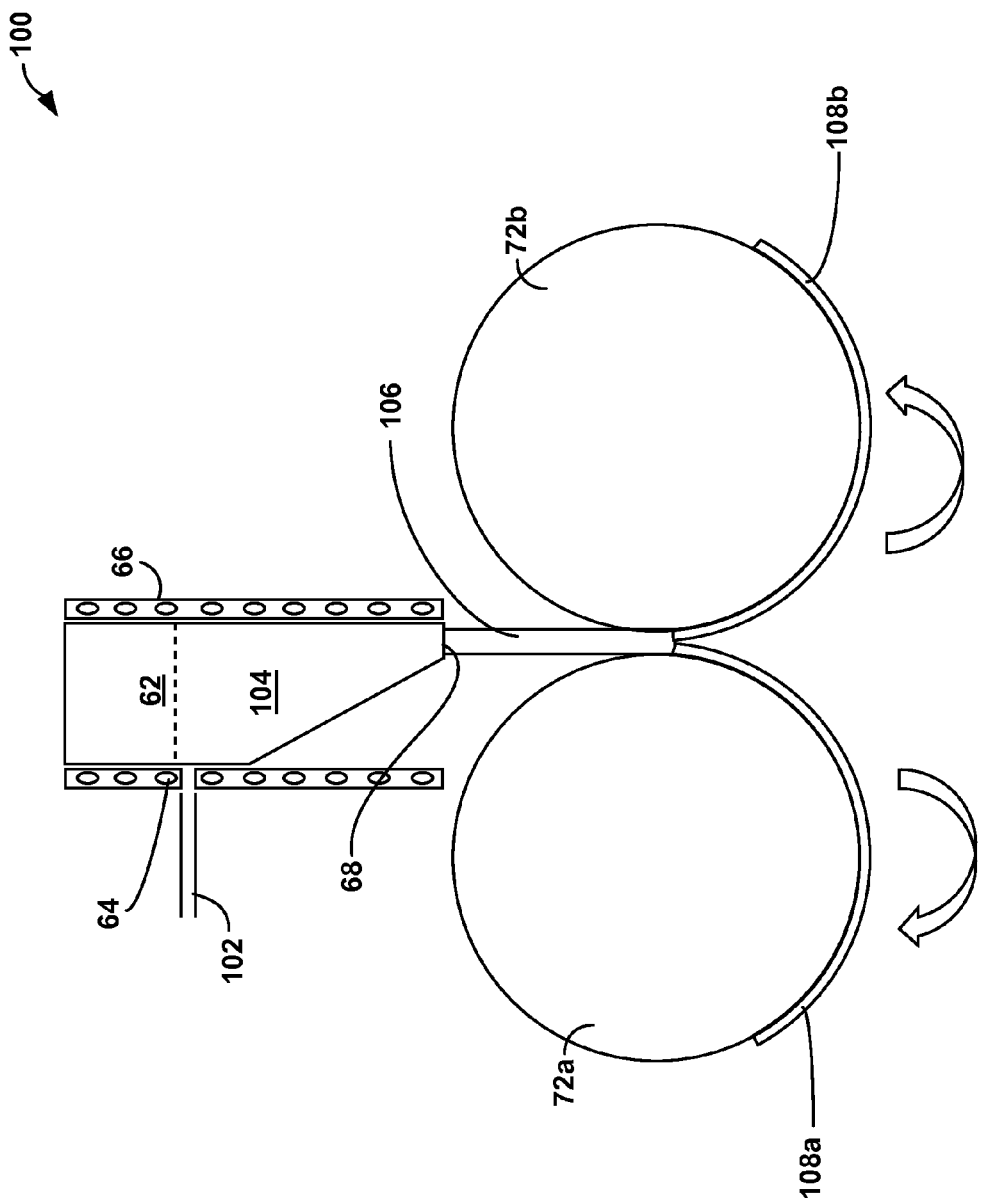
FIG. 13 is a conceptual diagram illustrating an example apparatus for fast belt casting to texture an example iron nitride workpiece.

FIG. 1 is a flow diagram illustrating an example technique for forming a permanent magnet including $Fe_{16}N_2$ magnetically hard domains and $Fe_8N$ magnetically soft domains using ion implantation. The technique shown in FIG. 1 is one technique for forming a permanent magnetic including $Fe_{16}N_2$ magnetically hard domains and $Fe_8N$ magnetically soft domains, and may be used alone or in combination with other processing steps to form a bulk permanent magnetic based on $Fe_{16}N_2$ exchange coupled with a soft magnetic material, such as $Fe_8N$. For example, the technique shown in FIG. 1 may be combined with other processing steps, as shown in FIGS. 9 and 13, to form a bulk magnetic material.

The technique shown in FIG. 1 includes implanting N+ ions in an iron workpiece using ion implantation (12). The iron workpiece may include a plurality of iron crystals. In some examples, the plurality of iron crystals may have crystal axes oriented in substantially the same direction. For example, a major surface of the iron workpiece may be parallel to the (110) surfaces of all or substantially all of the iron crystals. In other examples, a major surface of the iron workpiece may be parallel to another surface of all or substantially all of the iron crystals. By using a workpiece in which all or substantially all of the iron crystals have substantially aligned crystal axes, anisotropy formed when forming the $Fe_8N$ and $Fe_{16}N_2$ phases may be substantially aligned.

In some examples, workpieces include a dimension that is longer, e.g., much longer, than other dimensions of the workpiece. Example workpieces with a dimension longer than other dimensions include fibers, wires, filaments, cables, films, thick films, foils, ribbons, sheets, or the like. In other examples, workpieces may not have a dimension that is longer than other dimensions of the workpiece. For example, workpieces can include grains or powders, such as spheres, cylinders, flecks, flakes, regular polyhedra, irregular polyhedra, and any combination thereof. Examples of suitable regular polyhedra include tetrahedrons, hexahedrons, octahedron, decahedron, dodecahedron and the like, non-limiting examples of which include cubes, prisms, pyramids, and the like.

In some examples of the technique of FIG. 1, the workpiece includes a foil. The workpiece may define a thickness on the order of hundreds of nanometers to millimeters. In some examples, the iron workpiece may define a thickness between about 500 nanometers (nm) and about 1 millimeter (mm). The thickness of the iron workpiece may affect the parameters used for ion implantation and annealing of the workpiece, as will be described below. The thickness of the workpiece may be measured in a direction substantially normal to a surface of the substrate to which the workpiece is attached.

Prior to implantation of N+ ions in the iron workpiece, the iron workpiece may be positioned on a surface of a silicon substrate or a gallium arsenide (GaAs) substrate. In some examples, the iron workpiece may be position on the (111) surface of a (single crystal) silicon substrate, although any crystalline orientation may be used. In some examples, the iron workpiece may be attached to the surface of the substrate at this time.

Figure 2:
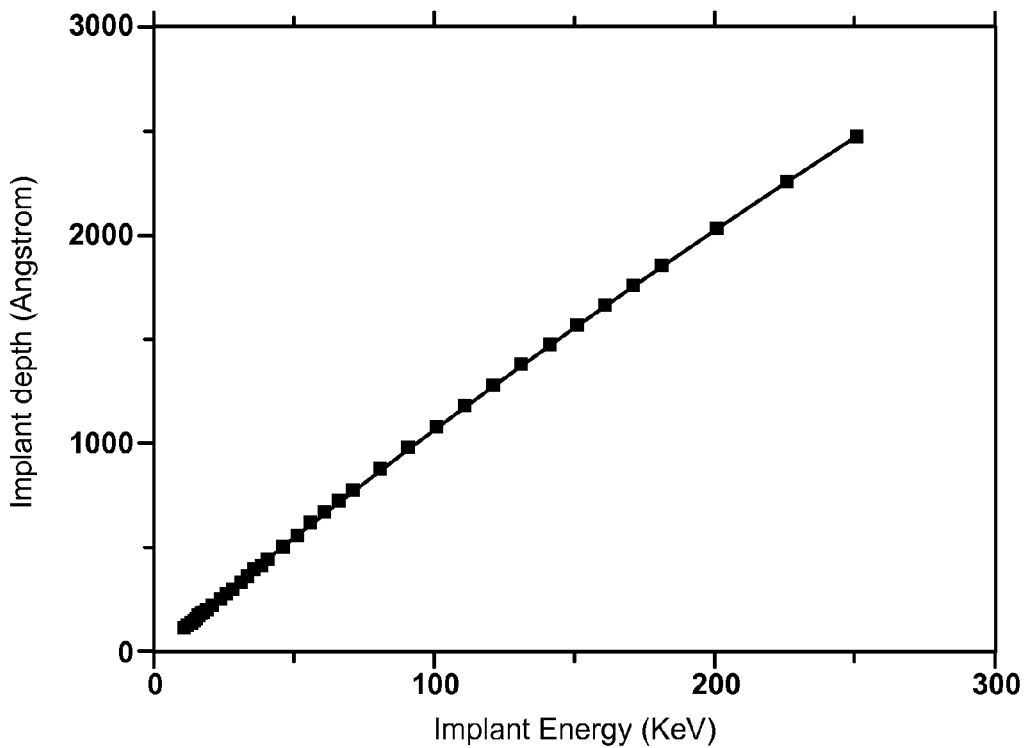
FIG. 2 is a line diagram illustrating the relationship between implant depth (in Angstroms (Å)) and the implant energy (in kiloelectronvolts (keV)) of N+ ions in iron

The average depth to which the N+ ions are implanted in the iron workpiece may depend upon the energy to which the N+ ions are accelerated. FIG. 2 is a line diagram illustrating the relationship between implant depth (in Angstroms (Å)) and the implant energy (in kiloelectronvolts (keV)) of N+ ions in iron, as determined using SRIM ("The Stopping and Range of Ions in Matter," software available from James F. Ziegler at www.srim.org). As shown in FIG. 2, the average implant depth of the N+ ions increases for increasing implant energy. Although not shown in FIG. 2, for each implant energy, N+ ions are implanted within the iron workpiece in a range depths surrounding the average implant depth.

The implant energy used to implant the N+ ions may be selected based at least in part on the thickness of the iron workpiece. The implant energy also may be selected to implant the N+ ions without doing overly significant damage to the iron workpiece, including the crystal lattice of the iron crystals in the iron workpiece. For example, while higher implant energies may allow implantation of the N+ ions at a greater average depth, higher implant energies may increase the damage to the iron workpiece, including damaging the crystal lattice of the iron crystals and ablating some of the iron atoms due to the impact of the N+ ions. Hence, in some examples, the implant energy may be limited to be below about 180 keV. In some examples, the incident angle of implantation may be about zero degrees (e.g., substantially perpendicular to the surface of the iron workpiece). In other examples, the incident angle of implantation may be adjusted to reduce lattice damage. For example, the incident angle of implantation may be between about 3° and about 7° from perpendicular.

As an example, when the iron workpiece defines a thickness of about 500 nm, an implant energy of about 100 keV may be used to implant the N+ ions in the iron workpiece. An implant energy of about 100 keV may also be used to implant the N+ ions in iron workpieces of other thicknesses. In other examples, a different implant energy may be used for iron workpieces defining a thickness of about 500 nm, and the same or different implant energy may be used for workpieces defining a thickness different than 500 nm.

Additionally, the fluency of N+ ions may be selected to implant a desired dose of N+ ions within the iron workpiece. In some examples, the fluency of N+ ions may be selected to implant approximately stoichiometric number of N+ ions within the iron workpiece. The stoichiometric ratio of iron to nitrogen in $Fe_{16}N_2$ is 8:1. Thus, the approximate number of iron atoms in the iron workpiece may be determined, and a number of N+ ions equal to approximately ⅛ (12.5%) of the iron atoms may be implanted in the iron workpiece, such as between about 8 at. % and about 15 at. %. For example, an iron workpiece having measurements of about 1 cm by 1 cm by 500 nm may include about $4.23 \times 10^{18}$ iron atoms. Thus, to achieve a stoichiometric ratio of iron atoms to N+ ions in the iron workpiece, about $5.28 \times 10^{17}$ N+ ions may be implanted in the sample.

The temperature of the iron workpiece during the ion implantation also may be controlled. In some examples, the temperature of the iron workpiece may be between about room temperature and about 500° C.

Once the N+ ions have been implanted in the iron workpiece (12), the iron workpiece may be subjected to a first annealing step (14), which may be referred to as a pre-annealing step. The pre-annealing step may accomplish multiple functions, including, for example, securely attaching the iron workpiece to the substrate. As described below, secure attachment of the iron workpiece to the substrate allows the post-annealing step to generate stress in the iron workpiece, facilitating the transformation of the crystalline structure of at least some of the crystals in the iron workpiece from body centered cubic (bcc) iron to body centered tetragonal (bct) iron nitride. In some examples, the pre-annealing step also may activate the implanted N+ ions, repair damage to the iron crystals' lattices due to the ion implantation procedure, and/or remove any oxygen in the workpiece. In some examples, the pre-annealing step may be performed at a temperature between about 450° C. and about 550° C. for between about 30 minutes and about 4 hours. As an example, the pre-annealing step may be performed at a temperature of about 500° C. for between about 30 minutes and about 1 hour.

In some examples, in addition to heating the iron workpiece and the substrate, the pre-annealing step may include applying an external force between about 0.2 gigapascals (GPa) and about 10 GPa between the iron workpiece and the substrate. The external force may assist bonding of the iron workpiece and the substrate.

The atmosphere in which the pre-annealing step is performed may include, for example, nitrogen, argon, and/or hydrogen, such as a mixture of about 4 vol. % hydrogen, about 10 vol. % nitrogen, and about 86 vol. % argon. The composition of the atmosphere may assist with removing oxygen from the workpiece and cleaning surfaces of the workpiece.

Figure 3:
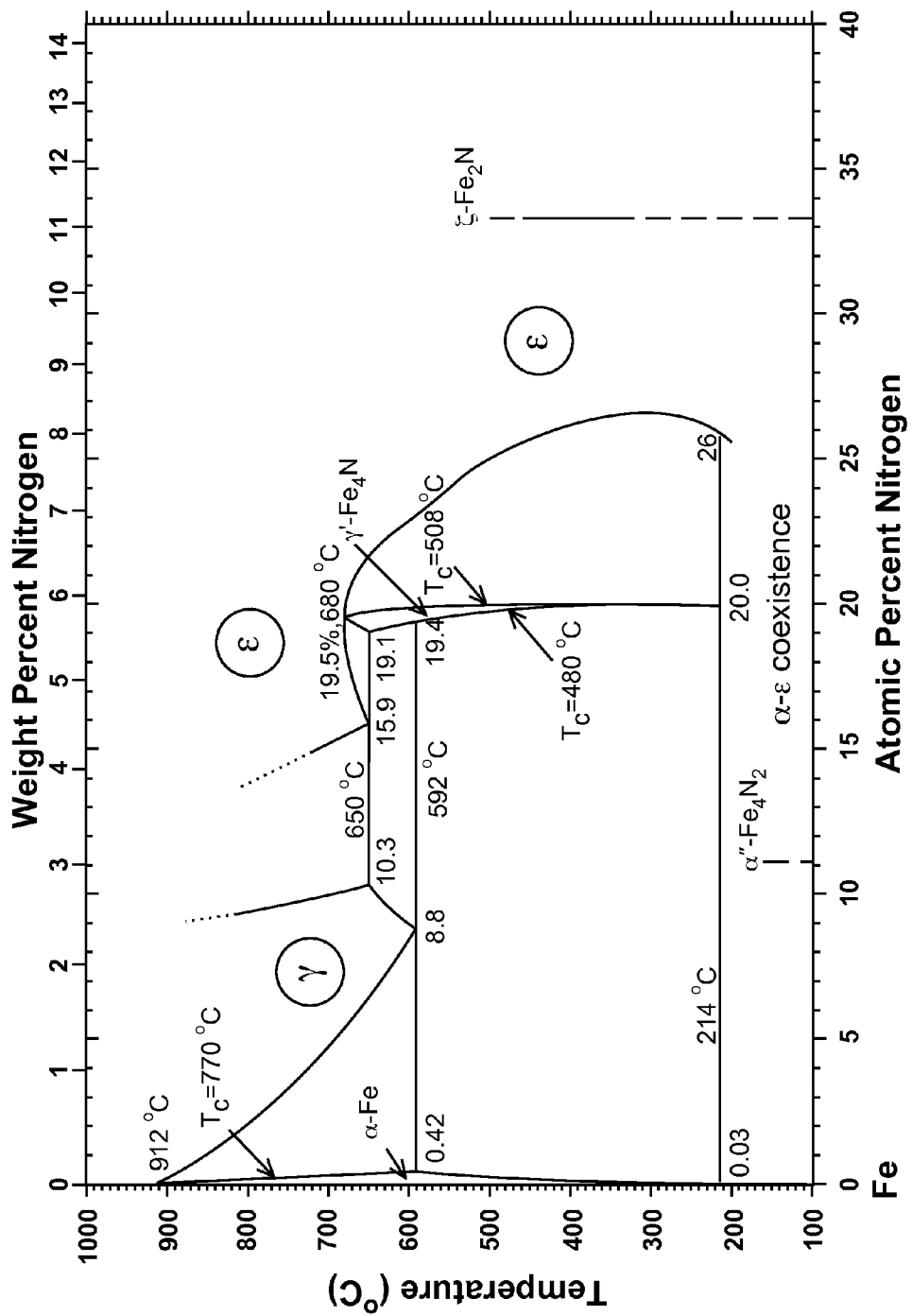
FIG. 3 is an iron nitride phase diagram.

Following the pre-annealing step (14), the iron workpiece including implanted N+ ions and the substrate may be exposed to a second annealing step (16), which may be referred to as a post-annealing step. The post-annealing step may be carried out at a temperature that produces strain in the iron workpiece due to differences in the coefficients of thermal expansion for the substrate and the iron workpiece and that accesses the $Fe_{16}N_2$ phase. Additionally, the post-annealing step allows diffusion of N+ ions iron crystals to form iron nitride, including $Fe_{16}N_2$ phase domains and $Fe_8N$ phase domains. FIG. 3 is an iron nitride phase diagram, reproduced from E. H. Du Marchi Van Voorthuysen et al. *Low-Temperature Extension of the Lehrer Diagram and the Iron-Nitrogen Phase Diagram,* 33A Metallurgical and Materials Transactions A 2593, 2597 (August 2002). As shown in FIG. 3, annealing at relatively low temperatures allows transformation of partial $Fe_8N$ disordered phase into $Fe_{16}N_2$ ordered phase. In some examples, the post-annealing step may be carried out at a temperature below about 250° C., such as between about 120° C. and about 214° C., between about 120° C. and about 200° C., between about 150° C. and about 200° C., or at about 150° C. The post-annealing step may be performed in a nitrogen ($N_2$) or argon (Ar) atmosphere, or in a vacuum or near-vacuum.

Figure 4:
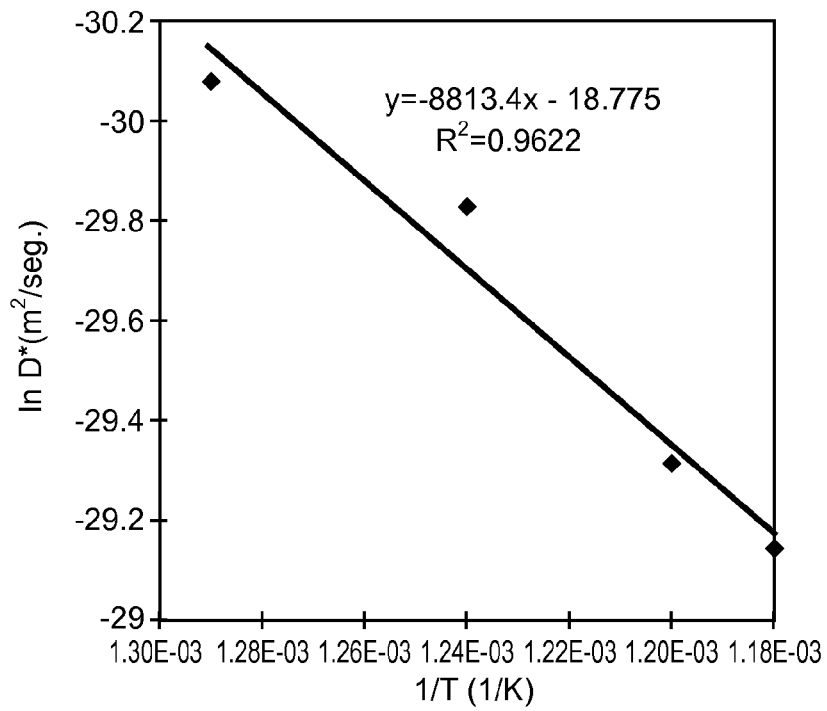
FIG. 4 is a scatter diagram representing the relationship between the natural log of the diffusion coefficient and inverse temperature.

The temperature and duration of the post-annealing step may be selected based on, for example, a size of the sample and a diffusion coefficient of nitrogen atoms in iron at the post-annealing temperature. Based on these factors, the temperature and duration may be selected to provide sufficient time for nitrogen atoms to diffuse to locations within the iron workpiece to form $Fe_{16}N_2$ domains. FIG. 4 is a scatter diagram representing the relationship between the natural log of the diffusion coefficient and inverse temperature. Based on the relationship shown in FIG. 4, the natural logarithm of the diffusion coefficient may be determined for a given temperature, and the diffusion length may be determined for a given time using the diffusion coefficient. As an example, at a temperature of 200° C., and an annealing duration of 40 hours, the diffusion length of nitrogen in iron is about 0.5 micrometers (μm).

Additionally, the temperature and duration of the post-annealing step may be selected based on a desired volume fraction of $Fe_{16}N_2$ phase domains in the iron nitride workpiece. For example, at a selected temperature, a longer post-annealing step may result in a higher volume fraction of $Fe_{16}N_2$. Similarly, for a given post-annealing step duration, a higher temperature may result in a higher volume fraction of $Fe_{16}N_2$. However, for durations above a threshold value, the additional volume fraction of $Fe_{16}N_2$ may be limited or eliminated, as the volume fraction of $Fe_{16}N_2$ reaches a relatively stable value. For example, at a temperature of about 150° C., after about 20 hours, the volume fraction of $Fe_{16}N_2$ reaches a stable value. The duration of the post-annealing step may be at least about 5 hours, such as at least about 20 hours, or between about 5 hours and about 100 hours, or between about 20 hours and about 100 hours, or about 40 hours.

Figure 5:
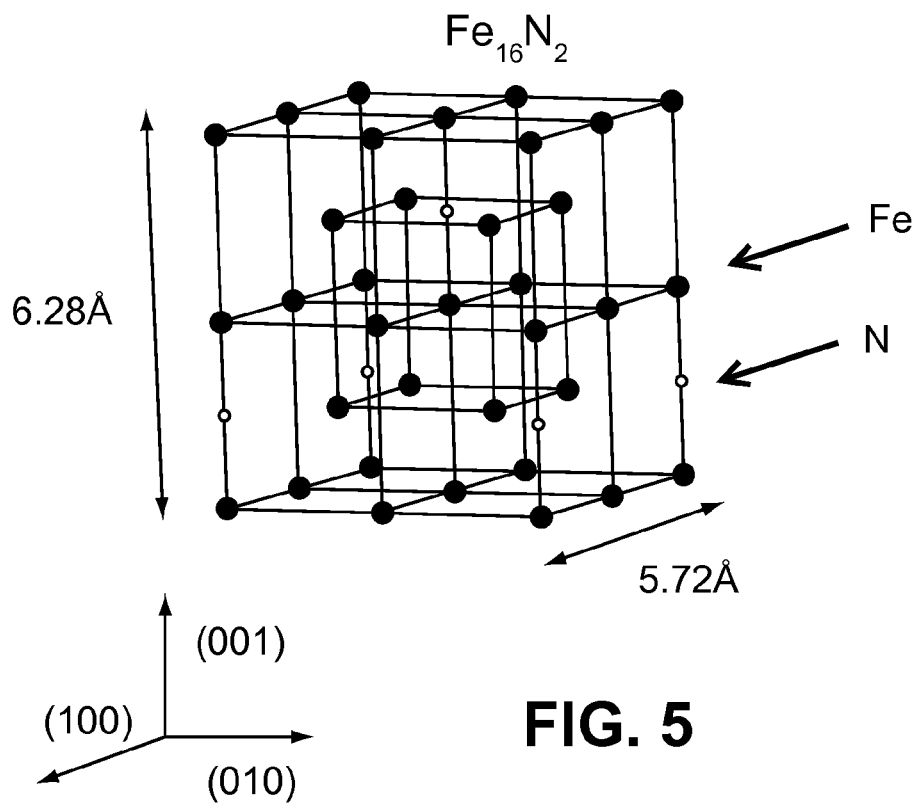
FIG. 5 is a conceptual diagram that shows eight (8) iron unit cells in a strained state with nitrogen atoms implanted in interstitial spaces between iron atoms.

$Fe_8N$ and $Fe_{16}N_2$ have similar body-centered tetragonal (bct) crystalline structure. However, in $Fe_{16}N_2$, nitrogen atoms are ordered within the iron lattice, while in $Fe_8N$, nitrogen atoms are randomly distributed within the iron lattice. FIG. 5 is a conceptual diagram that shows eight (8) iron unit cells in a strained state with nitrogen atoms implanted in interstitial spaces between iron atoms in an $Fe_{16}N_2$ phase. As shown in FIG. 5, in the $Fe_{16}N_2$ phase, the nitrogen atoms are aligned along the (002) crystal plane. Also shown in FIG. 5, the iron nitride unit cells are distorted such that the length of the unit cell along the <001> axis is approximately 3.14 angstroms (Å) while the length of the unit cell along the <010> and <100> axes is approximately 2.86 Å. The iron nitride unit cell may be referred to as a bct unit cell when in the strained state. When the iron nitride unit cell is in the strained state, the <001> axis may be referred to as the c-axis of the unit cell.

The post-annealing step facilitates formation of the bct crystalline structure at least in part due to the strain exerted on the iron crystal lattice as a result of differential expansion of the substrate and the iron nitride workpiece during the post-annealing step. For example, the coefficient of thermal expansion for iron is 11.8 μm/m·K, while for silicon it is 2.6 μm/m·K. This difference in thermal expansion coefficients results in a compression stress substantially parallel the major plane of the iron workpiece and a corresponding stretching force being generated along the <001> crystalline direction on an iron workpiece with an (110) face.

Figure 6:
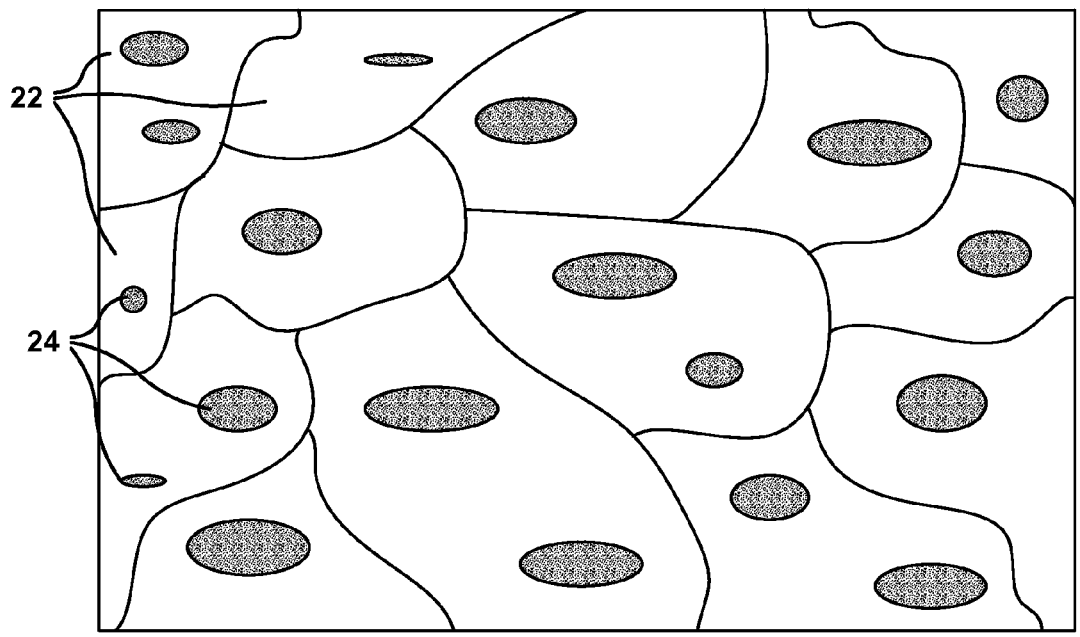
FIG. 6 is a conceptual diagram illustrating a material having $Fe_8N$ domains and $Fe_{16}N_2$ domains.

The post-annealing step results in formation of $Fe_{16}N_2$ phase domains within domains of $Fe_8N$, and other Fe and/or iron nitride compositions. FIG. 6 is a conceptual diagram illustrating a material having $Fe_8N$ domains 22 and $Fe_{16}N_2$ domains 24. Because the iron workpiece is structured on a nanometer scale (e.g., the sizes of $Fe_8N$ domains 22 and $Fe_{16}N_2$ domains 24 are on the order of nanometers), magnetic coupling between the magnetically hard $Fe_{16}N_2$ domains 24 and the magnetically soft $Fe_8N$ domains 22 may occur substantially throughout the workpiece. Because the $Fe_{16}N_2$ and $Fe_8N$ crystals have substantially similar crystalline structure, the material can be naturally crystallographically coherent, meaning having an aligned easy axis, which produces anisotropy. This may facilitate exchange coupling through phase boundaries between $Fe_{16}N_2$ and $Fe_8N$.

Figure 7:
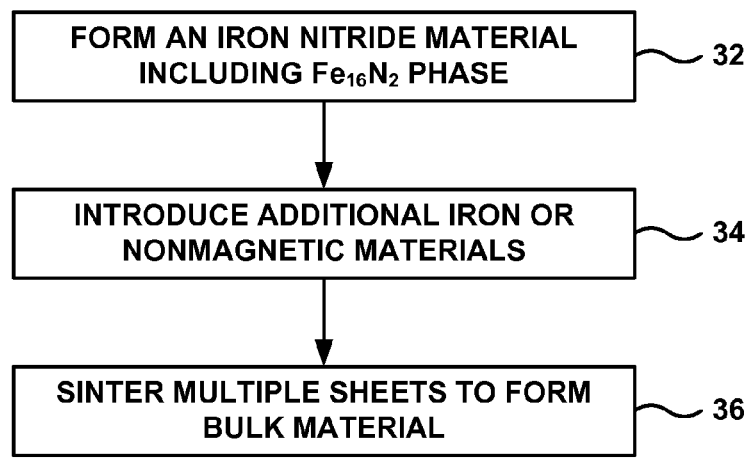
FIG. 7 is a flow diagram illustrating an example technique for forming a bulk material including $Fe_{16}N_2$ magnetically hard domains exchange-spring coupled with $Fe_8N$ magnetically soft domains, with domain wall pinning sites.

FIG. 7 is a flow diagram illustrating an example technique for forming a bulk material including $Fe_{16}N_2$ magnetically hard domains exchange-spring coupled with $Fe_8N$ magnetically soft domains, with domain wall pinning sites. FIG. 7 is a general technique, and further details of examples of the general technique of FIG. 7 will be described below with reference to the techniques of FIGS. 9, 12, 14, and 15.

The technique of FIG. 7 includes forming an iron nitride material including $Fe_{16}N_2$ phase domains (32). As described with reference to FIG. 1, using ion implantation to implant N+ ions in an iron workpiece, such as an iron foil, followed by one or more, e.g., two, annealing steps is one technique for forming an iron nitride material (or workpiece) including $Fe_{16}N_2$ phase. Other techniques for forming an iron nitride material including $Fe_{16}N_2$ phase domains (32) are described below with respect to FIGS. 9, 12, 14, and 15. These techniques may include forming a textured iron workpiece, such as a textured iron sheet; implanting N+ ions in the textured iron workpiece to form a textured iron nitride workpiece; and annealing the textured iron nitride workpiece to form $Fe_{16}N_2$ phase domains. The techniques also may include forming a textured iron nitride workpiece, such as a textured iron nitride sheet, by mixing nitrogen in molten iron and annealing the textured iron nitride workpiece to form $Fe_{16}N_2$ phase domains. The techniques also may include forming an iron workpiece, nitridizing the strained iron workpiece, and annealing the nitridized iron workpiece.

The technique illustrated in FIG. 7 also includes introducing additional iron or nonmagnetic materials (34). In some examples, as described with reference to FIGS. 9 and 12, the additional iron or nonmagnetic materials may be introduced as workpieces of the iron or nonmagnetic materials interleaved with workpieces of the iron nitride material including $Fe_{16}N_2$ phase domains. In other examples, as described with reference to FIG. 14, the additional iron or nonmagnetic materials may be introduced into the iron nitride material including $Fe_{16}N_2$ phase domains using ion implantation and/or cluster implantation. Example nonmagnetic elements (e.g., atoms) or compounds (e.g., molecules) that can be used include Al, Cu, Ti, Mn, Zr, Ta, B, C, Ni, Ru, $SiO_2$, $Al_2O_3$, or combinations thereof. The iron or nonmagnetic materials may be introduced as workpieces of material. The workpieces or Fe or nonmagnetic powders may have sizes (e.g., thicknesses or diameters) ranging from several nanometers to several hundred nanometers, and may function as domain wall pinning sites after pressing process. Those domain wall pinning sites may enhance the coercivity of the permanent magnet.

Figure 8A:
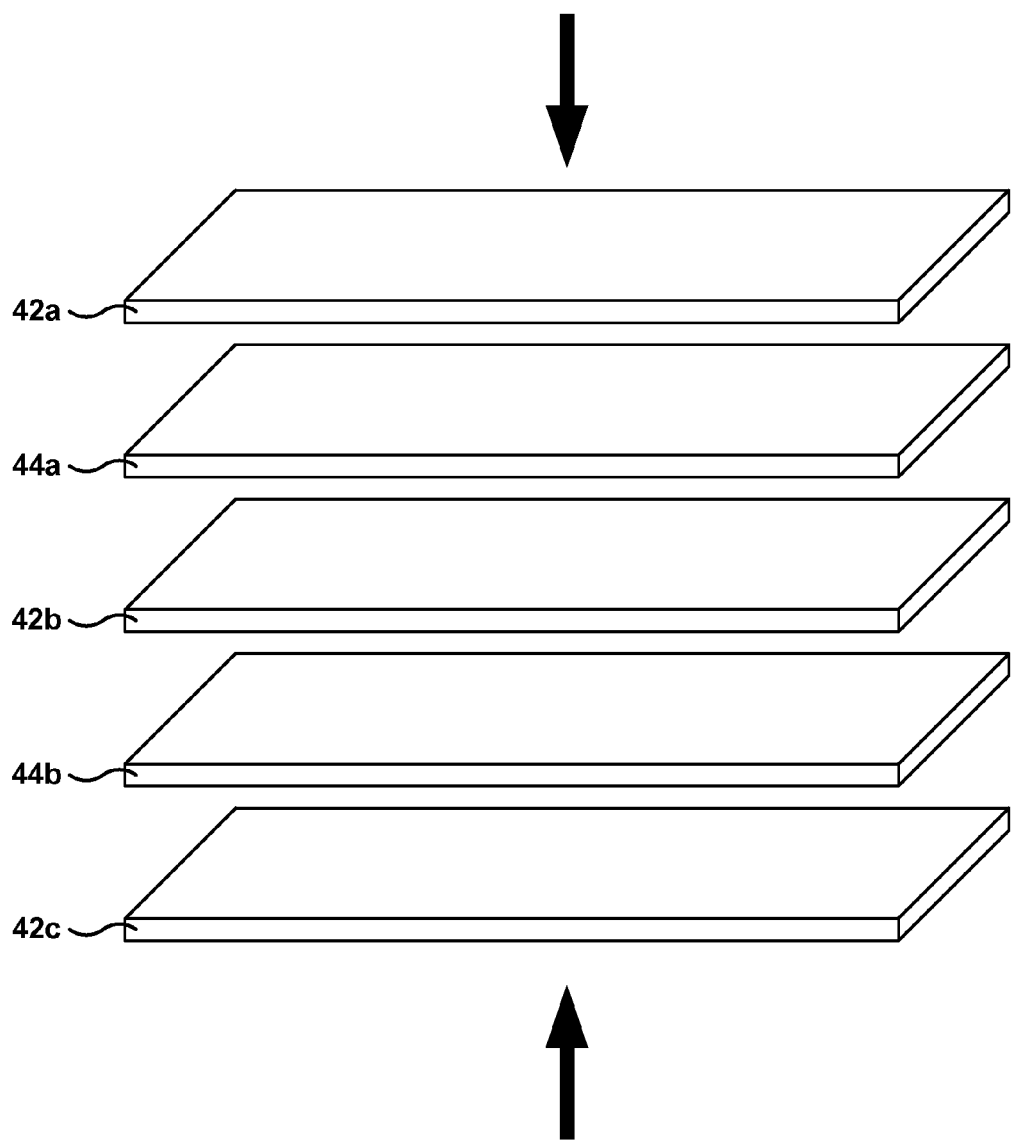
FIGS. 8A and 8B is a conceptual diagram that illustrates a technique for introducing impurities between workpieces of material including $Fe_{16}N_2$ magnetically hard domains exchange-spring coupled with $Fe_8N$ magnetically soft domains.
Figure 8B:
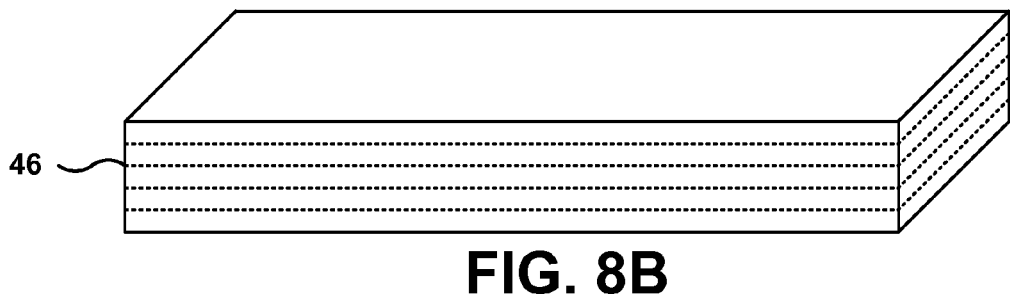

The technique illustrated in FIG. 7 further includes sintering workpieces to form a bulk magnetic material (36). An example by which multiple workpieces may be sintered together is illustrated in FIGS. 8A and 8B. For example a plurality of iron nitride workpieces 42a-42c (which include $Fe_{16}N_2$ phase domains) may be interleaved with a plurality of workpieces 44a, 44b that include iron or nonmagnetic materials. Although three iron nitride workpieces 42a-42c and two workpieces 44a, 44b that include iron or nonmagnetic materials are shown in FIGS. 8A and 8B, in other examples, any number of iron nitride workpieces 42a-42c and two workpieces 44a, 44b that include iron or nonmagnetic materials may be used.

Iron nitride workpieces 42a-42c may be arranged so the <001> axes of the respective iron nitride workpieces 42a-42c are substantially aligned. In examples in which the <001> axes of the respective iron nitride workpieces 42a-42c are substantially parallel to a long axis of the respective one of iron nitride workpieces 42a-42c, substantially aligning the iron nitride workpieces 42a-42c may include overlying one of iron nitride workpieces 42a-42c on another of iron nitride workpieces 42a-42c. Aligning the <001> axes of the respective iron nitride workpieces 42a-42c may provide uniaxial magnetic anisotropy to magnet material 46 (FIG. 8B).

After the workpieces are interleaved as shown in FIG. 8A, the workpieces may be pressed together and sintered. The sintering pressure, temperature and duration may be selected to mechanically join the workpieces while maintaining the crystal structure of the iron nitride workpieces 42a-42c, (e.g., as including the $Fe_{16}N_2$ phase domains). Thus, in some examples, the sintering step may be performed at a relatively low temperature. For example, the sintering temperature may be below about 250° C., such as between about 120° C. and about 250° C., between about 150° C. and about 250° C., between about 120° C. and about 200° C., between about 150° C. and about 200° C., or about 150° C. The sintering pressure may be between, for example, about 0.2 gigapascal (GPa) and about 10 GPa. The sintering time may be at least about 5 hours, such as at least about 20 hours, or between about 5 hours and about 100 hours, or between about 20 hours and about 100 hours, or about 40 hours. The sintering time, temperature, and pressure may be affected by the materials in workpieces 44a, 44b that include iron or nonmagnetic materials. The sintering may be performed in an ambient atmosphere, a nitrogen atmosphere, a vacuum, or another inert atmosphere.

After the sintering iron nitride workpieces 42a-42c and two workpieces 44a, 44b that include iron or nonmagnetic materials, a bulk magnetic material 46 may be formed. Bulk magnetic material 46 may include both exchange spring coupling between $Fe_8N$ and $Fe_{16}N_2$ and domain wall pinning sites provided by the iron or nonmagnetic materials. In this way, bulk magnetic material 46 may possess a desirably high energy product, which may approach that of pure $Fe_{16}N_2$ (about 134 MGOe).

Bulk magnetic material 46 may be formed by a plurality of different techniques which fall within the general technique described with respect to FIG. 7. Examples of these different techniques are described with reference to FIGS. 9, 12, 14, and 15, and other techniques for forming bulk magnetic material 46 will be apparent based on the contents of this disclosure.

Figure 10:
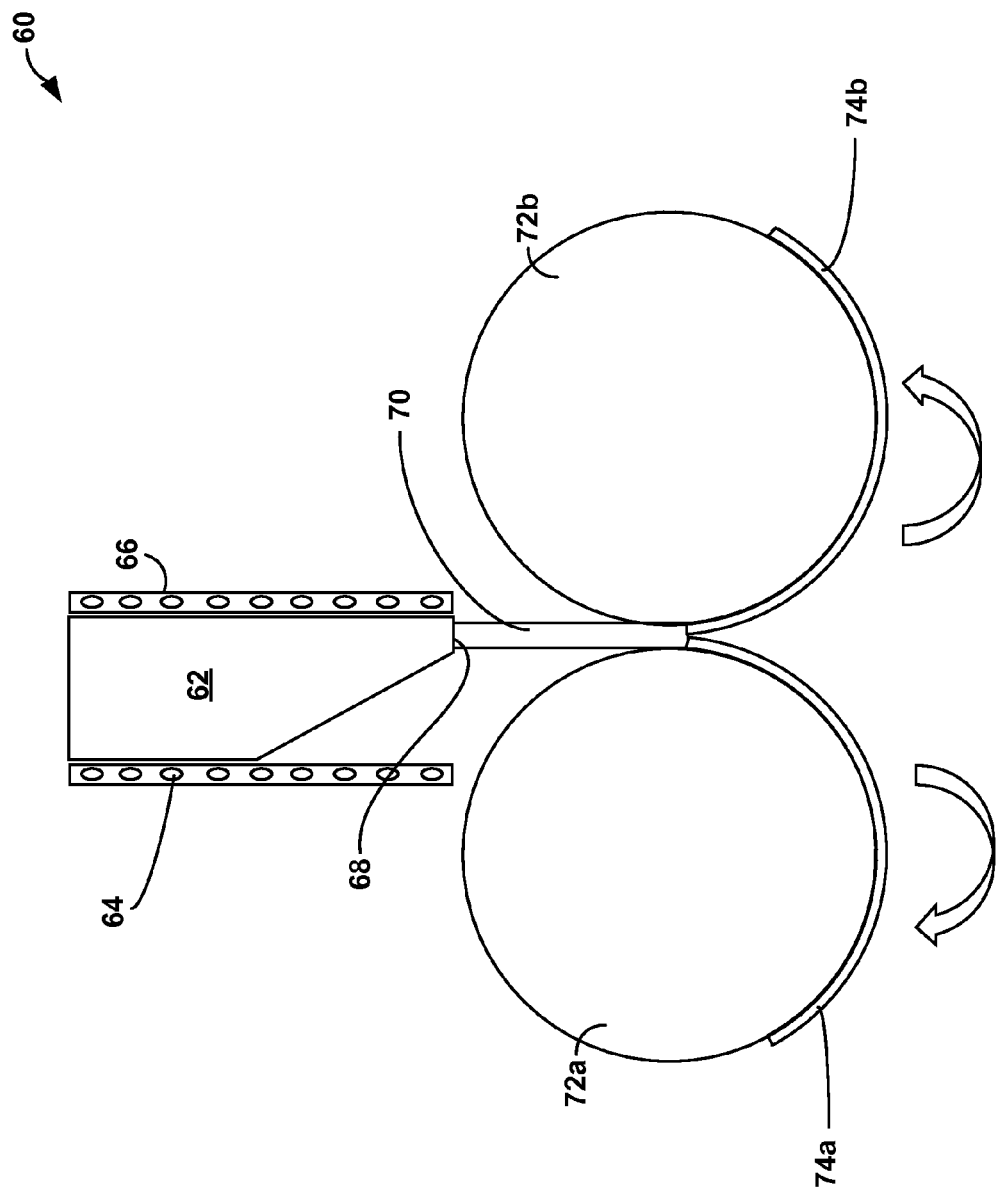
FIG. 10 is a conceptual diagram illustrating an example apparatus for fast belt casting to texture an example iron workpiece.

FIG. 9 is a flow diagram illustrating an example technique for forming a bulk material including $Fe_{16}N_2$ magnetically hard domains exchange-spring coupled with $Fe_8N$ magnetically soft domains, with domain wall pinning sites. The technique of FIG. 9 includes forming a textured iron workpiece (52). In some examples, the textured iron workpiece may include textured iron sheets 74a and 74b (FIG. 10). In other examples, the textured iron workpiece may include another workpiece, such as a fiber, a wire, a filament, a cable, a film, a thick film, a foil, a ribbon, or the like. The textured iron workpiece may be formed using, for example, belt casting. FIG. 10 is a conceptual diagram illustrating one example apparatus 60 for fast belt casting to texture an example iron workpiece.

Fast belt casting apparatus 60 may include an ingot chamber 66 which contains molten iron ingot 62, and is heated by heating source 64, e.g., in the form of a heating coil. In some examples, the temperature of molten iron ingot 62 within ingot chamber 66 may be greater than about 1800 Kelvin (K; about 1526.85° C.). The pressure of the iron ingot 62 within ingot chamber 66 may be between about 0.06 MPa and about 0.12 MPa.

Molten iron ingot 62 flows out of ingot chamber 66 through nozzle head 68 to form iron strip 70. Iron strip 70 is fed into the gap zone between the surfaces of first pinch roller 72a and second pinch roller 72b (collectively, "pinch rollers 72"), which are rotated in opposite directions. In some examples, the distance from nozzle head 68 to the surfaces of pinch rollers 72 may be between about 2 mm and about 10 mm, such as about 4 mm.

In some examples, the rotation speed of first pinch roller 72a and second pinch roller 72b may vary from approximately 10 rotations per minute (rpm) to 1000 rpm, and the rotation speed of the rollers 72 may be approximately the same. In some examples, pinch rollers 72 are actively cooled, e.g., using water cooling, which maintains the surfaces of rollers 72 at a temperature below the temperature of iron strip 70 and aids in cooling and casting iron strip 70. For example, the temperatures of pinch rollers 72 may be maintained between about 300 K (about 26.85° C.) and about 400 K (about 126.85° C.). The pressure exerted on iron ingot by pinch rollers 72 may be between about 0.04 MPa and about 0.1 MPa.

After iron strip 70 is pressed between pinch rollers 72 and cooled, iron strip 70 forms textured iron sheets 74a and 74b. In some examples, textured iron sheets 74a and 74b (collectively, "textured iron sheets 74") may form textured iron ribbons with at least one dimension (e.g., a thickness) between about 1 μm and about 10 mm, such as between about 5 μm and about 1 mm (either individually or after compression of multiple iron workpieces). Each of textured iron sheets 74 may include, for example, a (100) or (110) crystal texture. In other words, a major surface of each of textured iron sheets 74 may be parallel to the (100) or (110) surfaces of all or substantially all of the iron crystals within the respective one of textured iron sheets 74. By using a textured iron sheet 74 in which all or substantially all of the iron crystals have substantially aligned crystal axes in the subsequent processing steps, anisotropy formed when forming the $Fe_8N$ and $Fe_{16}N_2$ phase domains may be substantially aligned among the crystals.

Following formation of textured iron sheets 74 (52), N+ ions may be implanted in the each of textured iron sheets 74 using ion implantation (12). The N+ ions may be implanted in the textured iron sheet 74a and/or 74b using techniques and parameters similar to those described with reference to FIG. 1. For example, the implant energy used to implant the N+ ions may be selected based at least in part on the dimensions (e.g., thickness) of the respective one of textured iron sheets 74 in which the N+ ions are being implanted while avoiding overly significant damage to the one of textured iron sheets 74, including the crystal lattice of the iron crystals in the one of textured iron sheets 74. For example, while higher implant energies may allow implantation of the N+ ions at a greater average depth, higher implant energies may increase the damage to textured iron sheets 74, including damaging the crystal lattice of the iron crystals and ablating some of the iron atoms due to the impact of the N+ ions. Hence, in some examples, the implant energy may be limited to be below about 180 keV, such as about 100 keV.

In some examples, the incident angle of implantation may be about zero degrees (e.g., substantially perpendicular to the surface of the textured iron sheets 74). In other examples, the incident angle of implantation may be adjusted to reduce lattice damage. For example, the incident angle of implantation may be between about 3° and about 7° from perpendicular.

The temperature of the textured iron sheets 74 during the ion implantation also may be controlled. In some examples, the temperature of the textured iron sheets 74 may be between about room temperature and about 500° C.

Additionally, the fluency of N+ ions may be selected to implant a desired dose of N+ ions within the respective one of textured iron sheets 74. In some examples, the fluency of N+ ions may be selected to implant approximately stoichiometric number of N+ ions within the respective one of textured iron sheets 74. The stoichiometric ratio of iron to nitrogen in $Fe_{16}N_2$ is 8:1. Thus, the approximate number of iron atoms in the respective one of textured iron sheets 74 may be determined, and a number of N+ ions equal to approximately ⅛ (12.5%) of the iron atoms may be implanted in the one of textured iron sheets 74, such as between about 8 at. % and about 15 at. %.

Once the selected number of N+ ions has been implanted in the textured iron sheet 74a or 74b to form a textured iron nitride sheet, the textured iron nitride sheet may be annealed to allow diffusion of N+ ions into appropriate positions within the iron crystals to form $Fe_{16}N_2$ phase domains and $Fe_8N$ phase domains within the textured iron nitride sheet (16). The annealing at this step may be similar to the post-annealing step described with respect to FIG. 1. As shown in FIG. 3, annealing at relatively low temperatures allows transformation of partial $Fe_8N$ disordered phase into $Fe_{16}N_2$ ordered phase. In some examples, the post-annealing step may be carried out at a temperature below about 250° C., such as between about 120° C. and about 214° C., between about 120° C. and about 200° C., between about 150° C. and about 200° C., or at about 150° C. The post-annealing step may be performed in a nitrogen ($N_2$) or argon (Ar) atmosphere, or in a vacuum or near-vacuum.

The temperature and duration of the post-annealing step may be selected based on, for example, a size of the textured iron nitride workpiece (e.g., the textured iron nitride sheet) and a diffusion coefficient of nitrogen atoms in iron at the post-annealing temperature. Based on these factors, the temperature and duration may be selected to provide sufficient time for nitrogen atoms to diffuse to locations within the textured iron nitride workpiece to form $Fe_{16}N_2$ domains.

Additionally, the temperature and duration of the post-annealing step may be selected based on a desired volume fraction of $Fe_{16}N_2$ phase domains in the textured iron nitride workpiece. For example, at a selected temperature, a longer post-annealing step may result in a higher volume fraction of $Fe_{16}N_2$. Similarly, for a given post-annealing step duration, a higher temperature may result in a higher volume fraction of $Fe_{16}N_2$. However, for durations above a threshold value, the additional volume fraction of $Fe_{16}N_2$ may be limited or eliminated, as the volume fraction of $Fe_{16}N_2$ reaches a relatively stable value. The duration of the post-annealing step may be at least about 5 hours, such as at least about 20 hours, or between about 5 hours and about 100 hours, or between about 20 hours and about 100 hours, or about 40 hours.

During the post-annealing step, the textured iron nitride workpiece may be subjected to a strain to facilitate transformation of at least some of the bcc iron crystals into a bct crystal structure. The stain may be exerted on the texture iron nitride workpiece using a variety of strain inducing apparatuses. For example, a first end of the textured iron nitride workpiece may be received by (e.g., wound around) a first roller and a second end of the textured iron nitride workpiece may be received by (e.g., wound around) a second roller. The rollers may be rotated in opposite directions to exert a tensile force on the textured iron nitride workpiece.

Figure 11:
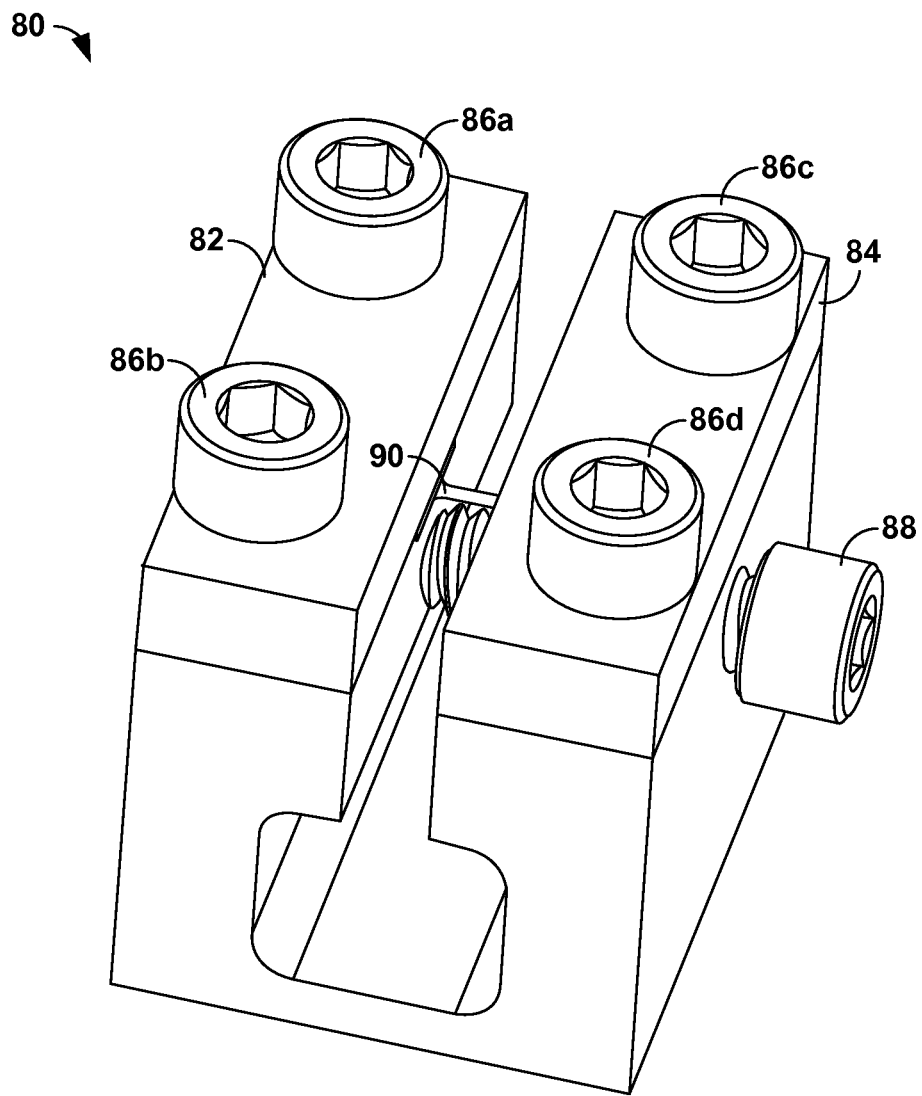
FIG. 11 is a conceptual diagram illustrating another example apparatus with which an iron workpiece can be strained.

In other examples, opposite ends the textured iron nitride workpiece may be gripped in mechanical grips, e.g., clamps, and the mechanical grips may be moved away from each other to exert a tensile force on the textured iron nitride workpiece. FIG. 11 is a conceptual diagram illustrating another example apparatus with which the textured iron nitride workpiece can be strained as described herein. Apparatus 80 may include first clamp 82 and second clamp 84, which may secure opposing ends of a textured iron nitride workpiece 90 by tightening screws 86a-86d. Once the iron workpiece 90 is secured in apparatus 80, bolt 88 may be turned to rotate the threaded body of bolt 88 and increase the distance between first clamp 82 and second clamp 84. The increase in distance between clamps 82 and 84 exerts a tensile force on textured iron nitride workpiece 90. The value of the elongation or stress generated by the rotation of bolt 88 may be measured by any suitable gauge, such as, e.g., a strain gauge. In some examples, apparatus 80 may be placed in a furnace (e.g., a tube furnace) or other heated environment to allow heating of textured iron nitride workpiece 90 during and/or after textured iron nitride workpiece 90 is strained by apparatus 80.

A strain inducing apparatus may strain the textured iron nitride workpiece 90 to a certain elongation. For example, the strain on the textured iron nitride workpiece 90 may be between about 0.1% and about 7%. In other examples, the strain on the textured iron nitride sheet 90 may be less than about 0.1% or greater than about 7%. In some examples, exerting a certain strain on the textured iron nitride workpiece 90 may result in a substantially similar strain on individual unit cells of the iron crystals, such that the unit cell is elongated along the <001> axis between about 0.1% and about 7%.

A cross-sectional area of the textured iron nitride workpiece (in a plane substantially orthogonal to the direction in which the iron workpiece is stretched/strained) may affect an amount of force that must be applied to the textured iron nitride workpiece to result in a given strain. For example, the application of approximately 144 N of force to a textured iron nitride workpiece with a cross-sectional area of about 0.00785 mm$^2$ may result in about a 7% strain. As another example, the application of approximately 576 N of force to a textured iron nitride workpiece with a cross-sectional area of about 0.0314 mm$^2$ may result in about a 7% strain. As another example, the application of approximately 1296 N of force to a textured iron nitride workpiece with a cross-sectional area of about 0.0707 mm$^2$ may result in about a 7% strain. As another example, the application of approximately 2304 N of force to a textured iron nitride workpiece with a cross-sectional area of about 0.126 mm$^2$ may result in about a 7% strain. As another example, the application of approximately 3600 N of force to a textured iron nitride workpiece with a cross-sectional area of about 0.196 mm$^2$ may result in about a 7% strain.

The post-annealing and straining step results in formation of $Fe_{16}N_2$ phase domains within domains of $Fe_8N$, and other Fe and/or iron nitride compositions, e.g., as shown in FIG. 6. Because the textured iron nitride workpiece is structured on a nanometer scale (e.g., the $Fe_8N$ domains 22 and $Fe_{16}N_2$ domains 24 are on the order of nanometers), magnetic coupling between the magnetically hard $Fe_{16}N_2$ domains 24 and the magnetically soft $Fe_8N$ domains 22 may occur substantially throughout the workpiece. Because the $Fe_{16}N_2$ and $Fe_8N$ crystals have substantially similar crystalline structure, the material can be naturally crystallographically coherent, meaning having an aligned easy axis, which produces anisotropy. This may facilitate exchange coupling through phase boundaries between $Fe_{16}N_2$ and $Fe_8N$.

Together, the steps of forming the textured iron workpiece (e.g., textured iron sheet) (52), implanting N+ ions using ion implantation (12) and annealing (16) in FIG. 9 may constitute forming an iron nitride material including $Fe_{16}N_2$ phase domains (32), shown in FIG. 7. The technique of FIG. 9 also may include introducing additional iron or nonmagnetic materials between workpieces (e.g., sheets) of iron nitride (54), which is an example of introducing additional iron or nonmagnetic materials (34), described with reference to FIG. 7. Example nonmagnetic elements (e.g., atoms) or compounds (e.g., molecules that can be used include Al, Cu, Ti, Mn, Zr, Ta, B, C, Ni, Ru, $SiO_2$, $Al_2O_3$, or combinations thereof.

The iron or nonmagnetic materials may be introduced as workpieces of material or powders, and may be introduced between workpieces of textured iron nitride including the $Fe_{16}N_2$ phase domains. The workpieces of material or Fe or nonmagnetic powders may have sizes (e.g., thicknesses or diameters) ranging from several nanometers to several hundred nanometers, and may function as domain wall pinning sites after sintering process. Those domain wall pinning sites may enhance the coercivity of the permanent magnet.

The technique of FIG. 9 also may include sintering the workpieces (e.g., sheets) to form a bulk magnetic material (36). As described with respect to FIGS. 7, 8A, and 8B, the sintering pressure, temperature and duration may be selected to mechanically join the workpieces while maintaining the crystal structure of the textured iron nitride workpieces, (e.g., as including the $Fe_{16}N_2$ phase domains). Thus, in some examples, the sintering step may be performed at a relatively low temperature. For example, the sintering temperature may be below about 250° C., such as between about 120° C. and about 250° C., between about 150° C. and about 250° C., between about 120° C. and about 200° C., between about 150° C. and about 200° C., or about 150° C. The sintering pressure may be between, for example, about 0.2 GPa and about 10 GPa. The sintering time may be at least about 5 hours, such as at least about 20 hours, or between about 5 hours and about 100 hours, or between about 20 hours and about 100 hours, or about 40 hours. The sintering time, temperature, and pressure may be affected by the materials in workpieces 44a, 44b that include iron or nonmagnetic materials.

After sintering together the textured iron nitride workpieces with the iron or nonmagnetic materials, a bulk magnetic material (e.g., a bulk permanent magnet) may be formed. The bulk magnetic material may include both exchange spring coupling between $Fe_8N$ and $Fe_{16}N_2$ and domain wall pinning sites provided by the iron or nonmagnetic materials. In this way, the bulk magnetic material may possess a desirably high energy product, which may approach that of pure $Fe_{16}N_2$ (about 134 MGOe).

Figure 12:
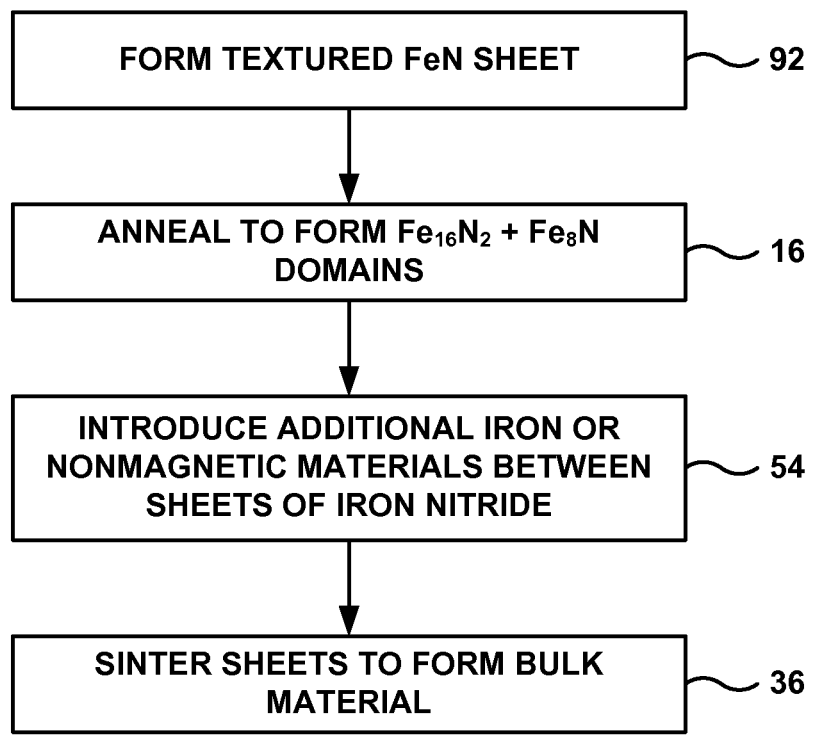
FIG. 12 is a flow diagram illustrating an example technique for forming a bulk material including $Fe_{16}N_2$ magnetically hard domains exchange-spring coupled with $Fe_8N$ magnetically soft domains, with domain wall pinning sites.

FIG. 12 is a flow diagram illustrating an example technique for forming a bulk material including $Fe_{16}N_2$ magnetically hard domains exchange-spring coupled with $Fe_8N$ magnetically soft domains, with domain wall pinning sites. The technique of FIG. 12 includes forming a textured iron nitride workpiece (e.g., a textured iron nitride sheet) (92). The textured iron nitride workpiece may be formed using, for example, belt casting. FIG. 13 is a conceptual diagram illustrating one example apparatus 100 for fast belt casting to texture an example iron nitride workpiece.

Fast belt casting apparatus 10 may include an ingot chamber 66 which contains molten iron ingot 62, and is heated by heating source 64, e.g., in the form of a heating coil. In some examples, the temperature of molten iron ingot 62 within ingot chamber 66 may be greater than about 1800 Kelvin (K; about 1526.85° C.). The pressure of the iron ingot 62 within ingot chamber 66 may be between about 0.06 MPa and about 0.12 MPa.

Ingot chamber 66 also includes a nitrogen inlet 102, through which a nitrogen source is introduced into molten iron ingot 62 to form a molten iron nitride mixture 104. Nitrogen may be provided through nitrogen inlet 102 in a variety of forms or from a variety of sources. For example, nitrogen may be provided in the form of ammonia, ammonium azide, or urea, which may be introduced through nitrogen inlet 102, and then break down to release nitrogen atoms upon mixing with molten iron in molten iron nitride mixture 104.

In some examples, the nitrogen source may be provided to result in an approximately stoichiometric number of nitrogen atoms within the iron nitride mixture 104. The stoichiometric ratio of iron to nitrogen in $Fe_{16}N_2$ is 8:1. Thus, the approximate number of iron atoms in iron nitride mixture 104 may be determined, and a number of nitrogen atoms equal to approximately 1/8 (12.5%) of the iron atoms may be provided through nitrogen inlet 102 to the iron nitride mixture 104, such as between about 8 at. % and about 15 at. %.

Molten iron nitride mixture 104 flows out of ingot chamber 66 through nozzle head 68 to form iron nitride strip 106. Iron nitride strip 106 is fed into the gap zone between the surfaces of first pinch roller 72a and second pinch roller 72b (collectively, "pinch rollers 72"), which are rotated in opposite directions. In some examples, the distance from nozzle head 68 to the surfaces of pinch rollers 72 may be between about 1 mm and about 50 mm, such as about 4 mm.

In some examples, the rotation speed of first pinch roller 72a and second pinch roller 72b may vary from approximately 10 rotations per minute (rpm) to 1000 rpm, and the rotation speed of the rollers 72 may be approximately the same. In some examples, pinch rollers 72 are actively cooled, e.g., using water cooling, which maintains the surfaces of rollers 72 at a temperature below the temperature of iron nitride strip 106 and aids in cooling and casting iron nitride strip 106. For example, the temperatures of pinch rollers 72 may be maintained between about 300 K (about 26.85° C.) and about 400 K (about 126.85° C.). The pressure exerted on the iron nitride strip 106 by pinch rollers 72 may be between about 0.04 MPa and about 0.1 MPa.

After iron nitride strip 106 is pressed between pinch rollers 72 and cooled, iron nitride strip 106 forms textured iron nitride sheets 108a and 108b. In some examples, textured iron nitride sheets 108a and 108b (collectively, "textured iron nitride sheets 108") may form textured iron nitride ribbon with at least one dimension (e.g., a thickness) between about 1 μm and about 10 mm, such as between about 5 μm and about 1 cm (either individually or after compression of multiple textured iron nitride sheets 108). Each of textured iron nitride sheets 108 may include, for example, a (100) or (110) crystal texture. In other words, a major surface of each of textured iron nitride sheets 108 may be parallel to the (100) or (110) surfaces of all or substantially all of the iron crystals within the respective one of textured iron nitride sheets 108. By using a textured iron nitride sheet 108a or 108b in which all or substantially all of the iron crystals have substantially aligned crystal axes in the subsequent processing steps, anisotropy formed when forming the $Fe_8N$ and $Fe_{16}N_2$ phase domains may be substantially aligned among the crystals.

After forming textured iron nitride sheets 108 (92), the textured iron nitride sheets 108 may be annealed to form $Fe_{16}N_2$ phase domains and $Fe_8N$ phase domains (16). This step may be similar to or substantially the same as described with respect to FIGS. 1 and 9. For example, the post-annealing step may be carried out at a temperature below about 250° C., such as between about 120° C. and about 214° C., between about 120° C. and about 200° C., between about 150° C. and about 200° C., or at about 150° C. The post-annealing step may be performed in a nitrogen ($N_2$) or argon (Ar) atmosphere, or in a vacuum or near-vacuum. The duration of the post-annealing step may be at least about 5 hours, such as at least about 20 hours, or between about 5 hours and about 100 hours, or between about 20 hours and about 100 hours, or about 40 hours.

The temperature and duration of the post-annealing step may be selected based on, for example, a size of the textured iron nitride workpiece (e.g., textured iron nitride sheet), a diffusion coefficient of nitrogen atoms in iron at the post-annealing temperature, and a desired volume fraction of $Fe_{16}N_2$ phase domains in the textured iron nitride workpiece. Based on these factors, the temperature and duration may be selected to provide sufficient time for nitrogen atoms to diffuse to locations within the textured iron nitride workpiece to form $Fe_{16}N_2$ domains.

During the post-annealing step, the textured iron nitride workpiece may be subjected to a strain to facilitate transformation of at least some of the bcc iron crystals into a bct crystal structure. A strain inducing apparatus may strain the textured iron nitride workpiece to a certain elongation. For example, the strain on the textured iron nitride workpiece may be between about 0.1% and about 7%. In other examples, the strain on the textured iron nitride workpiece may be less than about 0.1% or greater than about 7%. In some examples, exerting a certain strain on the textured iron nitride workpiece may result in a substantially similar strain on individual unit cells of the iron crystals, such that the unit cell is elongated along the <001> axis between about 0.1% and about 7%.

Together, the steps of forming the textured iron nitride workpiece (e.g., sheet) (92) and annealing the textured iron nitride workpiece (16) in FIG. 12 may constitute forming an iron nitride material including $Fe_{16}N_2$ phase domains (32), shown in FIG. 7. The technique of FIG. 12 also may include introducing additional iron or nonmagnetic materials between workpieces (e.g., sheets) of iron nitride (54), which is an example of introducing additional iron or nonmagnetic materials (34), described with reference to FIG. 7. Example nonmagnetic elements (e.g., atoms) or compounds (e.g., molecules) that can be used include Al, Cu, Ti, Mn, Zr, Ta, B, C, Ni, Ru, $SiO_2$, $Al_2O_3$, or combinations thereof.

The iron or nonmagnetic materials may be introduced as workpieces of material or powders, and may be introduced between workpieces of texture iron nitride including the $Fe_{16}N_2$ phase domains. The workpieces or material or Fe or nonmagnetic powders may have sizes (e.g., thicknesses or diameters) ranging from several nanometers to several hundred nanometers, and may function as domain wall pinning sites after sintering process. Those domain wall pinning sites may enhance the coercivity of the permanent magnet.

The technique of FIG. 12 also may include sintering the workpieces (e.g., sheets) to form a bulk magnetic material (36). As described with respect to FIGS. 7, 8A, and 8B, the sintering pressure, temperature and duration may be selected to mechanically join the workpieces while maintaining the crystal structure of the textured iron nitride workpieces, (e.g., as including the $Fe_{16}N_2$ phase domains). Thus, in some examples, the sintering step may be performed at a relatively low temperature. For example, the sintering temperature may be below about 250° C., such as between about 120° C. and about 250° C., between about 150° C. and about 250° C., between about 120° C. and about 200° C., between about 150° C. and about 200° C., or about 150° C. The sintering pressure may be between, for example, about 0.2 GPa and about 10 GPa. The sintering time may be at least about 5 hours, such as at least about 20 hours, or between about 5 hours and about 100 hours, or between about 20 hours and about 100 hours, or about 40 hours. The sintering time, temperature, and pressure may be affected by the materials in workpieces 44a, 44b that include iron or nonmagnetic materials.

After sintering together the textured iron nitride workpieces with the iron or nonmagnetic materials, a bulk magnetic material (e.g., a bulk permanent magnet) may be formed. The bulk magnetic material may include both exchange spring coupling between $Fe_8N$ and $Fe_{16}N_2$ and domain wall pinning sites provided by the iron or nonmagnetic materials. In this way, the bulk magnetic material may possess a desirably high energy product, which may approach that of pure $Fe_{16}N_2$ (about 134 MGOe).

Figure 14:
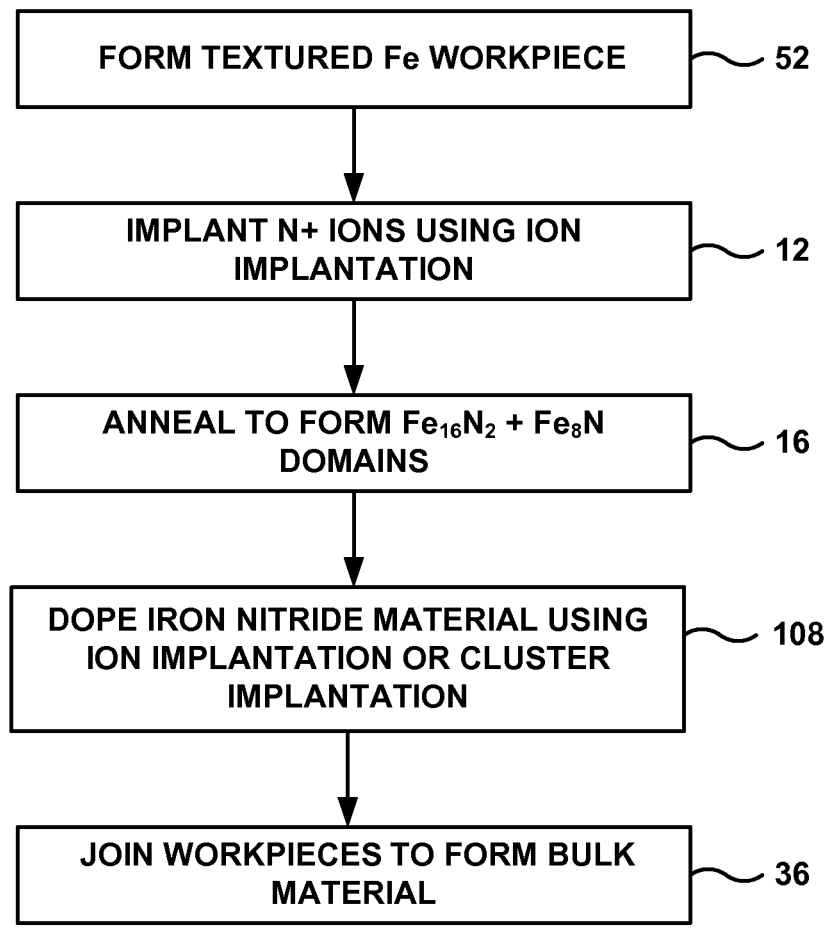
FIG. 14 is a flow diagram illustrating an example technique for forming a bulk material including $Fe_{16}N_2$ magnetically hard domains exchange-spring coupled with $Fe_8N$ magnetically soft domains, with domain wall pinning sites.

FIG. 14 is a flow diagram illustrating an example technique for forming a bulk material including $Fe_{16}N_2$ magnetically hard domains exchange-spring coupled with $Fe_8N$ magnetically soft domains, with domain wall pinning sites. The technique of FIG. 14 is similar to the technique described with respect to FIG. 9; however, instead of introducing additional iron or nonmagnetic materials between workpieces (e.g., sheets) of iron nitride (54), the technique of FIG. 14 includes doping the textured iron nitride workpieces including $Fe_{16}N_2$ phase domains using ion implantation or cluster implantation (108). Hence, the technique of FIG. 14 may include forming a textured iron workpiece (52), e.g., using belt casting. The technique of FIG. 14 also may include implanting N+ ions in the textured iron workpiece using ion implantation (12) to form a textured iron nitride workpiece and annealing the textured iron nitride workpiece to form $Fe_{16}N_2$ phase domains (16).

The technique of FIG. 14 then includes doping the textured iron nitride workpieces including $Fe_{16}N_2$ phase domains using ion implantation or cluster implantation (108). Example nonmagnetic elements (e.g., atoms) or compounds (e.g., molecules) that can be used to dope the textured iron nitride workpieces include Al, Cu, Ti, Mn, Zr, Ta, B, C, Ni, Ru, $SiO_2$, $Al_2O_3$, or combinations thereof. By implanting these elements or compounds within the textured iron nitride workpieces, the domain wall pinning effect may be increased compared to the examples in which particles or workpieces of these materials are interleaved with the textured iron nitride workpieces before sintering the workpieces together. Increase domain wall pinning effects may improve magnetic properties of the final bulk magnetic material, including the coercivity of the bulk magnetic material.

The technique of FIG. 14 also includes sintering the doped, textured iron nitride workpieces to form the bulk magnetic material (36). As described with respect to FIGS. 7, 8A, and 8B, the sintering pressure, temperature and duration may be selected to mechanically join the workpieces while maintaining the crystal structure of the textured iron nitride workpieces, (e.g., as including the $Fe_{16}N_2$ phase domains). Thus, in some examples, the sintering step may be performed at a relatively low temperature. For example, the sintering temperature may be below about 250° C., such as between about 120° C. and about 250° C., between about 150° C. and about 250° C., between about 120° C. and about 200° C., between about 150° C. and about 200° C., or about 150° C. The sintering pressure may be between, for example, about 0.2 GPa and about 10 GPa. The sintering time may be at least about 5 hours, such as at least about 20 hours, or between about 5 hours and about 100 hours, or between about 20 hours and about 100 hours, or about 40 hours. The sintering time, temperature, and pressure may be affected by the materials in workpieces 44a, 44b that include iron or nonmagnetic materials.

After sintering together the textured iron nitride workpieces with the iron or nonmagnetic materials, a bulk magnetic material (e.g., a bulk permanent magnet) may be formed. The bulk magnetic material may include both exchange spring coupling between $Fe_8N$ and $Fe_{16}N_2$ and domain wall pinning sites provided by the iron or nonmagnetic materials. In this way, the bulk magnetic material may possess a desirably high energy product, which may approach that of pure $Fe_{16}N_2$ (about 134 MGOe).

Figure 15:
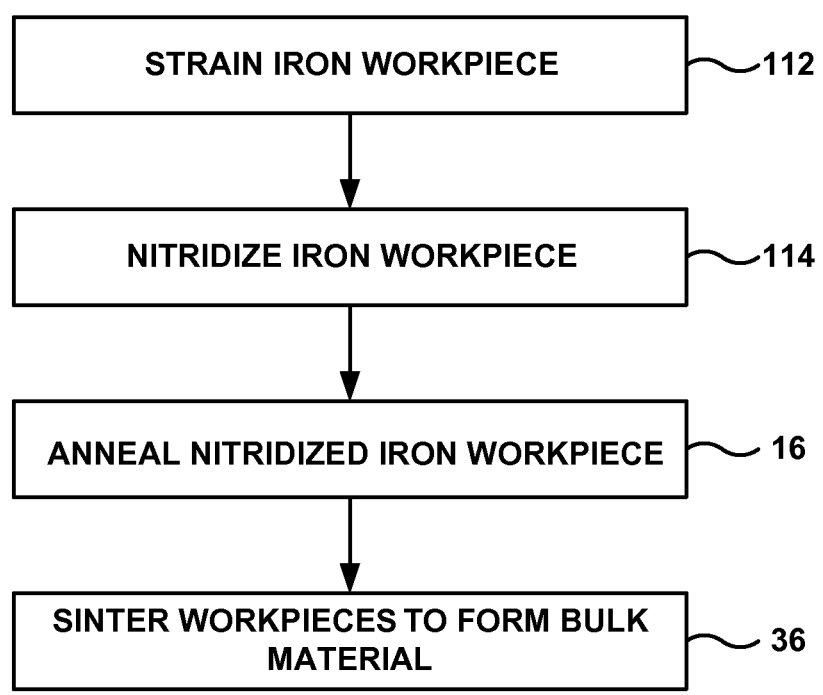
FIG. 15 is a flow diagram illustrating an example technique for forming a bulk material including $Fe_{16}N_2$ magnetically hard domains exchange-spring coupled with $Fe_8N$ magnetically soft domains, with domain wall pinning sites.
Figure 16:
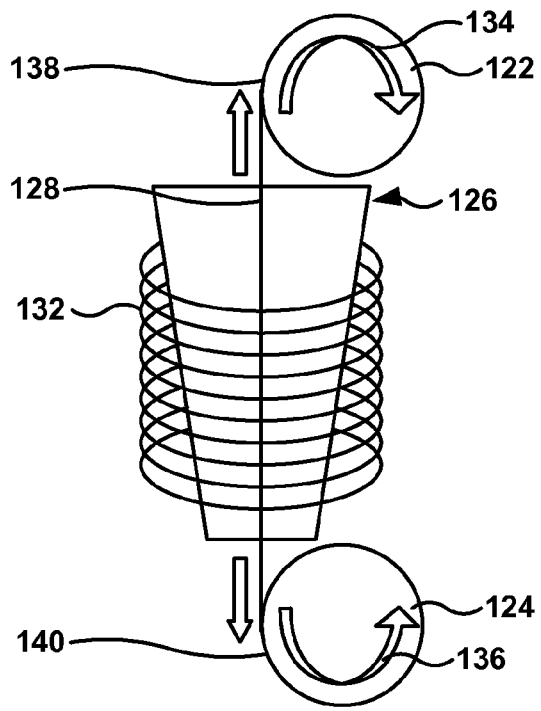
FIG. 16 is a conceptual diagram illustrating an example apparatus with which an iron workpiece can be strained and exposed to nitrogen.
Figure 17:
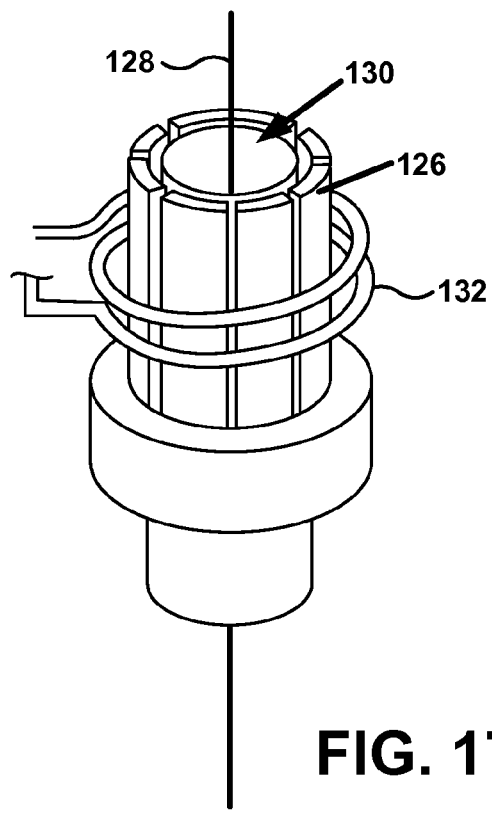
FIG. 17 illustrates further detail of one example of the Crucible heating stage shown in FIG. 16.

FIG. 15 is a flow diagram illustrating an example technique for forming a bulk material including $Fe_{16}N_2$ magnetically hard domains exchange-spring coupled with $Fe_8N$ magnetically soft domains, with domain wall pinning sites. The technique of FIG. 15 will be described with concurrent reference to FIGS. 16 and 17. FIG. 16 illustrates a conceptual diagram of an apparatus with which the iron workpiece can be strained and exposed to nitrogen. FIG. 17 illustrates further detail of one example of the cold crucible heating stage shown in FIG. 16.

The example apparatus of FIG. 16 includes a first roller 122, a second roller 124, and a crucible heating stage 126. First roller 122 and second roller 124 are configured to receive a first end 138 and a second end 140, respectively, of an iron workpiece 128. Iron workpiece 128 defines a major axis between first end 138 and second end 140. As best seen in FIG. 17, iron workpiece 128 passes through an aperture 130 defined by crucible heating stage 126. Crucible heating stage 126 includes an inductor 132 that surrounds at least a portion of the aperture 130 defined by crucible heating stage 126.

The example technique of FIG. 15 includes straining iron workpiece 128 along a direction substantially parallel (e.g., parallel or nearly parallel) to a <001> axis of at least one iron crystal in the iron workpiece 128 (112). In some examples, iron workpiece 128 is formed of iron having a body centered cubic (bcc) crystal structure.

In some examples, iron workpiece 128 is formed of a single bcc crystal structure. In other examples, iron workpiece 128 may be formed of a plurality of bcc iron crystals. In some of these examples, the plurality of iron crystals are oriented such that at least some, e.g., a majority or substantially all, of the <001> axes of individual unit cells and/or crystals are substantially parallel to the direction in which strain is applied to iron workpiece 128. For example, when the iron is formed as iron workpiece 128, at least some of the <001> axes may be substantially parallel to the major axis of the iron workpiece 128, as shown in FIGS. 16 and 17. As noted above, in some examples, single crystal iron nitride workpieces may be formed using crucible techniques. In addition to such crucible techniques, single crystal iron workpieces may be formed by either the micro melt zone floating or pulling from a micro shaper to form iron workpiece 128.

In some examples, iron workpiece 128 may have a crystalline textured structure. Techniques that may be used to form crystalline textured (e.g., with desired crystalline orientation along the certain direction of workpieces) iron workpiece 128 include fast belt casting as described with reference to FIGS. 9 and 10.

The stain may be exerted on iron workpiece 128 using a variety of strain inducing apparatuses. For example, as shown in FIG. 16, first end 138 and second end 140 of iron workpiece 128 may be received by (e.g., wound around) first roller 122 and second roller 124, respectively, and rollers 122, 124 may be rotated in opposite directions (indicated by arrows 134 and 135 in FIG. 16) to exert a tensile force on the iron workpiece 128. In other examples, opposite ends of iron workpiece 128 may be gripped in mechanical grips, e.g., clamps, and the mechanical grips may be moved away from each other to exert a tensile force on the iron workpiece 128, as described above with reference to FIG. 11.

A strain inducing apparatus may strain iron workpiece 128 to a certain elongation. For example, the strain on iron workpiece 128 may be between about 0.1% and about 7%. In other examples, the strain on iron workpiece 128 may be less than about 0.1% or greater than about 7%. In some examples, exerting a certain strain on iron workpiece 128 may result in a substantially similar strain on individual unit cells of the iron, such that the unit cell is elongated along the <001> axis between about 0.1% and about 7%.

A dimension of the iron workpiece, such as, for example, a diameter of the iron wire or cross-sectional area of the iron sheet (in a plane substantially orthogonal to the direction in which the iron sheet is stretched/strained) may affect an amount of force that must be applied to iron workpiece 128 to result in a given strain. For example, the application of approximately 144 N of force to an iron wire with a diameter of about 0.1 mm may result in about a 7% strain. As another example, the application of approximately 576 N of force to an iron wire with a diameter of about 0.2 mm may result in about a 7% strain. As another example, the application of approximately 1296 N of force to an iron wire with a diameter of about 0.3 mm may result in about a 7% strain. As another example, the application of approximately 2304 N of force to an iron wire with a diameter of about 0.4 mm may result in about a 7% strain. As another example, the application of approximately 3600 N of force to an iron wire with a diameter of about 0.5 mm may result in about a 7% strain.

In some examples, iron workpiece 128 may include dopant elements which serve to stabilize the $Fe_{16}N_2$ phase constitution once the $F_{e16}N_2$ phase constitution has been formed. For example, the phase stabilization dopant elements may include cobalt (Co), titanium (Ti), copper (Cu), zinc (Zn), or the like.

As the strain inducing apparatus exerts the strain on iron workpiece 128 and/or once the strain inducing apparatus is exerting a substantially constant strain on the iron workpiece 128, iron workpiece 128 may be nitridized (114). In some examples, during the nitridizing process, iron workpiece 128 may be heated using a heating apparatus. One example of a heating apparatus that can be used to heat iron workpiece 128 is crucible heating stage 126, shown in FIGS. 16 and 17.

Crucible heating stage 126 defines aperture 130 through which iron workpiece 128 passes (e.g., in which a portion of iron workpiece 128 is disposed). In some examples, no portion of crucible heating stage 126 contacts iron workpiece 128 during the heating of iron workpiece 128. In some implementations, this is advantageous as it lower a risk of unwanted elements or chemical species contacting and diffusing into iron workpiece 128. Unwanted elements or chemical species may affect properties of iron workpiece 128; thus, it may be desirable to reduce or limit contact between iron workpiece 128 and other materials.

Crucible heating stage 126 also includes an inductor 132 that surrounds at least a portion of aperture 130 defined by crucible heating stage 126. Inductor 132 includes an electrically conductive material, such as aluminum, silver, or copper, through which an electric current may be passed. The electric current may by an alternating current (AC), which may induce eddy currents in iron workpiece 128 and heat the iron workpiece 128. In other examples, instead of using crucible heating stage 126 to heat iron workpiece 128, other non-contact heating sources may be used. For example, a radiation heat source, such as an infrared heat lamp, may be used to heat iron workpiece 128. As another example, a plasma arc lamp may be used to heat iron workpiece 128.

Regardless of the heating apparatus used to heat iron workpiece 128 during the nitridizing process, the heating apparatus may heat iron workpiece 128 to temperature for a time sufficient to allow diffusion of nitrogen to a predetermined concentration substantially throughout the thickness, diameter, or internal volume of iron workpiece 128. In this manner, the heating time and temperature are related, and may also be affected by the composition and/or geometry of iron workpiece 128. For example, iron workpiece 128 may be heated to a temperature between about 125° C. and about 700° C. for between about 2 hours and about 9 hours. In some examples, iron workpiece 128 may be heated to a temperature between about 500° C. and about 660° C. for between about 2 hours and about 4 hours.

In some examples, iron workpiece 128 includes an iron wire with a diameter of about 0.1 mm. In some of these examples, iron workpiece 128 may be heated to a temperature of about 125° C. for about 8.85 hours or a temperature of about 600° C. for about 2.4 hours, or a temperature of about 660° C. for about 4 hours. In general, at a given temperature, the nitridizing process time may be inversely proportional to a characteristic dimension squared of iron workpiece 128, such as a diameter of an iron wire or a thickness of an iron sheet.

In addition to heating iron workpiece 128, nitridizing iron workpiece 128 (114) includes exposing iron workpiece 128 to an atomic nitrogen substance, which diffuses into iron workpiece 128. In some examples, the atomic nitrogen substance may be supplied as diatomic nitrogen ($N_2$), which is then separated (cracked) into individual nitrogen atoms. In other examples, the atomic nitrogen may be provided from another atomic nitrogen precursor, such as ammonia ($NH_3$). In other examples, the atomic nitrogen may be provided from urea ($CO(NH_2)_2$) or ammonium azide (($NH_4)N_3$).

The nitrogen may be supplied in a gas phase alone (e.g., substantially pure ammonia, ammonium azide, or urea, or diatomic nitrogen gas) or as a mixture with a carrier gas. In some examples, the carrier gas is argon (Ar). The gas or gas mixture may be provided at any suitable pressure, such as between about 0.001 Torr (about 0.133 pascals (Pa)) and about 10 Torr (about 1333 Pa), such as between about 0.01 Torr (about 1.33 Pa) and about 0.1 Torr (about 13.33 Torr). In some examples, when the nitrogen is delivered as part of a mixture with a carrier gas, the partial pressure of nitrogen or the nitrogen precursor (e.g., $NH_3$) may be between about 0.02 and about 0.1.

The nitrogen precursor (e.g., $N_2$ or $NH_3$) may be cracked to form atomic nitrogen substances using a variety of techniques. For example, the nitrogen precursor may be heated using radiation to crack the nitrogen precursor to form atomic nitrogen substances and/or promote reaction between the nitrogen precursor and iron workpiece 128. As another example, a plasma arc lamp may be used to split the nitrogen precursor to form atomic nitrogen substances and/or promote reaction between the nitrogen precursor and iron workpiece 28.

In some examples, iron workpiece 128 may be nitridized (114) via a urea diffusion process, in which urea is utilized as a nitrogen source (e.g., rather than diatomic nitrogen or ammonia). Urea (also referred to as carbamide) is an organic compound with the chemical formula $CO(NH_2)_2$ that may be used in some cases as a nitrogen release fertilizer. To nitridize iron workpiece 128 (114), urea may heated, e.g., within a furnace with iron workpiece 128, to generate decomposed nitrogen atoms which may diffuse into iron workpiece 128. As will be described further below, the constitution of the resulting nitridized iron material may be controlled to some extent by the temperature of the diffusion process as well as the ratio (e.g., the weight ratio) of iron to urea used for the process. In other examples, iron workpiece 128 may be nitridized by an implantation process similar to that used in semiconductor processes for introducing doping agents.

Figure 18:
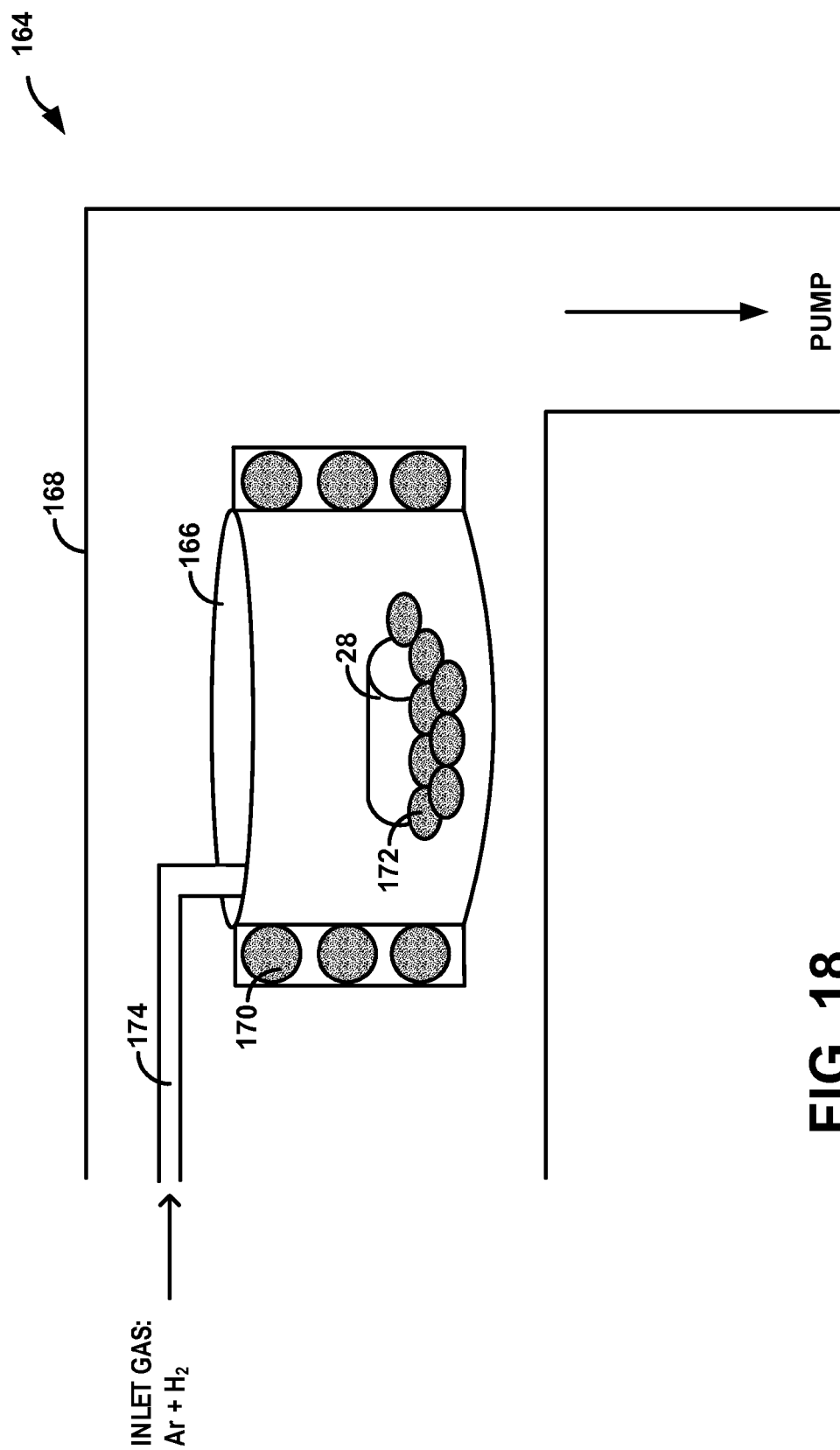
FIG. 18 is a schematic diagram illustrating an example apparatus that may be used for nitridizing an iron workpiece via a urea diffusion process.

FIG. 18 is a schematic diagram illustrating an example apparatus 164 that may be used for nitridizing iron workpiece 128 via a urea diffusion process. Such a urea diffusion process may be used to nitridizing iron workpiece 128, e.g., when having a single crystal iron, a plurality of crystal structure, or textured structure. Moreover, iron materials with different shapes, such as wire, sheet or bulk, can also be diffused using such a process. For wire material, the wire diameter may be varied, e.g., from several micrometers to millimeters. For sheet material, the sheet thickness may be from, e.g., several nanometers to millimeters. For bulk material, the material weight may be from, e.g., about 1 milligram to kilograms.

As shown, apparatus 164 includes crucible 166 within vacuum furnace 168. Iron workpiece 128 is located within crucible 166 along with the nitrogen source of urea 172. As shown in FIG. 18, a carrier gas including Ar and hydrogen is fed into crucible 166 during the urea diffusion process. In other examples, a different carrier gas or even no carrier gas may be used. In some examples, the gas flow rate within vacuum furnace 168 during the urea diffusion process may be between approximately 5 standard cubic centimeters per minute (sccm) to approximately 50 sccm, such as, e.g., 20 sccm to approximately 50 sccm or 5 sccm to approximately 20 sccm.

Heating coils 170 may heat iron workpiece 128 and urea 172 during the urea diffusion process using any suitable technique, such as, e.g., eddy current, inductive current, radio frequency, and the like. Crucible 166 may be configured to withstand the temperature used during the urea diffusion process. In some examples, crucible 166 may be able to withstand temperatures up to approximately 1600° C.

Urea 172 may be heated with iron workpiece 128 to generate nitrogen that may diffuse into iron workpiece 128 to form an iron nitride material. In some examples, urea 172 and iron workpiece 128 may heated to approximately 650° C. or greater within crucible 166 followed by cooling to quench the iron and nitrogen mixture to form an iron nitride material having a $Fe_{16}N_2$ phase constitution substantially throughout the thickness, diameter, or volume of iron workpiece 128. In some examples, urea 172 and iron workpiece 128 may heated to approximately 650° C. or greater within crucible 166 for between approximately 5 minutes to approximately 1 hour. In some examples, urea 172 and iron workpiece 128 may be heated to between approximately 1000° C. to approximately 1500° C. for several minutes to approximately an hour. The time of heating may depend on nitrogen thermal coefficient in different temperature. For example, if the iron workpiece defines a thickness is about 1 micrometer, the diffusion process may be finished in about 5 minutes at about 1200° C., about 12 minutes at 1100° C., and so forth.

To cool the heated material during the quenching process, cold water may be circulated outside the crucible to rapidly cool the contents. In some examples, the temperature may be decreased from 650° C. to room temperature in about 20 seconds.

As will be described below, in some examples, the temperature of urea 172 and iron workpiece 128 may be between, e.g., approximately 120° C. and approximately 250° C. to anneal the iron and nitrogen mixture to form an iron nitride material having a $Fe_{16}N_2$ phase constitution substantially throughout the thickness, diameter, or volume of iron workpiece 128. Urea 172 and iron workpiece 128 may be at the annealing temperature, e.g., for at least about 1 hour. Such an annealing process could be used in addition to or as an alternative to other nitrogen diffusion techniques, e.g., when the iron material is single crystal iron workpiece, or textured iron workpiece with at least one dimension in the micrometer level. In each of annealing and quenching, nitrogen may diffuse into iron workpiece 128 from the nitrogen gas or gas mixture including Ar plus hydrogen carrier gas within furnace 68. In some examples, gas mixture may have a composition of approximately 86% Ar+4% $H_2$+10% $N_2$. In other examples, the gas mixture may have a composition of 10% $N_2$+90% Ar or 100% $N_2$ or 100% Ar.

As will be described further below, the constitution of the iron nitride material formed via the urea diffusion process may be dependent on the weight ratio of urea to iron used. As such, in some examples, the weight ratio of urea to iron may be selected to form an iron nitride material having a $Fe_{16}N_2$ phase constitution. However, such a urea diffusion process may be used to form iron nitride materials other than that having a $Fe_{16}N_2$ phase constitution, such as, e.g., $Fe_2N$, $Fe_3N$, $Fe_4N$, $Fe_8N$, and the like.

Regardless of the technique used to nitridize iron workpiece 128 (14), the nitrogen may be diffused into iron workpiece 128 to a concentration of between about 8 atomic percent (at. %) and about 14 at. %, such as about 11 at. %. The concentration of nitrogen in iron may be an average concentration, and may vary throughout the volume of iron workpiece 128. In some examples, the resulting phase constitution of at least a portion of the nitridized iron workpiece 128 (after nidtridizing iron workpiece 128 (114)) may be α' phase $Fe_8N$. The $Fe_8N$ phase constitution is the chemically disordered counterpart of chemically-ordered $Fe_{16}N_2$ phase. A $Fe_8N$ phase constitution is also has a bct crystal structure, and can introduce a relatively high magnetocrystalline anisotropy.

In some examples, once iron workpiece 128 has been nitridized (114), and while still being strained (112), iron workpiece 128 may be annealed at a temperature for a time to facilitate diffusion of the nitrogen atoms into appropriate interstitial spaces within the iron lattice to form $Fe_{16}N_2$ (16). The annealing process used in FIG. 15 may be similar to or substantially the same as that described with respect to FIGS. 1, 9, 12, and 14. For example, the post-annealing step may be carried out at a temperature below about 250° C., such as between about 120° C. and about 214° C., between about 120° C. and about 200° C., between about 150° C. and about 200° C., or at about 150° C. The post-annealing step may be performed in a nitrogen ($N_2$) or argon (Ar) atmosphere, or in a vacuum or near-vacuum. The duration of the post-annealing step may be at least about 5 hours, such as at least about 20 hours, or between about 5 hours and about 100 hours, or between about 20 hours and about 100 hours, or about 40 hours.

The temperature and duration of the post-annealing step may be selected based on, for example, a size of the textured iron nitride workpiece, a diffusion coefficient of nitrogen atoms in iron at the post-annealing temperature, and a desired volume fraction of $Fe_{16}N_2$ phase domains in the textured iron nitride workpiece. Based on these factors, the temperature and duration may be selected to provide sufficient time for nitrogen atoms to diffuse to locations within the textured iron nitride workpiece to form $Fe_{16}N_2$ domains.

Once the annealing process has been completed, iron workpiece 128 may be cooled under vacuum or an inert atmosphere, such as argon, to reduce or prevent oxidation.

Although not illustrated in FIG. 15, in some examples, the technique may include introducing additional iron or nonmagnetic materials between multiple iron workpieces 128 (54) (FIGS. 9 and 12) or doping the iron workpiece 128 using ion implantation or cluster implantation (108) (FIG. 14).

In some examples, iron workpiece 128 may not be a sufficient size for the desired application. In such examples, multiple iron workpieces 128 may be formed (each including or consisting essentially of a $Fe_{16}N_2$ phase constitution) and the multiple iron workpieces 128 may be sintered together to form a larger permanent magnet that includes a $Fe_{16}N_2$ phase constitution (36). As described with respect to FIGS. 7, 8A, and 8B, the sintering pressure, temperature and duration may be selected to mechanically join the workpieces while maintaining the crystal structure of the textured iron nitride workpieces, (e.g., as including the $Fe_{16}N_2$ phase domains). Thus, in some examples, the sintering step may be performed at a relatively low temperature. For example, the sintering temperature may be below about 250° C., such as between about 120° C. and about 250° C., between about 150° C. and about 250° C., between about 120° C. and about 200° C., between about 150° C. and about 200° C., or about 150° C. The sintering pressure may be between, for example, about 0.2 GPa and about 10 GPa. The sintering time may be at least about 5 hours, such as at least about 20 hours, or between about 5 hours and about 100 hours, or between about 20 hours and about 100 hours, or about 40 hours. The sintering time, temperature, and pressure may be affected by the materials in the workpieces or powder that include iron or nonmagnetic materials.

After sintering together the textured iron nitride workpieces with the iron or nonmagnetic materials, a bulk magnetic material (e.g., a bulk permanent magnet) may be formed. The bulk magnetic material may include both exchange spring coupling between $Fe_8N$ and $Fe_{16}N_2$ and domain wall pinning sites provided by the iron or nonmagnetic materials. In this way, the bulk magnetic material may possess a desirably high energy product, which may approach that of pure $Fe_{16}N_2$ (about 134 MGOe).

Clause 1: A bulk permanent magnetic material comprising between about 5 volume percent and about 40 volume percent $Fe_{16}N_2$ phase domains; a plurality of nonmagnetic elements or compounds forming domain wall pinning sites; and a balance soft magnetic material, wherein at least some of the soft magnetic material is magnetically coupled to the $Fe_{16}N_2$ phase domains via exchange spring coupling.

Clause 2: The bulk permanent magnetic material of clause 1, comprising between about 5 volume percent and about 20 volume percent $Fe_{16}N_2$ phase domains.

Clause 3: The bulk permanent magnetic material of clause 1, comprising between about 10 volume percent and about 15 volume percent $Fe_{16}N_2$ phase domains.

Clause 4: The bulk permanent magnetic material of any of clauses 1 to 3, wherein the $Fe_{16}N_2$ phase domains are distributed throughout a volume of the bulk permanent magnetic material.

Clause 5: The bulk permanent magnetic material of any of clauses 1 to 4, wherein the plurality of nonmagnetic elements of compounds comprises an element or compound selected from the group consisting of Al, Cu, Ti, Mn, Zr, Ta, B, C, Ni, Ru, $SiO_2$, $Al_2O_3$, or combinations thereof.

Clause 6: The bulk permanent magnetic material of any of clauses 1 to 5, wherein the soft magnetic material is selected from the group consisting of $Fe_8N$, $Fe_4N$, Fe, FeCo, and combinations thereof.

Clause 7: The bulk permanent magnetic material of any of clauses 1 to 5, wherein the soft magnetic material comprises $Fe_8N$.

Clause 8: The bulk permanent magnetic material of any of clauses 1 to 7, wherein the bulk permanent magnetic comprises a plurality of sintered workpieces of iron nitride, each workpiece of iron nitride including between about 5 volume percent and about 40 volume percent $Fe_{16}N_2$ phase domains.

Clause 9: The bulk permanent magnetic material of any of clauses 1 to 8, wherein a smallest dimension of the bulk permanent magnetic material is greater than about 100 nanometers.

Clause 10: The bulk permanent magnetic material of clause 9, wherein the smallest dimension is greater than about 1 micrometer.

Clause 11: The bulk permanent magnetic material of clause 10, wherein the smallest dimension is greater than about 100 micrometers.

Clause 12: The bulk permanent magnetic material of any of clauses 1 to 11, wherein the magnetic material has an energy product of greater than about 10 MGOe.

Clause 13: The bulk permanent magnetic material of clause 12, wherein the magnetic material has an energy product of greater than about 30 MGOe.

Clause 14: The bulk permanent magnetic material of clause 13, wherein the magnetic material has an energy product of greater than about 60 MGOe.

Clause 15: The bulk permanent magnetic material of clause 14, wherein the magnetic material has an energy product of greater than about 100 MGOe.

Clause 16: The bulk permanent magnetic material of clause 12, wherein the magnetic material has an energy product of between about 60 MGOe and about 135 MGOe.

Clause 17: The bulk permanent magnetic material of any of clauses 1 to 16, wherein the material is naturally crystallographically coherent.

Clause 18: A method comprising implanting N+ ions in an iron workpiece using ion implantation to form an iron nitride workpiece; pre-annealing the iron nitride workpiece to attach the iron nitride workpiece to a substrate; and post-annealing the iron nitride workpiece to form $Fe_{16}N_2$ phase domains within the iron nitride workpiece.

Clause 19: The method of clause 18, wherein implanting N+ ions in the iron workpiece using ion implantation to form the iron nitride workpiece comprises accelerating N+ ions to an energy of less than about 180 kiloelectron volts.

Clause 20: The method of clause 19, wherein accelerating N+ ions to the energy of less than about 180 kiloelectronvolts comprises accelerating N+ ions to the energy of about 100 kiloelectronvolts.

Clause 21: The method of any of clauses 18 to 20, wherein implanting N+ ions in the iron workpiece using ion implantation to form the iron nitride workpiece comprises providing N+ ions at a fluence of between about $2\times10^{16}/cm^2$ and about $1\times10^{17}/cm^2$.

Clause 22: The method of any of clauses 18 to 20, wherein implanting N+ ions in the iron workpiece using ion implantation to form the iron nitride workpiece comprises providing N+ ions at a fluence of about $8\times10^{16}/cm^2$.

Clause 23: The method of any of clauses 18 to 22, wherein implanting N+ ions in the iron workpiece using ion implantation to form the iron nitride workpiece comprises providing sufficient N+ ions to form an average concentration of nitrogen in the iron workpiece between about 8 atomic percent and about 15 atomic percent.

Clause 24: The method of any of clauses 18 to 22, wherein implanting N+ ions in the iron workpiece using ion implantation to form the iron nitride workpiece comprises providing sufficient N+ ions to form an average concentration of nitrogen in the iron workpiece of about 12.5 atomic percent.

Clause 25: The method of any of clauses 18 to 24, wherein the iron workpiece defines a thickness of between about 500 nanometers and about 1 millimeter prior to implanting N+ ions in the iron workpiece using ion implantation to form the iron nitride workpiece.

Clause 26: The method of clause 25, wherein the iron workpiece defines a thickness of about 500 nanometers prior to implanting N+ ions in the iron workpiece using ion implantation to form the iron nitride workpiece.

Clause 27: The method of any of clauses 18 to 26, wherein the iron workpiece comprises a plurality of iron crystals, and wherein a major surface of the iron workpiece is substantially parallel (110) surfaces of all or substantially all of the iron crystals.

Clause 28: The method of any of clauses 18 to 27, wherein the substrate comprises silicon or gallium arsenide.

Clause 29: The method of clause 28, wherein the substrate comprises a single crystal silicon substrate with a (111) major surface.

Clause 30: The method of clause 29, wherein pre-annealing the iron nitride workpiece to attach the iron nitride workpiece to the substrate comprises pre-annealing the iron nitride workpiece to attach the iron nitride workpiece to the (111) major surface of the single crystal silicon substrate.

Clause 31: The method of any of clauses 18 to 30, wherein pre-annealing the iron nitride workpiece to attach the iron nitride workpiece to the substrate comprises applying an external force between about 0.2 gigapascals and about 10 gigapascals between the iron workpiece and the substrate.

Clause 32: The method of any of clauses 18 to 31, wherein pre-annealing the iron nitride workpiece to attach the iron nitride workpiece to the substrate comprises heating the iron nitride workpiece and the substrate to a temperature between about 450° C. and about 550° C. for between about 30 minutes and about 4 hours.

Clause 33: The method of clause 32, wherein pre-annealing the iron nitride workpiece to attach the iron nitride workpiece to the substrate comprises heating the iron nitride workpiece and the substrate to a temperature of about 500° C. for between about 30 minutes and about 1 hour.

Clause 34: The method of clause 32 or 33, wherein pre-annealing the iron nitride workpiece to attach the iron nitride workpiece to the substrate comprises pre-annealing the iron nitride workpiece under an atmosphere comprising nitrogen and argon.

Clause 35: The method of clause 34, wherein pre-annealing the iron nitride workpiece to attach the iron nitride workpiece to the substrate comprises pre-annealing the iron nitride workpiece under an atmosphere comprising about 10 volume percent nitrogen, about 86 volume percent argon and about 4 volume percent hydrogen.

Clause 36: The method of any of clauses 18 to 35, wherein post-annealing the iron nitride workpiece to form $Fe_{16}N_2$ phase domains within the iron nitride workpiece comprises heating the iron nitride workpiece and the substrate to a temperature between about 120° C. and about 250° C. for at least about 5 hours.

Clause 37: The method of any of clauses 18 to 35, wherein post-annealing the iron nitride workpiece to form $Fe_{16}N_2$ phase domains within the iron nitride workpiece comprises heating the iron nitride workpiece and the substrate to a temperature between about 120° C. and about 200° C. for between about 20 hours and about 100 hours.

Clause 38: The method of any of clauses 18 to 35, wherein post-annealing the iron nitride workpiece to form $Fe_{16}N_2$ phase domains within the iron nitride workpiece comprises heating the iron nitride workpiece and the substrate to a temperature of about 150° C. for between about 20 hours and about 40 hours.

Clause 39: The method of any of clauses 18 to 38, wherein post-annealing the iron nitride workpiece to form $Fe_{16}N_2$ phase domains within the iron nitride workpiece comprises forming between about 5 volume percent and about 40 volume percent of $Fe_{16}N_2$ phase domains within the iron nitride workpiece.

Clause 40: The method of any of clauses 18 to 38, wherein post-annealing the iron nitride workpiece to form $Fe_{16}N_2$ phase domains within the iron nitride workpiece comprises forming between about 10 volume percent and about 20 volume percent of $Fe_{16}N_2$ phase domains within the iron nitride workpiece.

Clause 41: The method of any of clauses 18 to 38, wherein post-annealing the iron nitride workpiece to form $Fe_{16}N_2$ phase domains within the iron nitride workpiece comprises forming between about 10 volume percent and about 15 volume percent of $Fe_{16}N_2$ phase domains within the iron nitride workpiece.

Clause 42: The method of any of clauses 18 to 41, wherein post-annealing the iron nitride workpiece to form $Fe_{16}N_2$ phase domains within the iron nitride workpiece comprises forming $Fe_{16}N_2$ distributed throughout a volume of the iron nitride workpiece.

Clause 43: A method comprising forming a plurality of workpieces of iron nitride material, each of the plurality of workpieces including between about 5 volume percent and about 40 volume percent of $Fe_{16}N_2$ phase domains; introducing additional iron or nonmagnetic material between the plurality of workpieces or within at least one of the plurality of workpieces of iron nitride material; and sintering together the plurality of workpieces of iron nitride to form a bulk magnet including iron nitride with between about 5 volume percent and about 40 volume percent of $Fe_{16}N_2$ phase domains.

Clause 44: The method of clause 43, wherein forming the plurality of workpieces of iron nitride material comprises implanting N+ ions in a textured iron workpiece using ion implantation to form a textured iron nitride workpiece; and post-annealing the textured iron nitride workpiece to form $Fe_{16}N_2$ phase domains within the textured iron nitride workpiece.

Clause 45: The method of clause 44, further comprising forming the textured iron workpiece using fast belt casting.

Clause 46: The method of clause 44 or 45, wherein the textured iron workpiece defines a thickness between about 1 micrometer and about 10 millimeters.

Clause 47: The method of clause 44 or 45, wherein the textured iron workpiece defines a thickness between about 5 micrometer and about 1 millimeter.

Clause 48: The method of any of clauses 44 to 47, wherein the textured iron workpiece includes a (100) or a (110) crystal structure.

Clause 49: The method of any of clauses 44 to 48, wherein implanting N+ ions in the textured workpiece using ion implantation to form the textured iron nitride workpiece comprises accelerating N+ ions to an energy of less than about 180 kiloelectron volts.

Clause 50: The method of any of clauses 44 to 48, wherein accelerating N+ ions to the energy of less than about 180 kiloelectronvolts comprises accelerating N+ ions to the energy of about 100 kiloelectronvolts.

Clause 51: The method of any of clauses 44 to 50, wherein implanting N+ ions in the textured workpiece using ion implantation to form the textured iron nitride workpiece comprises providing N+ ions at a fluence of between about $2 \times 10^{16}/cm^2$ and about $1 \times 10^{17}/cm^2$.

Clause 52: The method of any of clauses 44 to 50, wherein implanting N+ ions in the iron workpiece using ion implantation to form the iron nitride workpiece comprises providing N+ ions at a fluence of between of about $8 \times 10^{16}/cm^2$.

Clause 53: The method of any of clauses 44 to 52, wherein implanting N+ ions in the textured workpiece using ion implantation to form the textured iron nitride workpiece comprises providing sufficient N+ ions to form an average concentration of nitrogen in the textured iron nitride workpiece between about 8 atomic percent and about 15 atomic percent.

Clause 54: The method of any of clauses 44 to 52, wherein implanting N+ ions in the textured workpiece using ion implantation to form the textured iron nitride workpiece comprises providing sufficient N+ ions to form an average concentration of nitrogen in the textured iron nitride workpiece of about 12.5 atomic percent.

Clause 55: The method of clause 43, wherein forming the plurality of workpieces of iron nitride material comprises mixing a nitrogen source in molten iron; fast belt casting the molten iron to form a textured iron nitride workpiece; and post-annealing the textured iron nitride workpiece to form $Fe_{16}N_2$ phase domains within the textured iron nitride workpiece.

Clause 56: The method of clause 55, wherein mixing nitrogen in molten iron comprises mixing the nitrogen source in molten iron to result in a concentration of nitrogen atoms in the molten iron between about 8 atomic percent and about 15 atomic percent.

Clause 57: The method of clause 55, wherein mixing nitrogen in molten iron comprises mixing the nitrogen source in molten iron to result in a concentration of nitrogen atoms in the molten iron of about 12.5 atomic percent.

Clause 58: The method of any of clauses 55 to 57, wherein the nitrogen source comprises at least one of ammonia, ammonium azide, or urea.

Clause 59: The method of any of clauses 55 to 58, wherein the textured iron nitride workpiece includes a (100) or a (110) crystal structure.

Clause 60: The method of any of clauses 55 to 59, wherein the textured iron nitride workpiece defines a dimension between about 1 micrometer and about 10 millimeters.

Clause 61: The method of any of clauses 55 to 59, wherein the textured iron nitride workpiece defines a thickness between about 5 micrometer and about 1 millimeter.

Clause 62: The method of any of clauses 43 to 61, wherein post-annealing the textured iron nitride workpiece to form $Fe_{16}N_2$ phase domains within the textured iron nitride workpiece comprises exerting a strain on the textured iron nitride workpiece between about 0.1% and about 7%; and while exerting the strain on the textured iron nitride workpiece, heating the textured iron nitride workpiece to a temperature between about 120° C. and about 250° C. for at least about 5 hours.

Clause 63: The method of clause 62, wherein heating the textured iron nitride workpiece to a temperature between about 120° C. and about 250° C. for at least about 5 hours comprises heating the textured iron nitride workpiece to a temperature between about 120° C. and about 200° C. for between about 20 hours and about 100 hours.

Clause 64: The method of clause 62, wherein heating the textured iron nitride workpiece to a temperature between about 120° C. and about 250° C. for at least about 5 hours comprises heating the textured iron nitride workpiece to a temperature of about 150° C. for between about 20 hours and about 40 hours.

Clause 65: The method of any of clauses 44 to 64, wherein post-annealing the textured iron nitride workpiece to form $Fe_{16}N_2$ phase domains within the textured iron nitride workpiece comprises forming between about 5 volume percent and about 40 volume percent of $Fe_{16}N_2$ phase domains within the textured iron nitride workpiece.

Clause 66: The method of any of clauses 44 to 64, wherein post-annealing the textured iron nitride workpiece to form $Fe_{16}N_2$ phase domains within the textured iron nitride workpiece comprises forming between about 5 volume percent and about 20 volume percent of $Fe_{16}N_2$ phase domains within the textured iron nitride workpiece.

Clause 67: The method of any of clauses 44 to 64, wherein post-annealing the textured iron nitride workpiece to form $Fe_{16}N_2$ phase domains within the textured iron nitride workpiece comprises forming between about 10 volume percent and about 15 volume percent of $Fe_{16}N_2$ phase domains within the textured iron nitride workpiece.

Clause 68: The method of any of clauses 44 to 67, wherein post-annealing the textured iron nitride workpiece to form $Fe_{16}N_2$ phase domains within the textured iron nitride workpiece comprises forming $Fe_{16}N_2$ distributed throughout a volume of the textured iron nitride workpiece.

Clause 69: The method of any of clauses 43 to 68, wherein introducing additional iron or nonmagnetic between the plurality of workpieces or within at least one of the plurality of workpieces of iron nitride material comprises implanting nonmagnetic ions within at least one of the plurality of workpieces of iron nitride material using ion implantation.

Clause 70: The method of any of clauses 43 to 69, wherein introducing additional iron or nonmagnetic between the plurality of workpieces or within at least one of the plurality of workpieces of iron nitride material comprises implanting nonmagnetic compounds within at least one of the plurality of workpieces of iron nitride material using cluster implantation.

Clause 71: The method of any of clauses 43 to 70, wherein introducing additional iron or nonmagnetic between the plurality of workpieces or within at least one of the plurality of workpieces of iron nitride material comprises introducing workpieces of iron or nonmagnetic material between a first workpiece and a second workpiece of the plurality of workpieces of iron nitride material.

Clause 72: The method of any of clauses 43 to 71, wherein introducing additional iron or nonmagnetic between the plurality of workpieces or within at least one of the plurality of workpieces of iron nitride material comprises introducing a powder comprising at least one of iron or nonmagnetic material between a first workpiece and a second workpiece of the plurality of workpieces of iron nitride material.

Clause 73: The method of any of clauses 43 to 71, wherein the iron or nonmagnetic material is selected from the group consisting of Al, Cu, Ti, Mn, Zr, Ta, B, C, Ni, Ru, $SiO_2$, $Al_2O_3$, or combinations thereof.

Clause 74: The method of any of clauses 43 to 73, wherein sintering together the plurality of workpieces of iron nitride to form a bulk magnet including iron nitride with between about 5 volume percent and about 40 volume percent of $Fe_{16}N_2$ phase domains comprises heating the plurality of workpieces including iron nitride material to a temperature below about 250° C. for at least about 5 hours.

Clause 75: The method of any of clauses 43 to 73, wherein sintering together the plurality of workpieces of iron nitride to form a bulk magnet including iron nitride with between about 5 volume percent and about 40 volume percent of $Fe_{16}N_2$ phase domains comprises heating the plurality of workpieces of iron nitride to a temperature below about 250° C. for at least about 5 hours while applying a pressure of between about 0.2 gigapascal and about 10 gigapascals to the plurality of workpieces of iron nitride.

Clause 76: The method of any of clauses 43 to 73, wherein sintering together the plurality of workpieces of iron nitride to form a bulk magnet including iron nitride with between about 5 volume percent and about 40 volume percent of $Fe_{16}N_2$ phase domains comprises heating the plurality of workpieces of iron nitride to a temperature between about 120° C. and about 200° C. for between about 20 hours and about 100 hours while applying a pressure of between about 0.2 gigapascal and about 10 gigapascals to the plurality of workpieces of iron nitride.

Clause 77: A method comprising forming a plurality of textured iron nitride workpieces by implanting N+ ions in a textured iron workpiece using ion implantation to form a textured iron nitride workpiece comprising between about 8 atomic percent and about 15 atomic percent N+ ions, and post-annealing the textured iron nitride workpiece to form a volume fraction of between about 5 volume percent and about 40 volume percent of $Fe_{16}N_2$ phase domains within the textured iron nitride workpiece, with a balance soft magnetic material including $Fe_8N$, wherein at least some of the $Fe_{16}N_2$ phase domains are magnetically coupled to at least one of the $Fe_8N$ domains by exchange spring coupling; introducing nonmagnetic material between a first workpiece of the plurality of workpieces and a second workpiece of the plurality of workpieces or within at least one of the plurality of workpieces of iron nitride; and sintering together the plurality of workpieces of iron nitride to form a bulk magnet including iron nitride with between about 5 volume percent and about 40 volume percent of $Fe_{16}N_2$ phase domains, wherein the nonmagnetic material forms domain wall pinning sites within the bulk magnet.

Clause 78: The method of clause 77, further comprising forming the textured iron workpiece using fast belt casting.

Clause 79: The method of clause 77 or 78, wherein the textured iron workpiece defines a thickness between about 1 micrometer and about 10 millimeters.

Clause 80: The method of clause 77 or 78, wherein the textured iron workpiece includes a (100) or a (110) crystal structure.

Clause 81: The method of any of clauses 77 to 80, wherein implanting N+ ions in the textured workpiece using ion implantation to form the texture iron nitride sheet comprises accelerating N+ ions to the energy of about 100 kiloelectronvolts.

Clause 82: The method of any of clauses 77 to 81, wherein implanting N+ ions in the iron workpiece using ion implantation to form the iron nitride workpiece comprises providing N+ ions at a fluence of between of about $8 \times 10^{16}/cm^2$.

Clause 83: The method of any of clauses 77 to 82, wherein post-annealing the textured iron nitride workpiece to form $Fe_{16}N_2$ phase domains within the textured iron nitride workpiece comprises exerting a strain on the textured iron nitride workpiece between about 0.1% and about 7%; and while exerting the strain on the textured iron nitride workpiece, heating the textured iron nitride workpiece to a temperature between about 120° C. and about 250° C. for at least about 5 hours.

Clause 84: The method of clause 83, wherein heating the textured iron nitride workpiece to a temperature between about 120° C. and about 250° C. for at least about 5 hours comprises heating the textured iron nitride workpiece to a temperature between about 120° C. and about 200° C. for between about 20 hours and about 100 hours.

Clause 85: The method of any of clauses 77 to 84, wherein post-annealing the textured iron nitride workpiece to form $Fe_{16}N_2$ phase domains within the textured iron nitride workpiece comprises forming $Fe_{16}N_2$ distributed throughout a volume of the textured iron nitride workpiece.

Clause 86: The method of any of clauses 77 to 85, wherein introducing additional iron or nonmagnetic between the plurality of workpieces or within at least one of the plurality of workpieces of iron nitride material comprises implanting nonmagnetic ions within at least one of the plurality of workpieces of iron nitride material using ion implantation.

Clause 87: The method of any of clauses 77 to 86, wherein introducing additional iron or nonmagnetic between the plurality of workpieces or within at least one of the plurality of workpieces of iron nitride material comprises implanting nonmagnetic compounds within at least one of the plurality of workpieces of iron nitride material using cluster implantation.

Clause 88: The method of any of clauses 77 to 87, wherein introducing additional iron or nonmagnetic between the plurality of workpieces or within at least one of the plurality of workpieces of iron nitride material comprises introducing workpieces of iron or nonmagnetic material between a first workpiece and a second workpiece of the plurality of workpieces of iron nitride material.

Clause 89: The method of any of clauses 77 to 88, wherein introducing additional iron or nonmagnetic between the plurality of workpieces or within at least one of the plurality of workpieces of iron nitride material comprises introducing a powder comprising at least one of iron or nonmagnetic material between a first workpiece and a second workpiece of the plurality of workpieces of iron nitride material.

Clause 90: The method of any of clauses 77 to 89, wherein the iron or nonmagnetic material is selected from the group consisting of Al, Cu, Ti, Mn, Zr, Ta, B, C, Ni, Ru, $SiO_2$, $Al_2O_3$, or combinations thereof.

Clause 91: The method of any of clauses 77 to 90, wherein sintering together the plurality of workpieces of iron nitride to form a bulk magnet including iron nitride with between about 5 volume percent and about 20 volume percent of $Fe_{16}N_2$ phase domains comprises heating the plurality of workpieces of iron nitride to a temperature between about 120° C. and about 200° C. for between about 20 hours and about 100 hours while applying a pressure of between about 0.2 gigapascal and about 10 gigapascals to the plurality of workpieces of iron nitride.

Clause 92: A method comprising forming a plurality of textured iron nitride workpieces by: mixing a nitrogen source in molten iron to result in a concentration of nitrogen atoms in the molten iron between about 8 atomic percent and about 15 atomic percent, fast belt casting the molten iron to form a textured iron nitride workpiece, and post-annealing the textured iron nitride workpiece to form a volume fraction of between about 5 volume percent and about 40 volume percent of $Fe_{16}N_2$ phase domains within the textured iron nitride workpiece, with a balance soft magnetic material including $Fe_8N$, wherein at least some of the $Fe_{16}N_2$ phase domains are magnetically coupled to at least one of the $Fe_8N$ domains by exchange spring coupling; introducing nonmagnetic material between a first workpiece of the plurality of workpieces and a second workpiece of the plurality of workpieces or within at least one of the plurality of workpieces of iron nitride; and sintering together the plurality of workpieces of iron nitride to form a bulk magnet including iron nitride with between about 5 volume percent and about 40 volume percent of $Fe_{16}N_2$ phase domains, wherein the nonmagnetic material forms domain wall pinning sites within the bulk magnet.

Clause 93: The method of clause 92, wherein the nitrogen source comprises at least one of ammonia, ammonium azide, or urea.

Clause 94: The method clause 92 or 93, wherein the textured iron nitride workpiece includes a (100) or a (110) crystal structure.

Clause 95: The method of any of clauses 92 to 94, wherein the textured iron nitride workpiece defines a thickness between about 1 micrometer and about 10 millimeters.

Clause 96: The method of any of clauses 92 to 95, wherein post-annealing the textured iron nitride workpiece to form $Fe_{16}N_2$ phase domains within the textured iron nitride workpiece comprises exerting a strain on the textured iron nitride workpiece between about 0.1% and about 7%; and while exerting the strain on the textured iron nitride workpiece, heating the textured iron nitride workpiece to a temperature between about 120° C. and about 250° C. for at least about 5 hours.

Clause 97: The method of clause 96, wherein heating the textured iron nitride workpiece to a temperature between about 120° C. and about 250° C. for at least about 5 hours comprises heating the textured iron nitride workpiece to a temperature between about 120° C. and about 200° C. for between about 20 hours and about 100 hours.

Clause 98: The method of any of clauses 92 to 97, wherein post-annealing the textured iron nitride workpiece to form $Fe_{16}N_2$ phase domains within the textured iron nitride workpiece comprises forming $Fe_{16}N_2$ distributed throughout a volume of the textured iron nitride workpiece.

Clause 99: The method of any of clauses 92 to 98, wherein introducing additional iron or nonmagnetic between the plurality of workpieces or within at least one of the plurality of workpieces of iron nitride material comprises implanting nonmagnetic ions within at least one of the plurality of workpieces of iron nitride material using ion implantation.

Clause 100: The method of any of clauses 92 to 99, wherein introducing additional iron or nonmagnetic between the plurality of workpieces or within at least one of the plurality of workpieces of iron nitride material comprises implanting nonmagnetic compounds within at least one of the plurality of workpieces of iron nitride material using cluster implantation.

Clause 101: The method of any of clauses 92 to 100, wherein introducing additional iron or nonmagnetic between the plurality of workpieces or within at least one of the plurality of workpieces of iron nitride material comprises introducing workpieces of iron or nonmagnetic material between a first workpiece and a second workpiece of the plurality of workpieces of iron nitride material.

Clause 102: The method of any of clauses 92 to 101, wherein introducing additional iron or nonmagnetic between the plurality of workpieces or within at least one of the plurality of workpieces of iron nitride material comprises introducing a powder comprising at least one of iron or nonmagnetic material between a first workpiece and a second workpiece of the plurality of workpieces of iron nitride material.

Clause 103: The method of any of clauses 92 to 102, wherein the iron or nonmagnetic material is selected from the group consisting of Al, Cu, Ti, Mn, Zr, Ta, B, C, Ni, Ru, $SiO_2$, $Al_2O_3$, or combinations thereof.

Clause 104: The method of any of clauses 92 to 103, wherein sintering together the plurality of workpieces of iron nitride to form a bulk magnet including iron nitride with between about 5 volume percent and about 20 volume percent of $Fe_{16}N_2$ phase domains comprises heating the plurality of workpieces of iron nitride to a temperature between about 120° C. and about 200° C. for between about 20 hours and about 100 hours while applying a pressure of between about 0.2 gigapascal and about 10 gigapascals to the plurality of workpieces of iron nitride.

Clause 105: A system for performing any of the techniques described herein for forming a magnetic material including $Fe_{16}N_2$ phase domains.

EXAMPLES

Example 1

Figure 19:
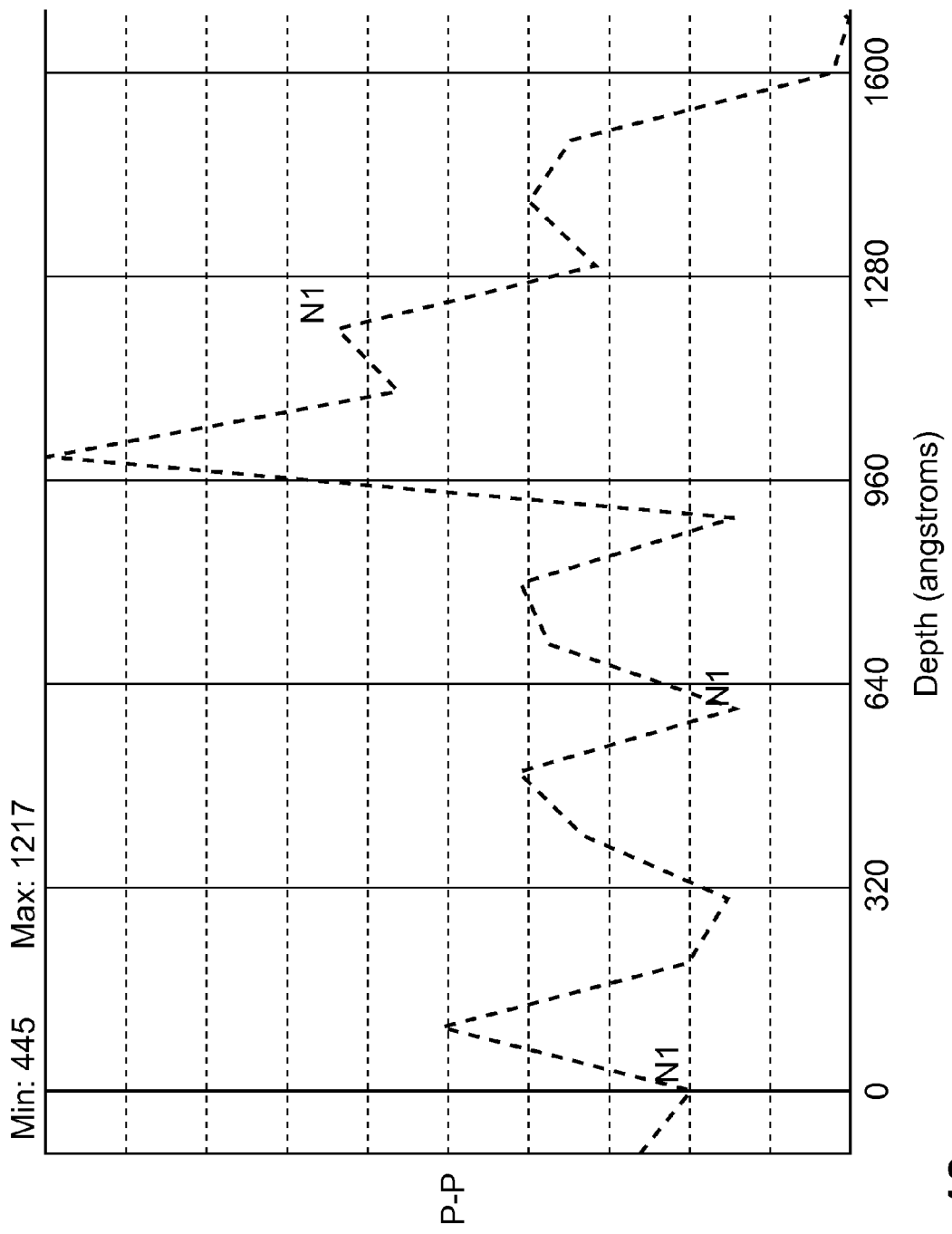
FIG. 19 is a line diagram representing an auger measurement of N+ ion concentration as a function of depth in an iron foil after ion implantation and before annealing the iron nitride foil.

FIG. 19 is a line diagram representing an auger measurement of N+ ion concentration as a function of depth in an iron foil after ion implantation and before annealing the iron nitride foil. Prior to N+ ion implantation, the iron foil had a thickness of about 500 nm. N+ ions were accelerated to 100 keV for implantation in the iron film. An N+ ion fluence of about $8\times10^{16}/cm^2$ N+ ions was used to implant N+ ions in the iron foil. The measurement was performed using auger electron spectroscopy (AES) with $Ar^+$ at the milling source using a Physical Electronics Industries (PHI) 545 scanning Auger microprobe, available from Physical Electronics, Inc., Chanhassen, Minn. The peak position of N+ ion concentration was about 1000 Å or 100 nm, as predicted by the relationship shown in FIG. 2. Additionally, N+ ions were implanted at other depths surrounding 1000 Å.

Example 2

Figure 20:
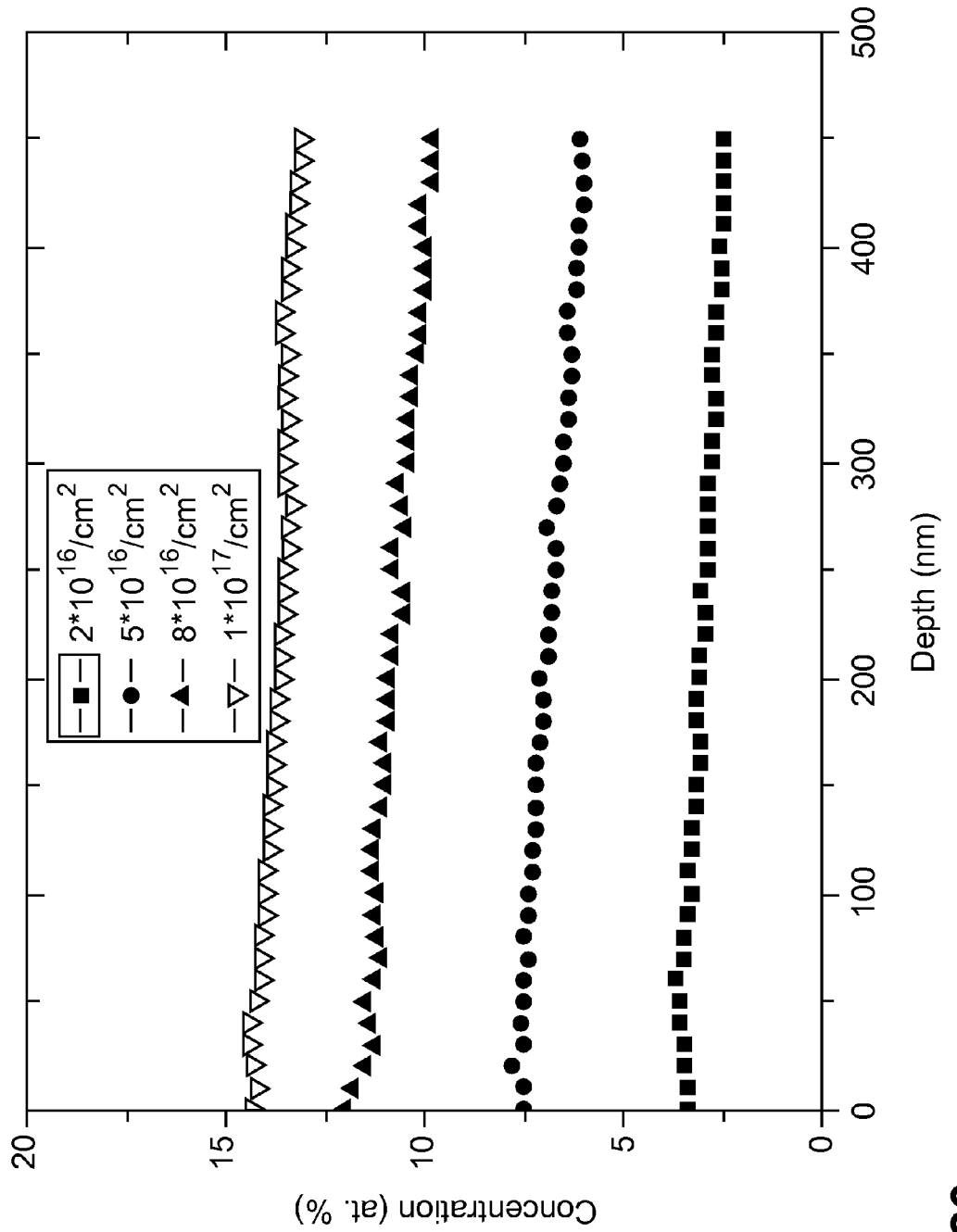
FIG. 20 is a scatter diagram illustrating nitrogen concentrations as a function of depth within an iron foil after post-annealing for different nitrogen fluencies.

FIG. 20 is a scatter diagram illustrating nitrogen concentrations as a function of depth within an iron foil after post-annealing for different nitrogen fluencies. Prior to N+ ion implantation, the iron foil had a thickness of about 500 nm. N+ ions were accelerated to 100 keV for implantation in the iron film. N+ ion fluences of about $2\times10^{16}/cm^2$, $5\times10^{16}/cm^2$, $8\times10^{16}/cm^2$, and $1\times10^{17}/cm^2$ N+ ions were used to implant N+ ions in the iron foil. After ion implantation, the iron nitride foil was attached to a (111) silicon substrate and subjected to a pre-annealing treatment at about 500° C. for about 0.5 hours in a 4% $H_2$+10% $N_2$+86% Ar atmosphere. The iron nitride foil was then subjected to a post-annealing treatment at about 150° C. for about 40 hours in a vacuum.

As shown in FIG. 20, the thickness of the iron nitride foil after the post-annealing step was about 450 nm. The loss of 50 nm of thickness is believed to be due to iron losses during ion bombardment and cleaning during the pre-annealing step. As shown in FIG. 20, for each of the nitrogen fluencies, after the post-annealing step, the concentration of nitrogen within the foil was substantially the same throughout the foil. The concentration of nitrogen for the $8\times10^{16}/cm^2$ N+ ion fluency (upward pointing triangles) ranges from about 12.5 at. % to about 10 at. %, near the stoichiometric ratio of Fe:N in $Fe_{16}N_2$.

Example 3

Figure 21A:
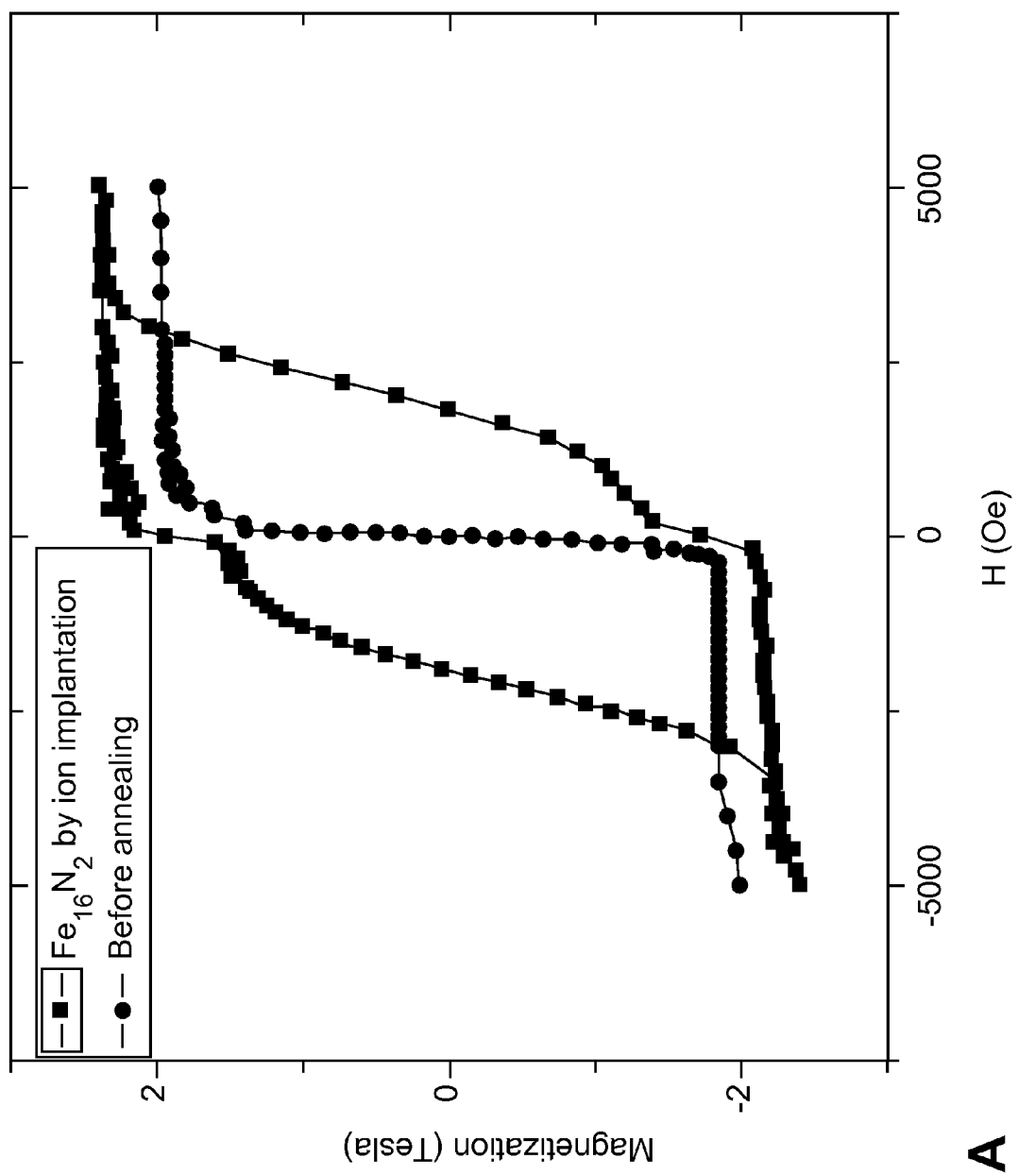
FIGS. 21A and 21B are hysteresis loops of magnetization versus coercivity for examples of an iron nitride foil prepared using ion implantation.
Figure 21B:
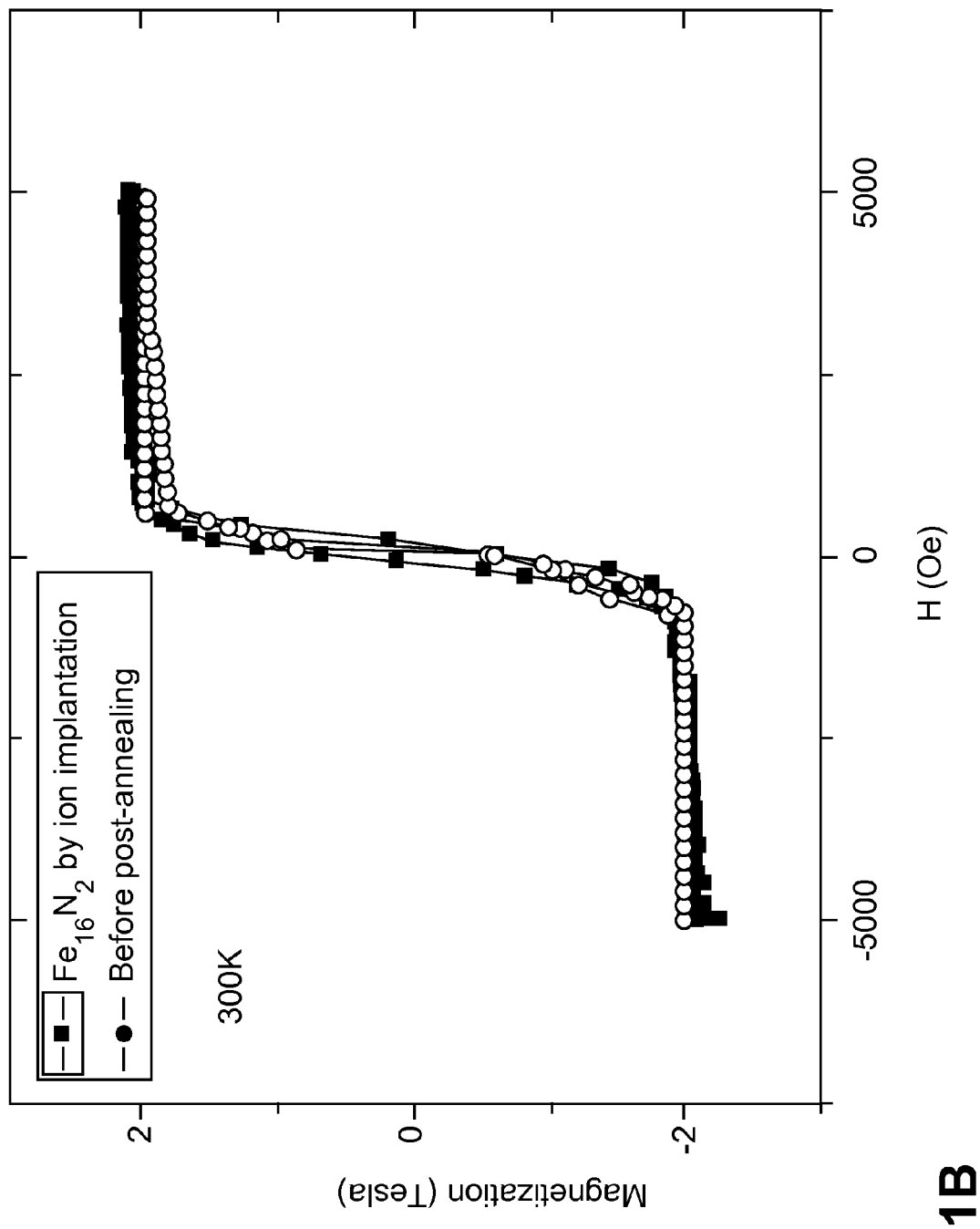

FIGS. 21A and 21B are hysteresis loops of magnetization versus coercivity for examples of an iron nitride foil prepared using ion implantation. Prior to N+ ion implantation, the iron foil had a thickness of about 500 nm. N+ ions were accelerated to 100 keV for implantation in the iron film. N+ ion fluence of about $8\times10^{16}/cm^2$ N+ ions were used to implant N+ ions in the iron foil. After ion implantation, the iron nitride foil was attached to a (111) silicon substrate and subjected to a pre-annealing treatment at about 500° C. for about 0.5 hours in a 4% $H_2$+10% $N_2$+86% Ar atmosphere. The iron nitride foil was then subjected to a post-annealing treatment at about 150° C. for about 40 hours in a vacuum.

FIG. 21A illustrates the hysteresis loop of the iron nitride foil at a temperature of about 5 K. As shown in FIG. 21A, the pre- and post-annealing treatments resulted in the saturation magnetization increasing from about 2.0 Tesla (T) to about 2.45 T. The pre- and post-annealing treatments also increased the coercivity ($H_s$) from about 0 to about 3.2 kOe.

FIG. 21B illustrates the hysteresis loop of the iron nitride foil at a temperature of about 300 K. As shown in FIG. 21B, the pre- and post-annealing treatments resulted in the saturation magnetization increasing from about 2.0 T to about 2.12 T. The pre- and post-annealing treatments also increased the coercivity ($H_s$) from about 0 to about 26 Oe. The difference in behavior between the foil tested at 5 K and the foil tested at about 300 K is believed to be due to defects within the material that affect the results at the higher temperature, but whose effects are reduced at the lower temperature. Hence, the results at 5 K are believed to be representative of ideal properties of some iron nitride films prepared using this technique.

Example 4

Pure (110) iron foils with a thickness of about 500 nm were positioned on mirror-polished (111) Si. Nitrogen ions of N+ were accelerated to 100 keV and implanted into these foils vertically and at room temperature with doses of $2\times10^{16}/cm^2$, $5\times10^{16}/cm^2$, $8\times10^{16}/cm^2$, and $1\times10^{17}/cm^2$. After ion implantation, a two-step annealing process was applied on the implanted foils. The first step was pre-annealing at 500° C. in an atmosphere of nitrogen and argon for about 0.5 hour. After the pre-annealing step, a post-annealing treatment was performed at about 150° C. for about 40 hours in vacuum.

Figure 22:
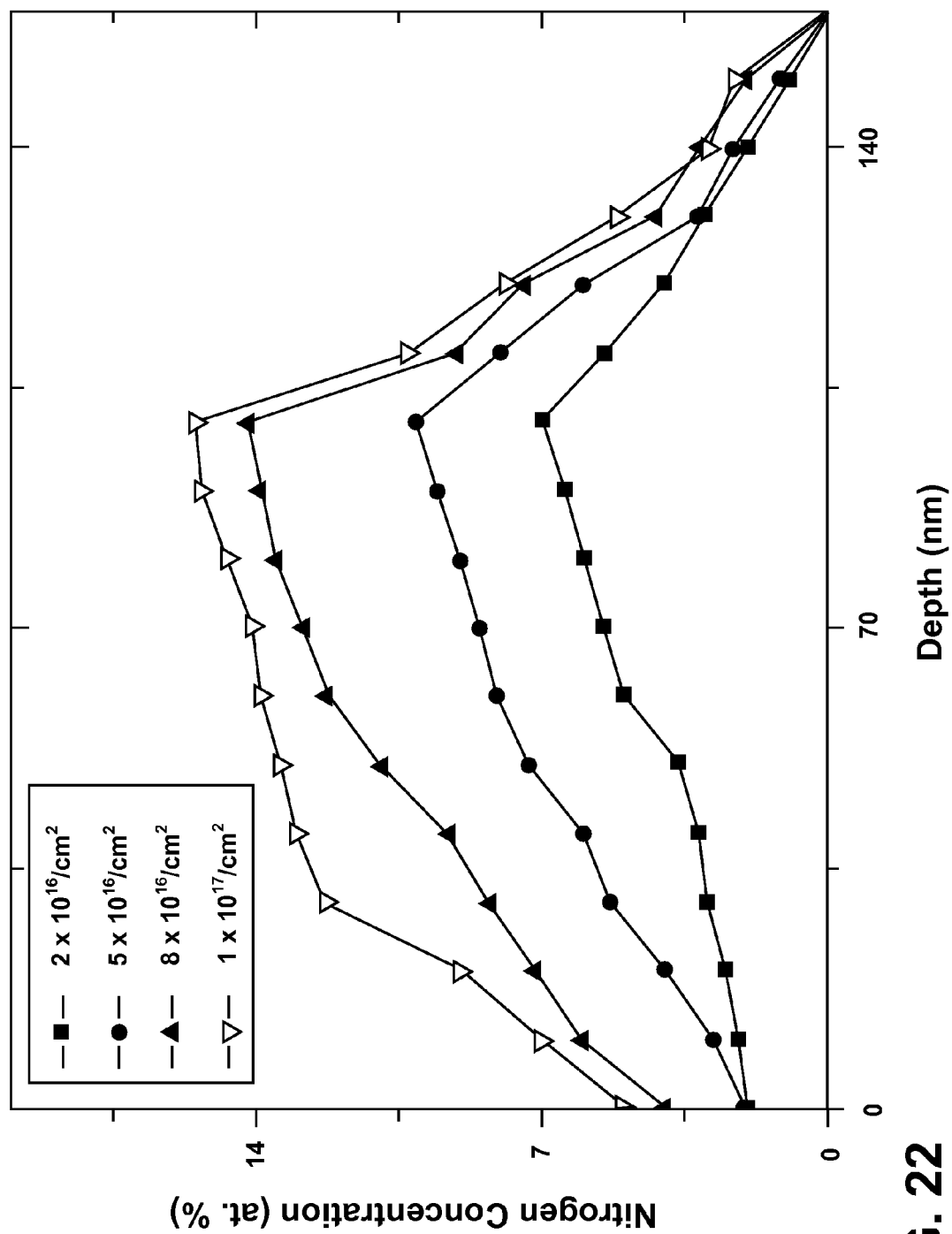
FIG. 22 is a line diagram that illustrates examples of nitrogen depth profiles in iron foils before annealing.

The samples were exposed to the same implant energy but different nitrogen fluencies. FIG. 22 is a line diagram that illustrates examples of nitrogen depth profiles in iron foils before annealing. The nitrogen depth profiles were measured by Auger Electron Spectroscopy (AES) with Ar+ as the in-depth milling source.

The nitrogen implant range inside the foil was determined by the implant energy. As shown in FIG. 22, the four samples with different nitrogen fluencies have the same implant range (about 160 nm) and same peak position (about 100 nm). This is coincident with the simulation result by SRIM.

Example 5

Pure (110) iron foils with a thickness of about 500 nm were positioned on mirror-polished (111) Si. Nitrogen ions of N+ were accelerated to 100 keV and implanted into these foils vertically and at room temperature with doses of $2\times10^{16}/cm^2$, $5\times10^{16}/cm^2$, $8\times10^{16}/cm^2$, and $1\times10^{17}/cm^2$. After ion implantation, a two-step annealing process was applied on the implanted foils. The first step was pre-annealing at 500° C. in an atmosphere of nitrogen and argon for about 0.5 hour. After the pre-annealing step, a post-annealing treatment was performed at about 150° C. for about 40 hours in vacuum.

Figure 23:
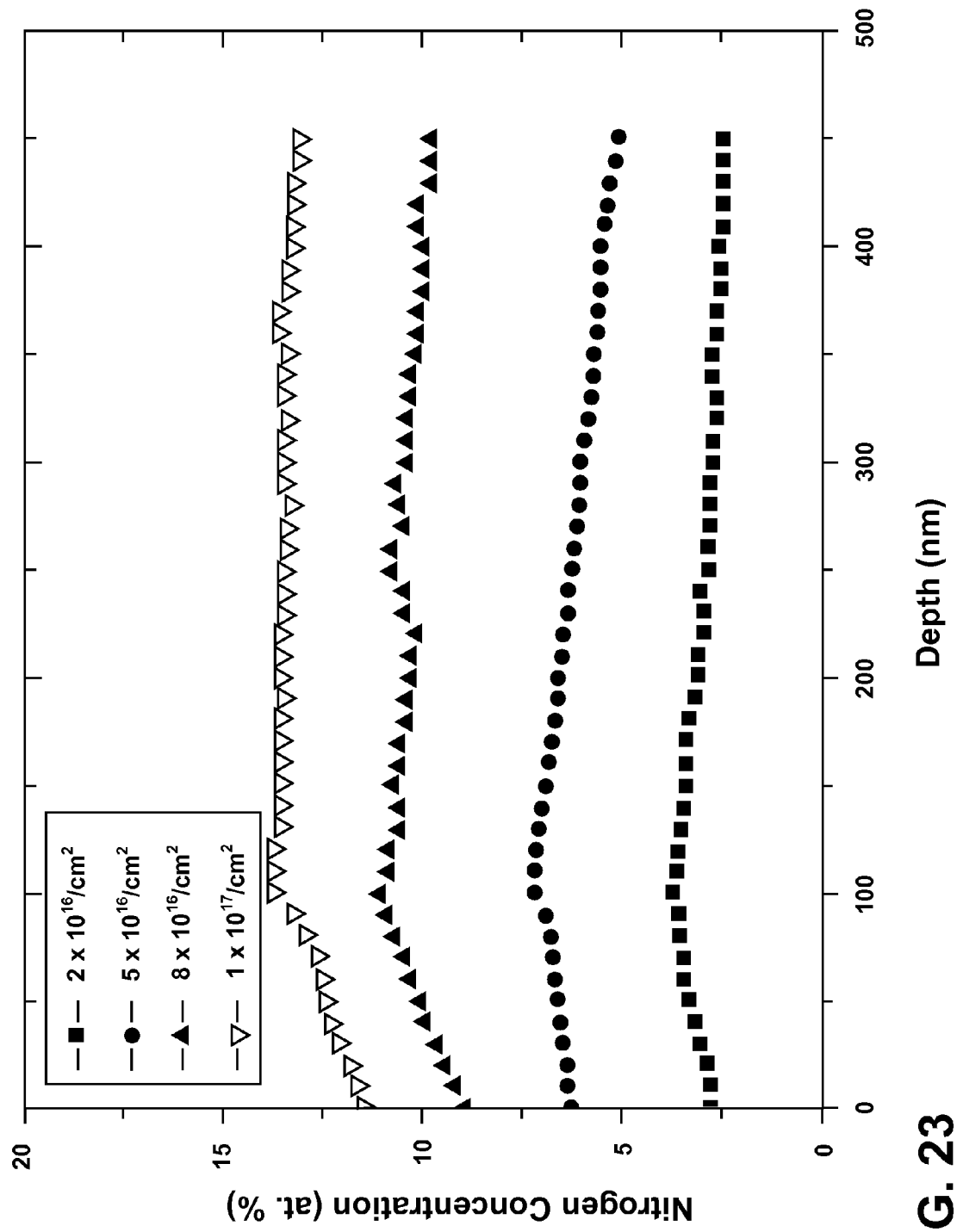
FIG. 23 is a scatter diagram illustrating nitrogen concentrations as a function of depth within an iron foil after post-annealing for different nitrogen fluencies.

FIG. 23 is a scatter diagram illustrating nitrogen concentrations as a function of depth within an iron foil after post-annealing for different nitrogen fluencies. FIG. 23 shows that nitrogen concentrations in the annealed foils are substantially homogeneous for each nitrogen fluency. The nitrogen concentration distribution for the iron nitride corresponding to $8\times10^{16}/cm^2$ has reached to 11 at. %, close to the stoichiometric ratio of nitrogen in $Fe_{16}N_2$.

Example 6

Pure (110) iron foils with a thickness of about 500 nm were positioned on mirror-polished (111) Si. Nitrogen ions of N+ were accelerated to 100 keV and implanted into these foils vertically and at room temperature with doses of $2\times10^{16}/cm^2$, $5\times10^{16}/cm^2$, $8\times10^{16}/cm^2$, and $1\times10^{17}/cm^2$. After ion implantation, a two-step annealing process was applied on the implanted foils. The first step was pre-annealing at 500° C. in an atmosphere of nitrogen and argon for about 0.5 hour. After the pre-annealing step, a post-annealing treatment was performed at about 150° C. for about 40 hours in vacuum.

Figure 24:
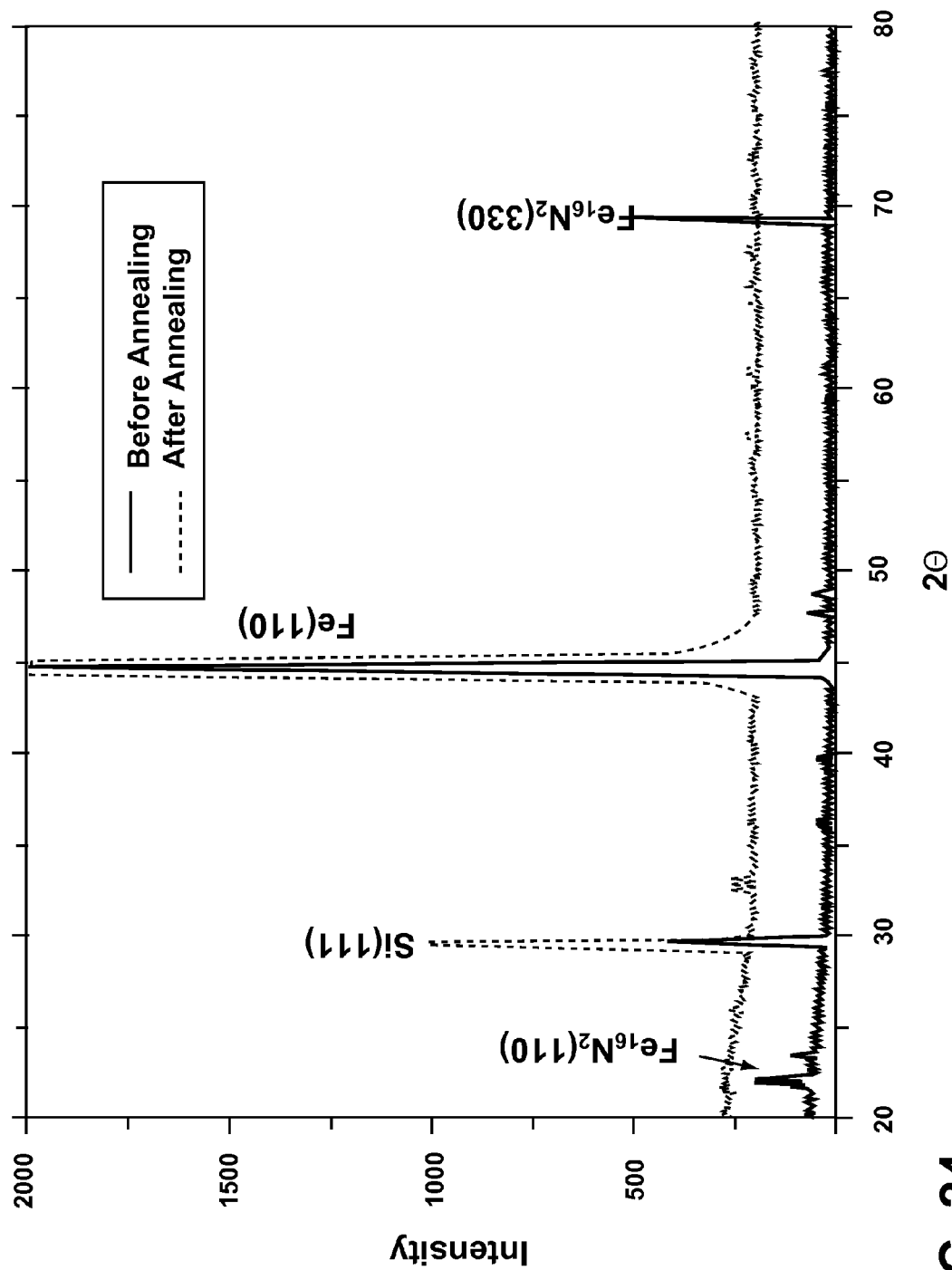
FIG. 24 is an x-ray diffraction (XRD) spectrum for an example of an iron nitride foil before and after annealing.

The crystal structure of foil samples was characterized using a Siemens D5005 X-ray diffractometer (XRD) with Cu Kα radiation source. FIG. 24 illustrates XRD patterns collected before and after annealing for the foil sample formed using an $8\times10^{16}/cm^2$ fluence of nitrogen ions. For the spectrum before annealing, besides the silicon substrate Si(111) peak, a bcc Fe(110) peak appears. After annealing, the emerging $Fe_{16}N_2$(330) (not labeled in FIG. 24) and (220) peaks indicate that part of bcc Fe has been transformed to $Fe_{16}N_2$ phase. FIG. 24 also illustrates a decrease in the intensity of the $Fe_8N$ (330) peak after annealing.

Example 7

Pure (110) iron foils with a thickness of about 500 nm were positioned on mirror-polished (111) Si. Nitrogen ions of N+ were accelerated to 100 keV and implanted into these foils vertically and at room temperature with doses of $8\times10^{16}/cm^2$. After ion implantation, a two-step annealing process was applied on the implanted foils. The first step was pre-annealing at 500° C. in an atmosphere of nitrogen and argon for about 0.5 hour. After the pre-annealing step, a post-annealing treatment was performed at about 150° C. for about 40 hours in vacuum.

Figure 25:
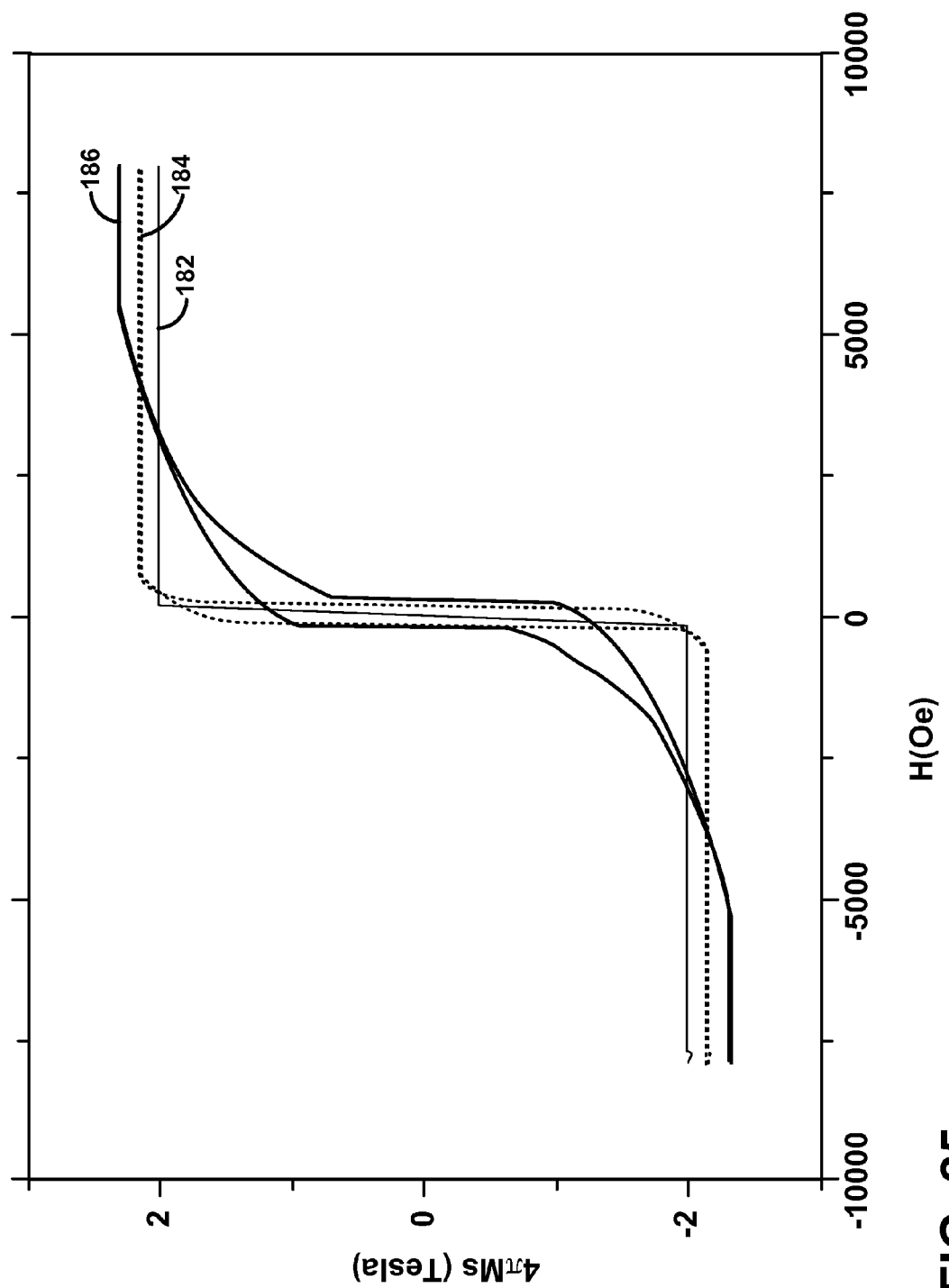
FIG. 25 is a hysteresis loop of magnetization versus coercivity for examples of an iron nitride foil prepared using ion implantation.

FIG. 25 is a hysteresis loop of magnetization versus coercivity for examples of an iron nitride foil prepared using ion implantation. Prior to ion implantation (curve 182 in FIG. 25), the magnetic properties of the iron foil were as expected for an iron single crystal, with remanent magnetization being almost equal to saturation magnetization (about 2.02 T at room temperature). This indicates an easy axis lying along the in-plane direction. After ion implantation and a pre-annealing step, saturation magnetization increased by about 7% compared to the iron foil. After post-annealing, the saturation magnetization increased by about 15% compared to the iron foil. After ion implantation, pre-annealing, and post-annealing, the saturation field ($H_s$) increased to about 5.3 kOe, indicating a perpendicular magnetic anisotropy due to the bct structure in $Fe_{16}N_2$.

Example 8

Pure (110) iron foils with a thickness of about 500 nm were positioned on mirror-polished (111) Si. Nitrogen ions of N+ were accelerated to 100 keV and implanted into these foils vertically and at room temperature with doses of $2\times10^{16}/cm^2$, $5\times10^{16}/cm^2$, $8\times10^{16}/cm^2$, and $1\times10^{17}/cm^2$. After ion implantation, a two-step annealing process was applied on the implanted foils. The first step was pre-annealing at 500° C. in an atmosphere of nitrogen and argon for about 0.5 hour. After the pre-annealing step, a post-annealing treatment was performed at about 150° C. for about 40 hours in vacuum.

Figure 26:
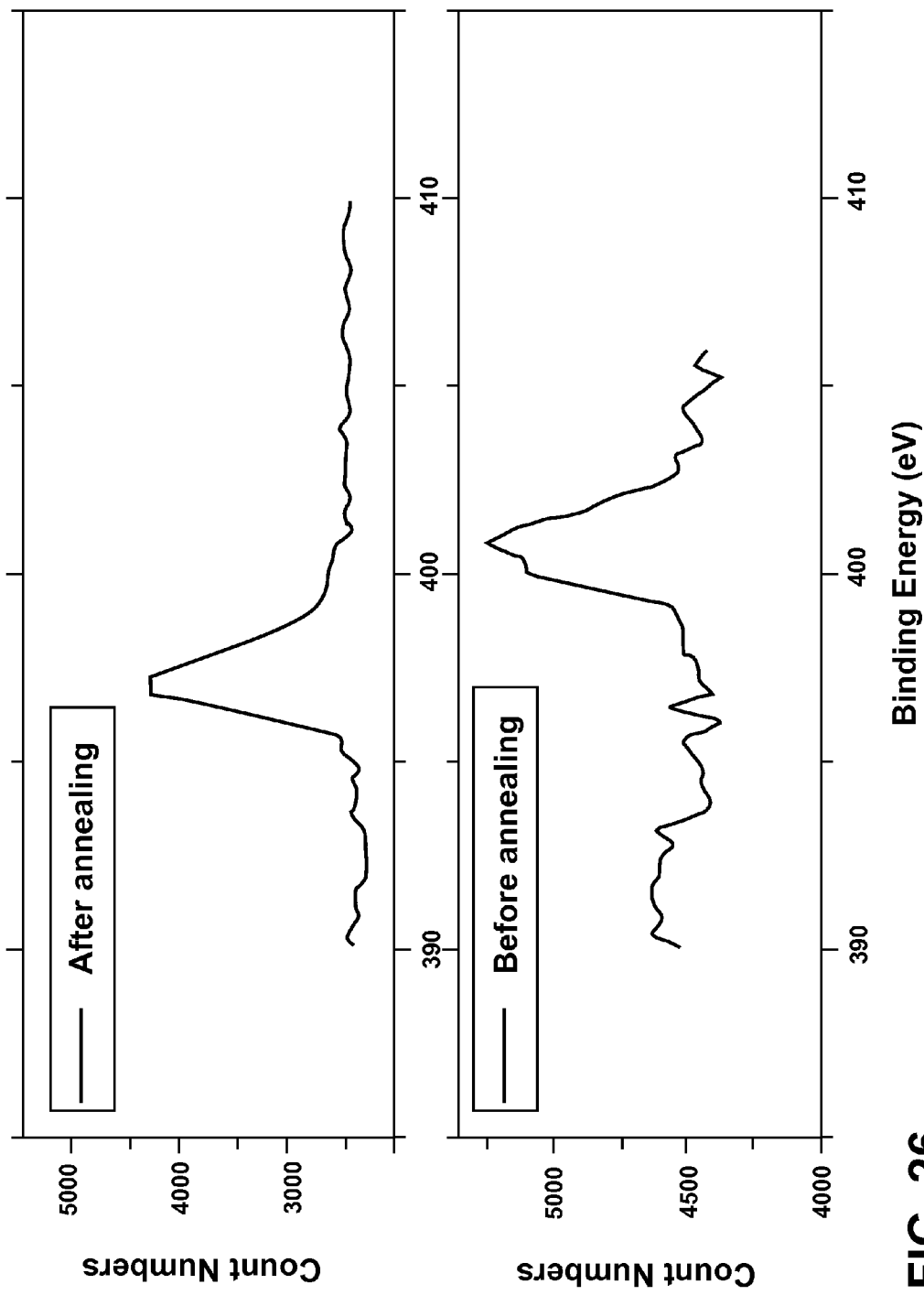
FIG. 26 includes two line diagrams illustrating nitrogen binding energies before and after the annealing treatments.

To determine the chemical state for nitrogen in FeN foils before and after annealing, X-ray Photoelectron Spectroscopy (XPS) was used to test the nitrogen binding energy. FIG. 26 includes two line diagrams illustrating nitrogen binding energies before and after the annealing treatments. The binding energy of $N^{1s}$ before annealing is about 401 eV, indicating a positively charged state, as compared with a neutral state. This indicates that nitrogen remains its ionized (N+) state after implantation. The binding energy of nitrogen shifted to about 397 eV after annealing, corresponding to a negatively charged state. This suggests that nitrogen has combined with iron after annealing.

Example 9

Iron nitride samples were prepared using a cold crucible technique by exposing a strained iron sample to urea, as described with respect to FIGS. 15-18. The iron sample was heated to a temperature of about 660° C. for about 4 hours while being exposed to urea (1 gram urea for each gram of iron), followed by water-cooling the iron sample.

The iron sample then was cut into wires and stretched using an apparatus similar to that shown in FIG. 11. Three wires were strained to different lengths, with the strain being determined using a strain gauge. The first sample was subjected to a tensile force of about 830 Newtons (N), which resulted in a strain of about 2.5%. The second sample was subjected to a tensile force of about 1328 N, which resulted in a strain of about 4%. The third sample was subjected to a tensile force of about 1660 N, which resulted in a strain of about 5%. Each sample was annealed at about 150° C. for about 20 hours while being strained the stated amount.

Figure 27:
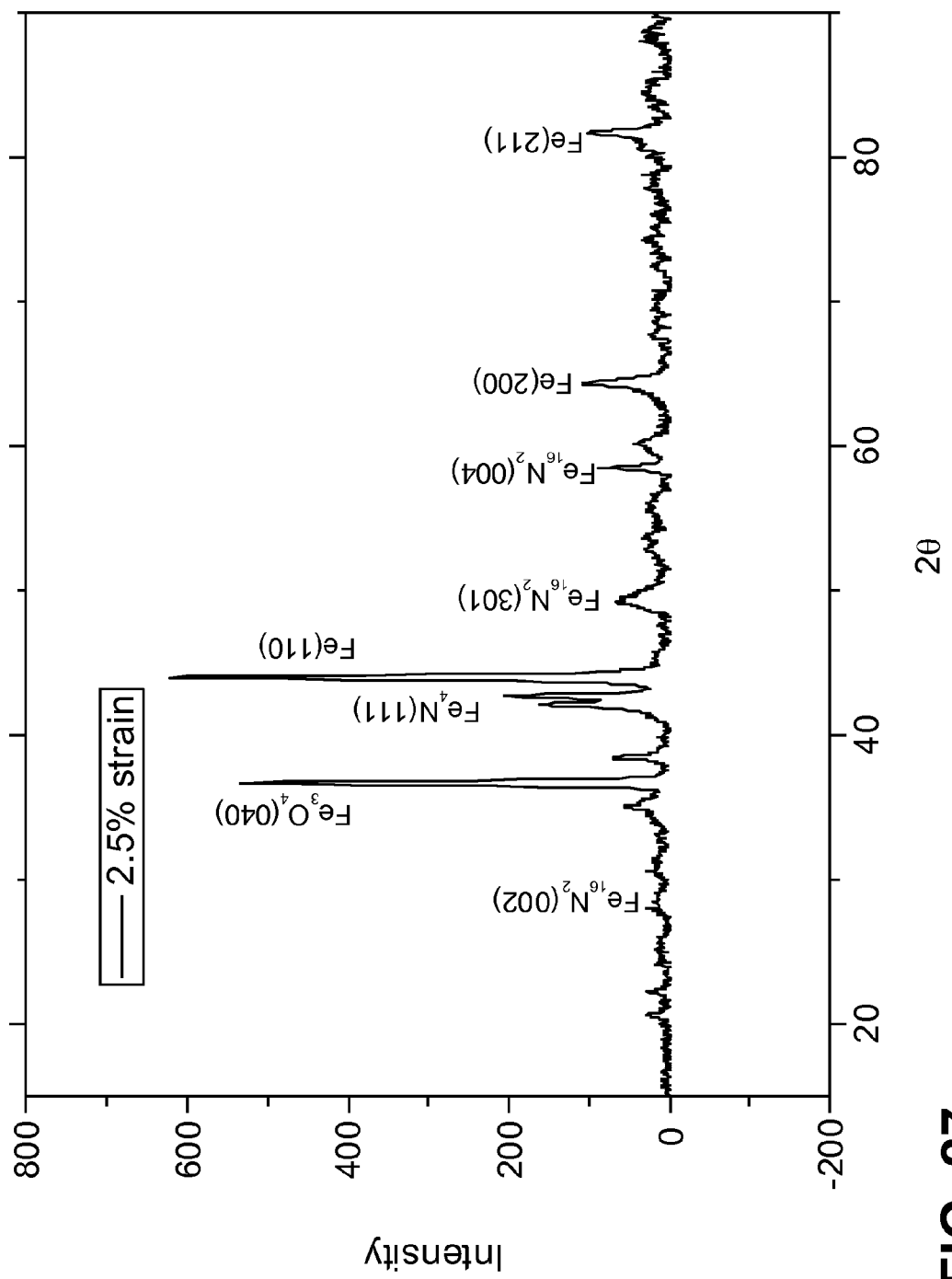
FIGS. 27-29 illustrate XRD patterns collected for iron nitride samples strained to different levels during a post-annealing treatment.
Figure 28:
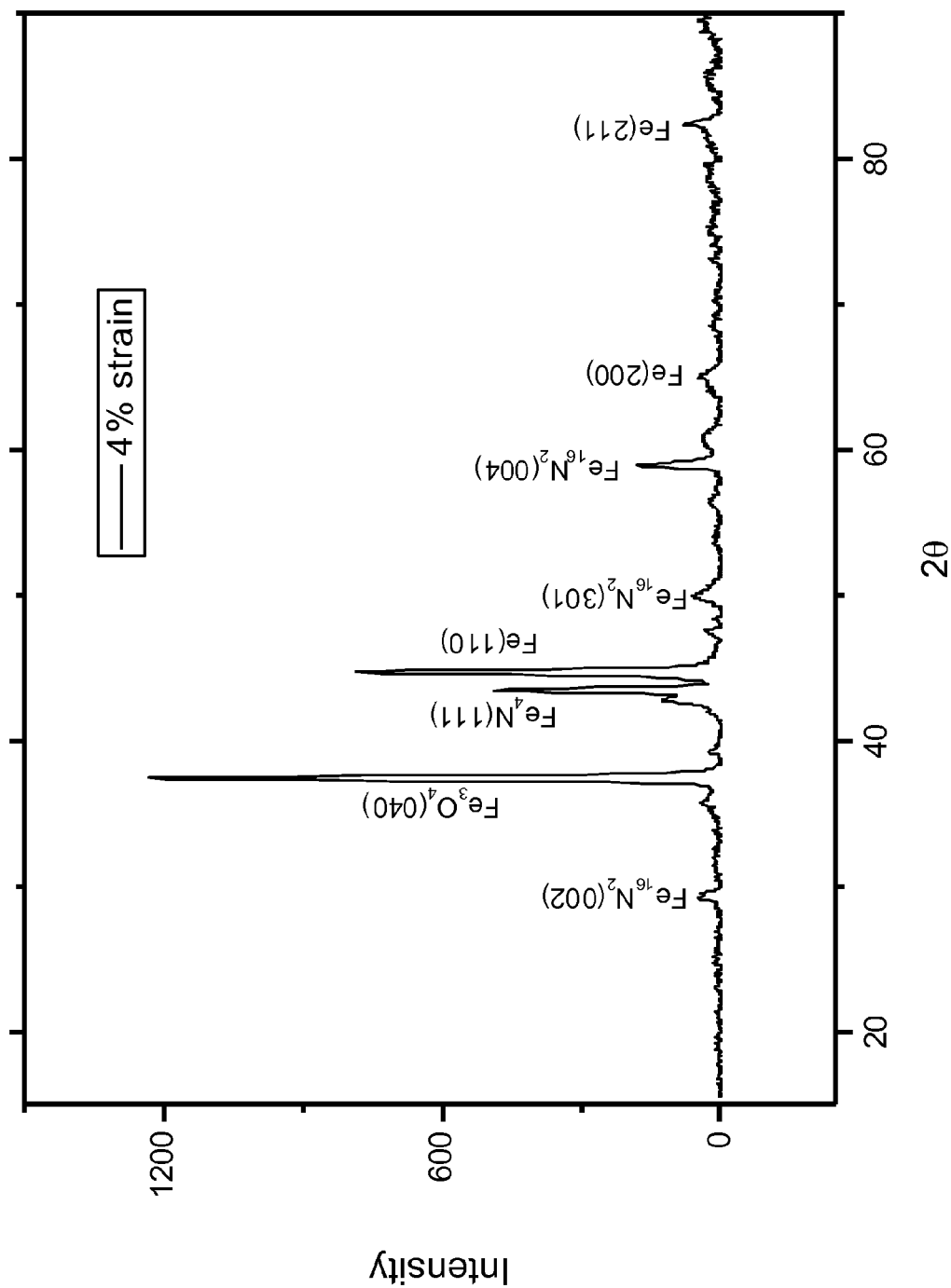
Figure 29:
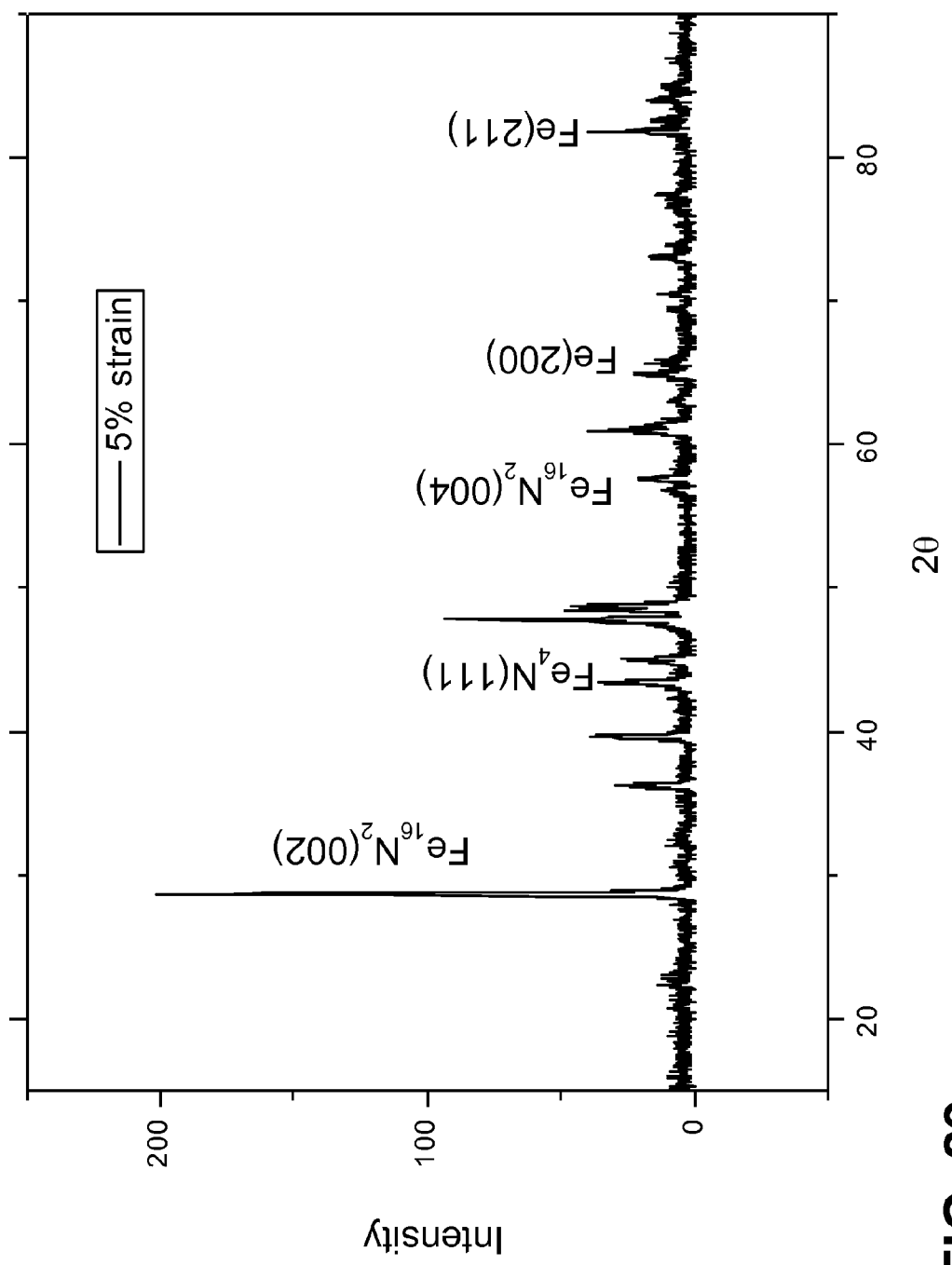

The crystal structure of the three samples then was characterized using a Siemens D5005 X-ray diffractometer (XRD) with Cu Kα radiation source. FIGS. 27-29 illustrate XRD patterns collected for the three iron nitride samples. FIG. 27 illustrates the results for the sample strained to 2.5%. The XRD patterns include peaks for $Fe_{16}N_2(002)$, $Fe_{16}N_2(301)$, and $Fe_{16}N_2(004)$, along with other iron nitride ($Fe_4N(111)$), iron ($Fe(110)$, $Fe(200)$, and $Fe(211)$), and iron oxide ($Fe_3O_4$) phases.

FIG. 28 illustrates the results for the sample strained to 4%. The XRD patterns include peaks for $Fe_{16}N_2(002)$, $Fe_{16}N_2(301)$, and $Fe_{16}N_2(004)$, along with other iron nitride ($Fe_4N(111)$), iron ($Fe(110)$, $Fe(200)$, and $Fe(211)$), and iron oxide ($Fe_3O_4$) phases.

FIG. 29 illustrates the results for the sample strained to 5%. The XRD patterns include peaks for $Fe_{16}N_2(002)$ and $Fe_{16}N_2(004)$, along with other iron nitride ($Fe_4N(111)$) and iron ($Fe(200)$ and $Fe(211)$) phases.

Figure 30:
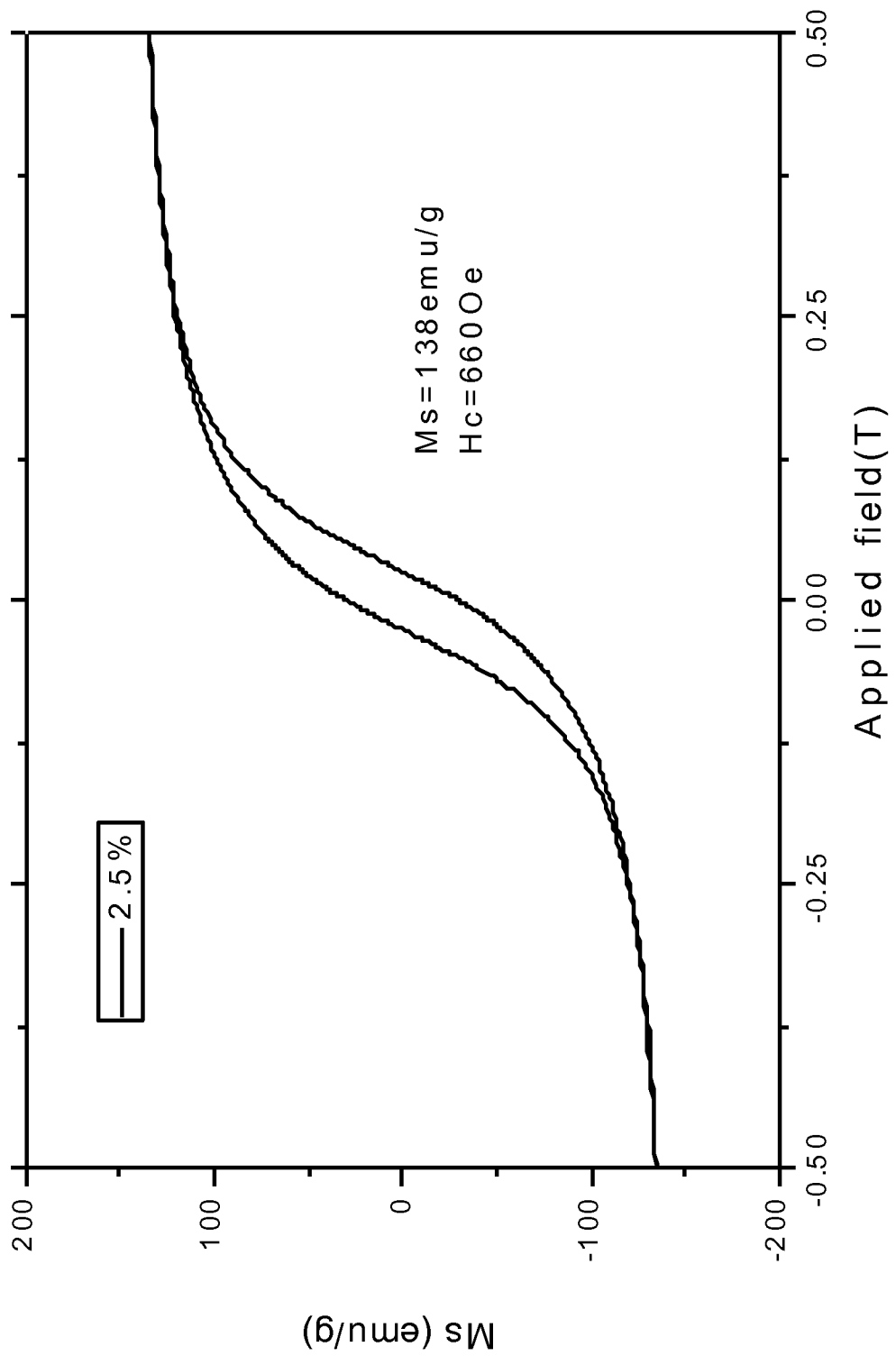
FIGS. 30-32 are hysteresis loops of magnetization versus coercivity for examples of iron nitride wires exposed to different strains during annealing.
Figure 31:
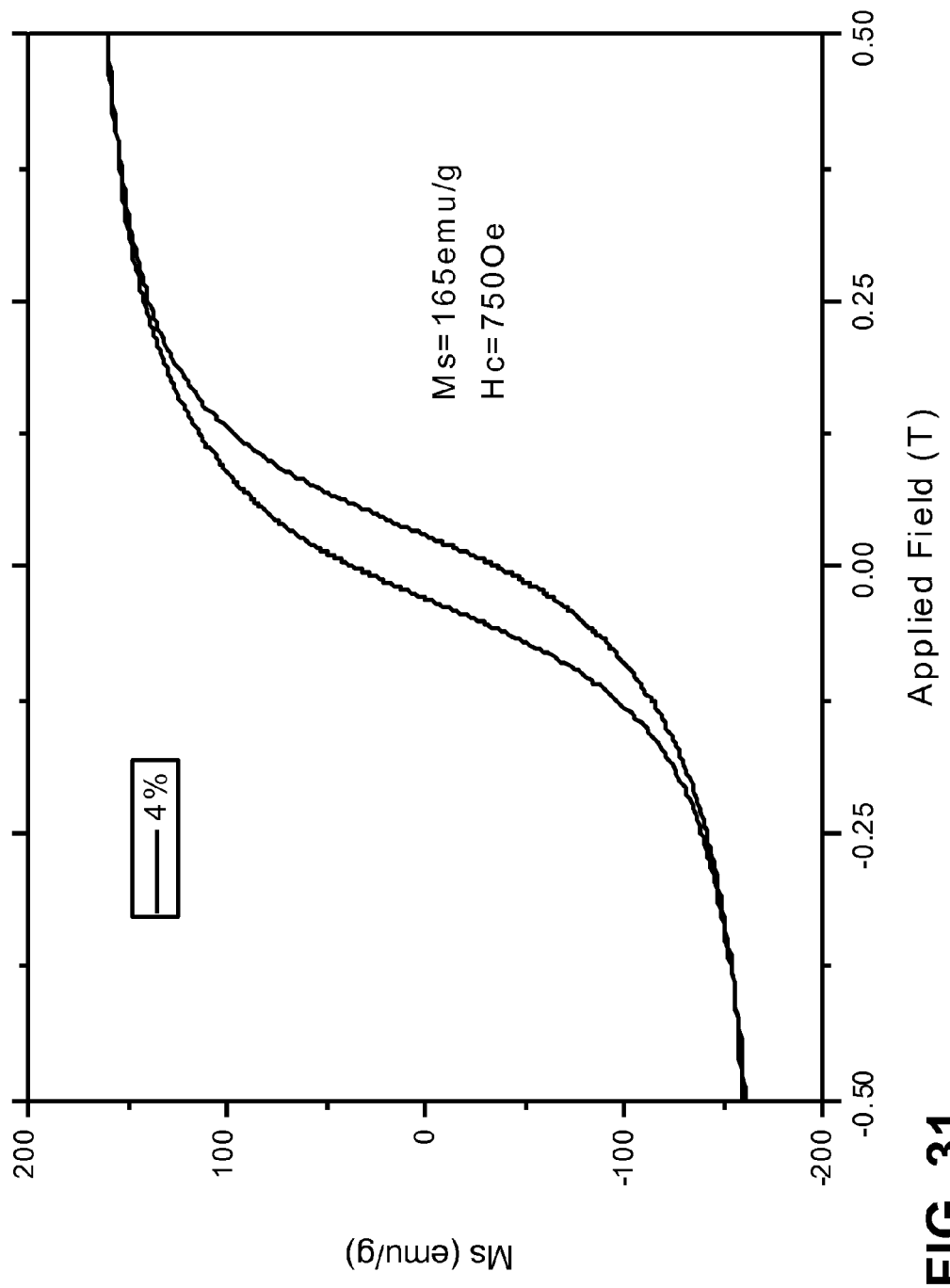
Figure 32:
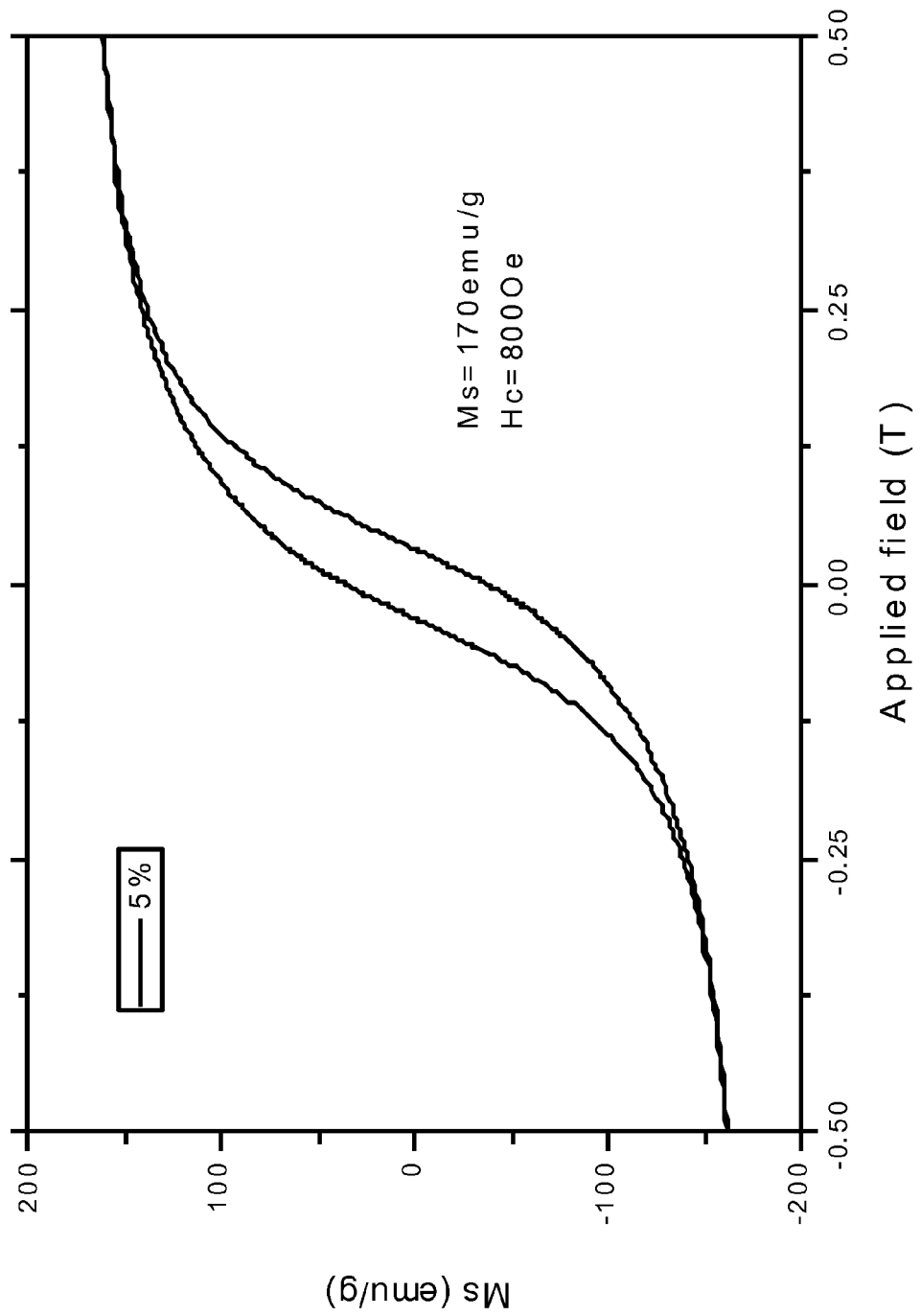

FIGS. 30-32 are hysteresis loops of magnetization versus coercivity for examples of iron nitride wires exposed to different strains (2.5%, 4%, and 5%) during annealing. The hysteresis loops were measured at room temperature. FIG. 30 illustrates that, after annealing, the sample subjected to a strain of about 2.5% has a saturation magnetization ($M_s$) of about 138 emu/g. and a coercivity ($H_c$) of about 660 Oe. FIG. 31 illustrates that, after annealing, the sample subjected to a strain of about 4% has a saturation magnetization (Ms) of about 165 emu/g. and a coercivity (Hc) of about 750 Oe. FIG. 32 illustrates that, after annealing, the sample subjected to a strain of about 4% has a saturation magnetization (Ms) of about 170 emu/g. and a coercivity (Hc) of about 800 Oe.

Example 10

Figure 33:
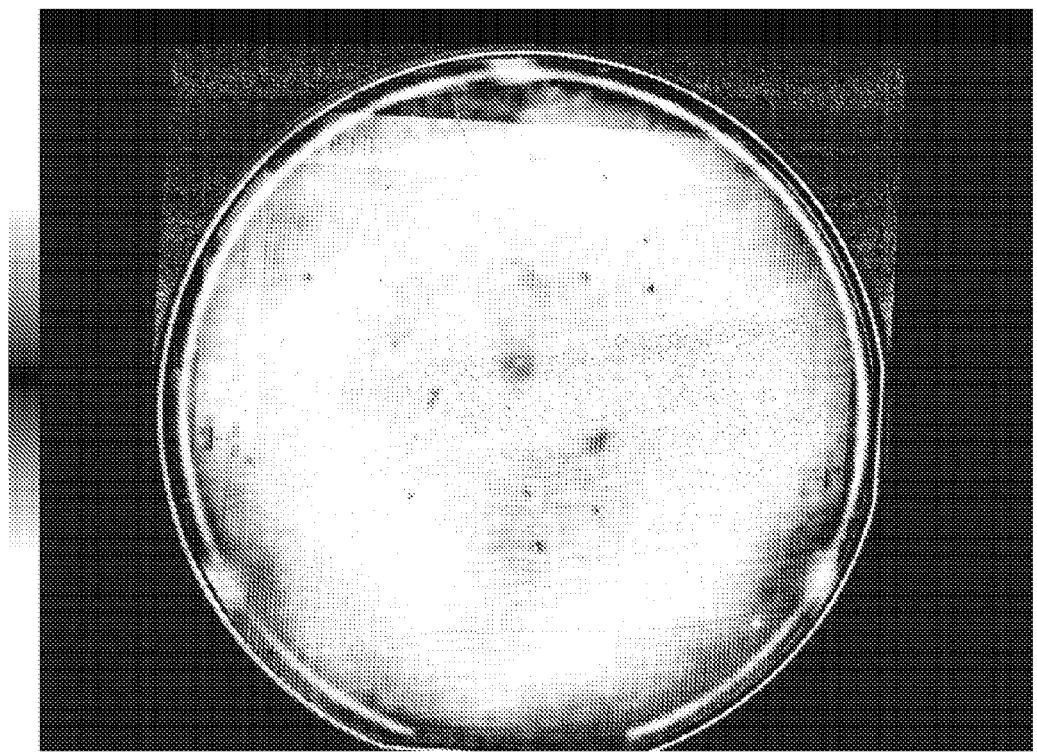
FIG. 33 is an example infrared image illustrating an iron foil direct bonded to a (111) Si substrate.

Pure (110) iron foils with 500 nm thickness were positioned on mirror-polished (111) Si substrates. The surfaces of the substrates and iron foils were cleaned beforehand. The foils were directly bonded with the substrate by using a wafer bonder in fusion mode (SB6, Karl Suss Wafer Bonder) at 450° C. for 30 minutes. FIG. 33 is an example infrared image illustrating an iron foil direct bonded to a (111) Si substrate.

Ions of atomic $N^+$ were accelerated to 100 keV and implanted into the iron foils vertically with fluences ranging from $2\times10^{16}/cm^2$ to $5\times10^{17}/cm^2$ at room temperature. The samples were exposed to the same implant energy but different nitrogen fluencies. After that, a two-step post-annealing process was applied on the implanted foils. The first annealing step was pre-annealing at 500° C. in a $N_2$ and Ar mixed atmosphere for 30 minutes. The pre-annealing was followed with post-annealing at 150° C. for 40 hours in vacuum.

Figure 34:
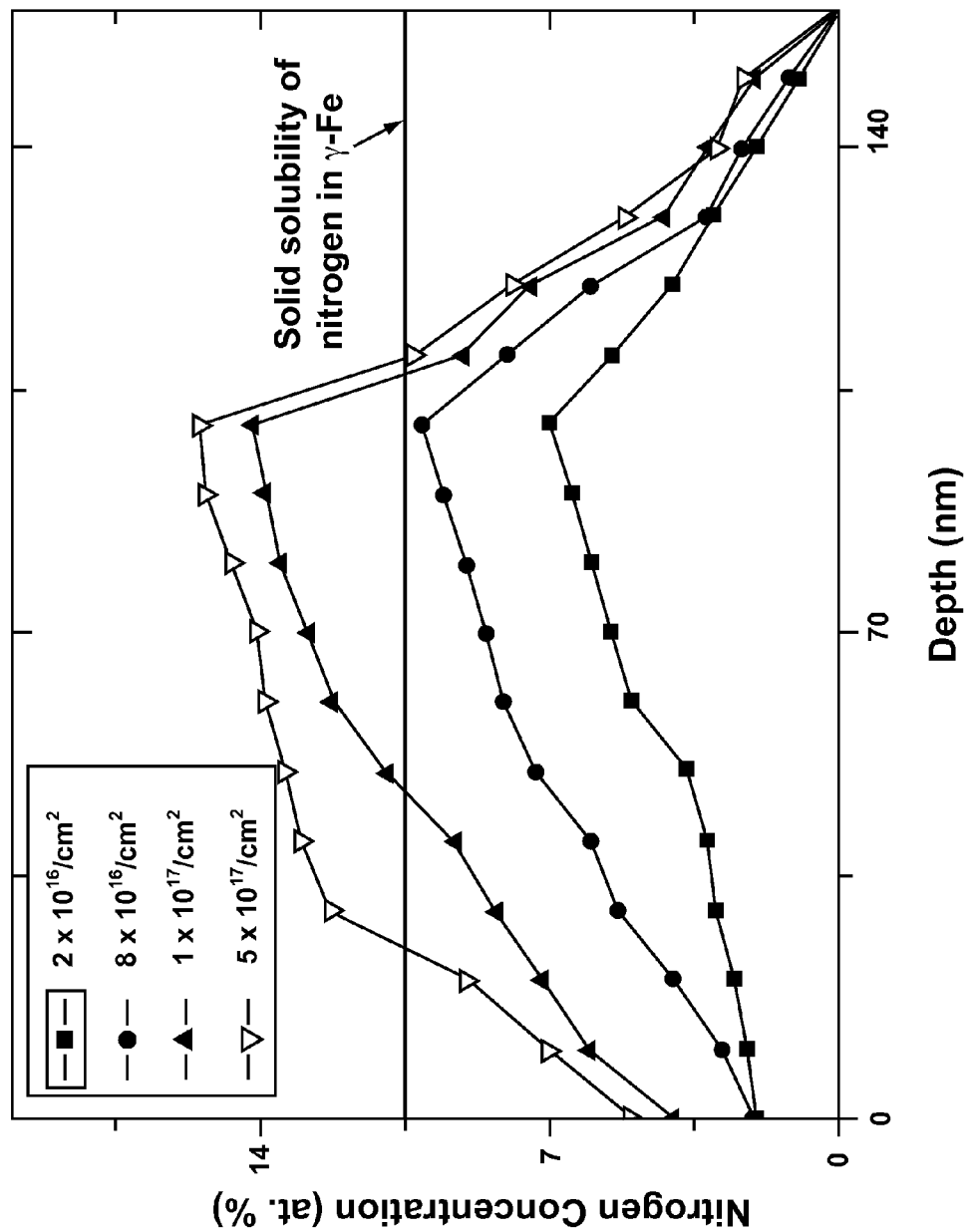
FIG. 34 is a diagram illustrating example nitrogen depth profiles for the ion implanted sample before the two-step annealing, which were measured by Auger Electron Spectroscopy (AES) with $Ar^+$ as the in-depth milling source.

FIG. 34 is a diagram illustrating example nitrogen depth profiles for the ion implanted sample before the two-step annealing, which were measured by Auger Electron Spectroscopy (AES) with $Ar^+$ as the in-depth milling source. FIG. 34 shows the nitrogen distribution before annealing for four samples with implantation fluencies of $2\times10^{16}/cm^2$, $8\times10^{16}/cm^2$, $1\times10^{17}/cm^2$ and $5\times10^{17}/cm^2$, respectively. The nitrogen implant range inside the foil is determined by the implant energy. As shown in FIG. 1, the four samples have substantially the same implant range (about 160 nm) and the substantially the same peak position (about 100 nm). This is coincident with the simulation result by SRIM.

Figure 35:
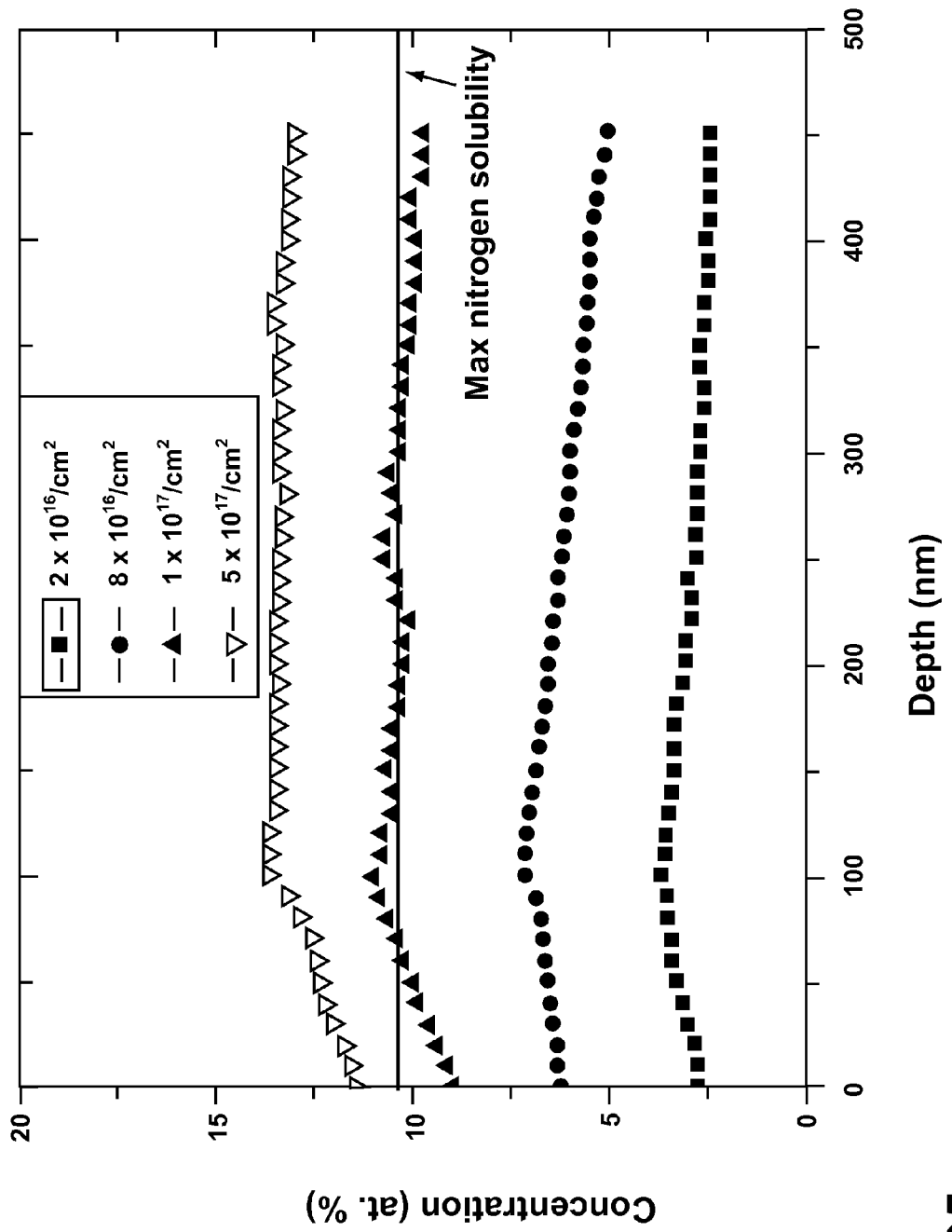
FIG. 35 is a diagram illustrating example nitrogen depth profiles after the two-step annealing.

FIG. 35 is a diagram illustrating example nitrogen depth profiles after the two-step annealing. Nitrogen concentrations in the foils are substantially homogeneously distributed throughout the depth of the foils after annealing. The nitrogen concentration distribution corresponding to $1\times10^{17}/cm^2$ fluence is about 11 at. %, close to the stoichiometric ratio of nitrogen in $Fe_{16}N_2$. For the sample with $5\times10^{17}/cm^2$ fluence, the nitrogen concentration has surpassed the achievable maximum nitrogen solubility in iron.

Figure 36:
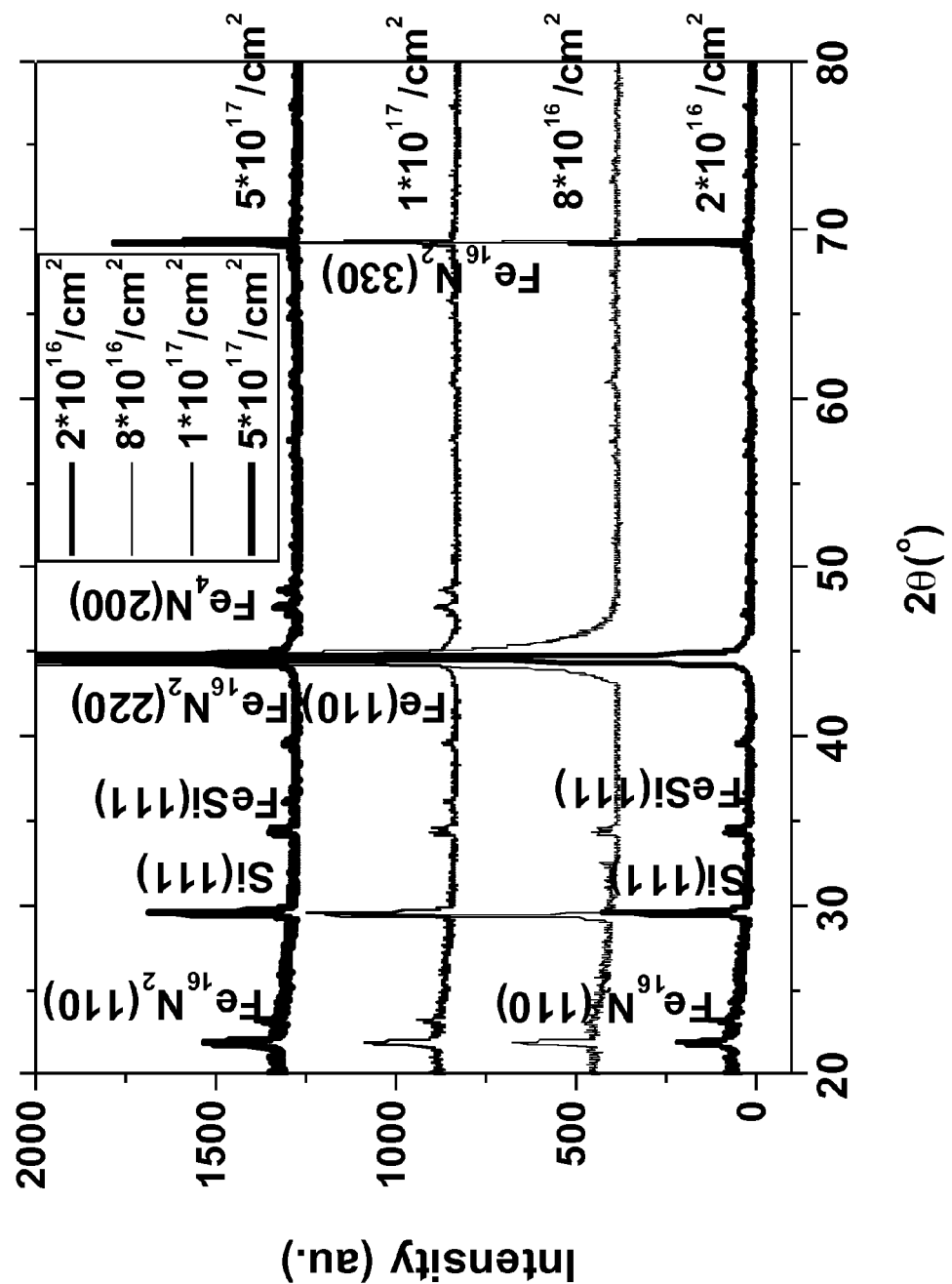
FIG. 36 is a diagram illustrating example XRD spectra for foil samples with different nitrogen fluencies on Si(111) substrate after post-annealing.

The crystal structure of foil samples was characterized using Siemens D5005 X-ray diffractometer (XRD) with Cu Kα radiation source. FIG. 36 is a diagram illustrating example XRD spectra for foil samples with different nitrogen fluencies on Si(111) substrate after post-annealing. $Fe_{16}N_2$ phase always exists at tested all conditions with ion fluences varied from $2\times10^{16}/cm^2$ to $5\times10^{17}/cm^2$. For ion fluences of $2\times10^{16}/cm^2$ and $8\times10^{16}/cm^2$, only the $Fe_{16}N_2$ phase iron nitride was observed. For the samples with fluences of $1\times10^{17}/cm^2$ and $5\times10^{17}/cm^2$, because the nitrogen concentrations were larger than 11.1 at. %, the ϵ-iron nitride ($Fe_4N$) peak was also observed. The FeSi(111) phase can be observed at all the fluences, indicating an iron silicide interface appearing due to fusion bonding at 450° C.

Figure 37:
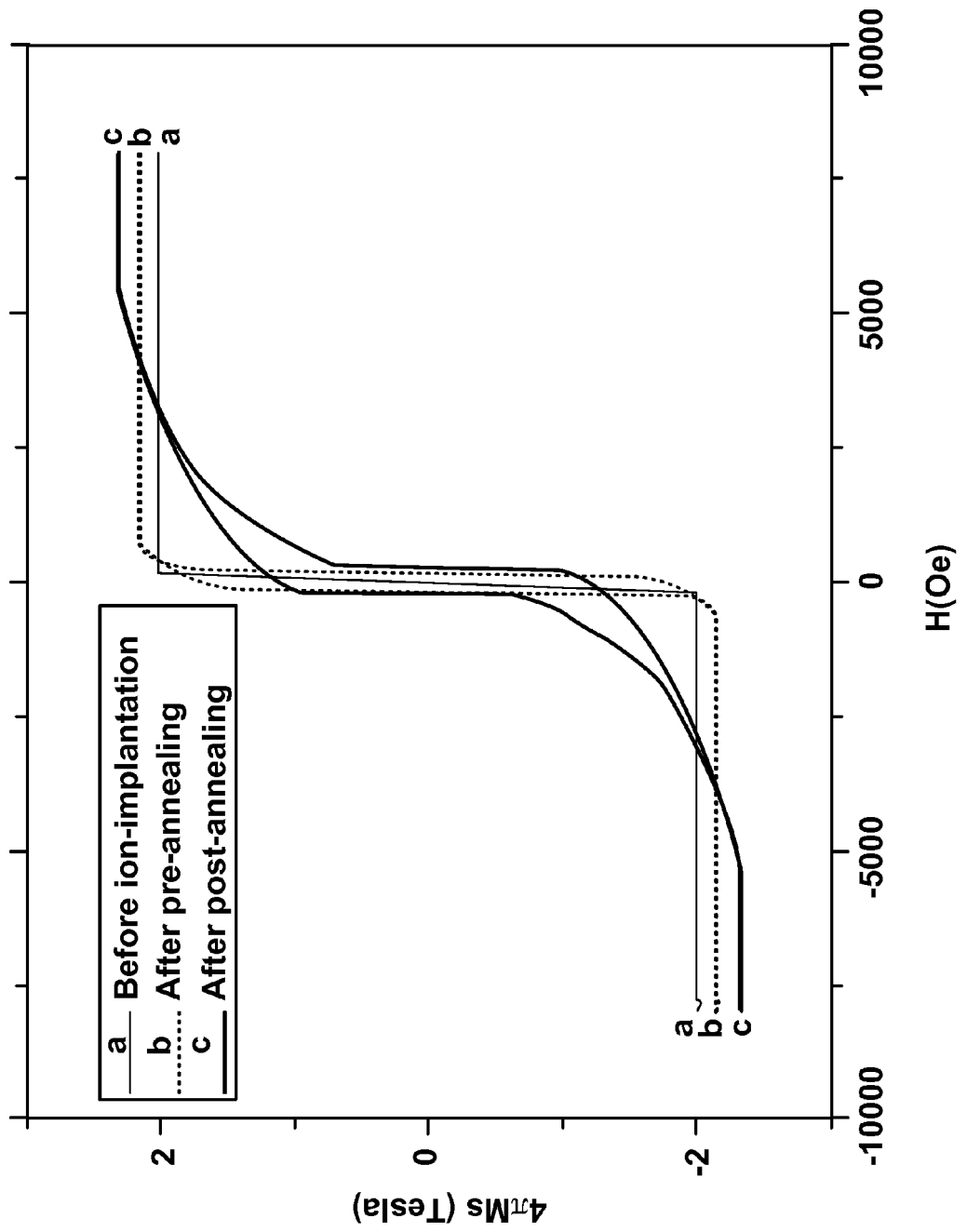
FIG. 37 is a diagram illustrating example hysteresis loops of the sample prepared with $1\times10^{17}/cm^2$ fluence at different stages.

FIG. 37 is a diagram illustrating example hysteresis loops of the sample prepared with $1\times10^{17}/cm^2$ fluence at different stages, which were measured in the foil plane using a Vibrating Sample Magnetometer (VSM) calibrated by a standard Ni sample at room temperature. The three M-H loops correspond to the same sample before ion-implantation, after ion-implantation and a pre-annealing step, and after ion-implantation and after both pre-annealing and post-annealing steps. For the pure iron foil before ion-implantation, its magnetic property is in good agreement with Fe(110) single crystal. Its remanent magnetization value is equal to its saturation magnetization value with $4\pi M_S$, which is around 2.02 T at room temperature. For the sample after the ion-implantation and 500° C., 0.5 hr pre-annealing step, the saturation magnetization increases about 7%, up to 2.15 T. Meanwhile, the remanent magnetization value after the pre-annealing step was reduced and the saturation field (Hs) was increased up to about 1000 Oe, which indicates the existence of the $Fe_8N$ phase after the pre-annealing step.

The post-annealing step at 150° C. for 40 hours tremendously changed the MH loop of the sample, which matches well with the formation of the $Fe_{16}N_2$ phase in the sample as indicated in FIG. 36. As shown by in FIG. 37, a hard magnetic behavior is clearly observed with a saturation field of 5.3 kOe. This is consistent with the existence of large magnetocrystalline anisotropy due to the body-center-tetragonal (bct) structure in $Fe_{16}N_2$. Additionally, a 15% increase in the saturation magnetization is observed in this sample, which is greater than the VSM testing error. The absolute $M_s$ value is increased to 2.32 T, compared to 2.02 T for the control sample (the starting single crystal iron foil). XRD pattern as shown in FIG. 36 presents clearly the mixed phases of Fe and $Fe_{16}N_2$ in the sample. The estimated volume ratio for the $Fe_{16}N_2$ phase in this sample based on the XRD pattern is about 35%. Thus, the saturation magnetization of $Fe_{16}N_2$ phase in this sample is calculated as about 2.9 T. For this calculation, we assumed that the Fe matrix in the sample possesses the same saturation magnetization as before the ion-implantation and annealing, which is reasonable since we used the same sample before and after ion-implantation.

Figure 38:
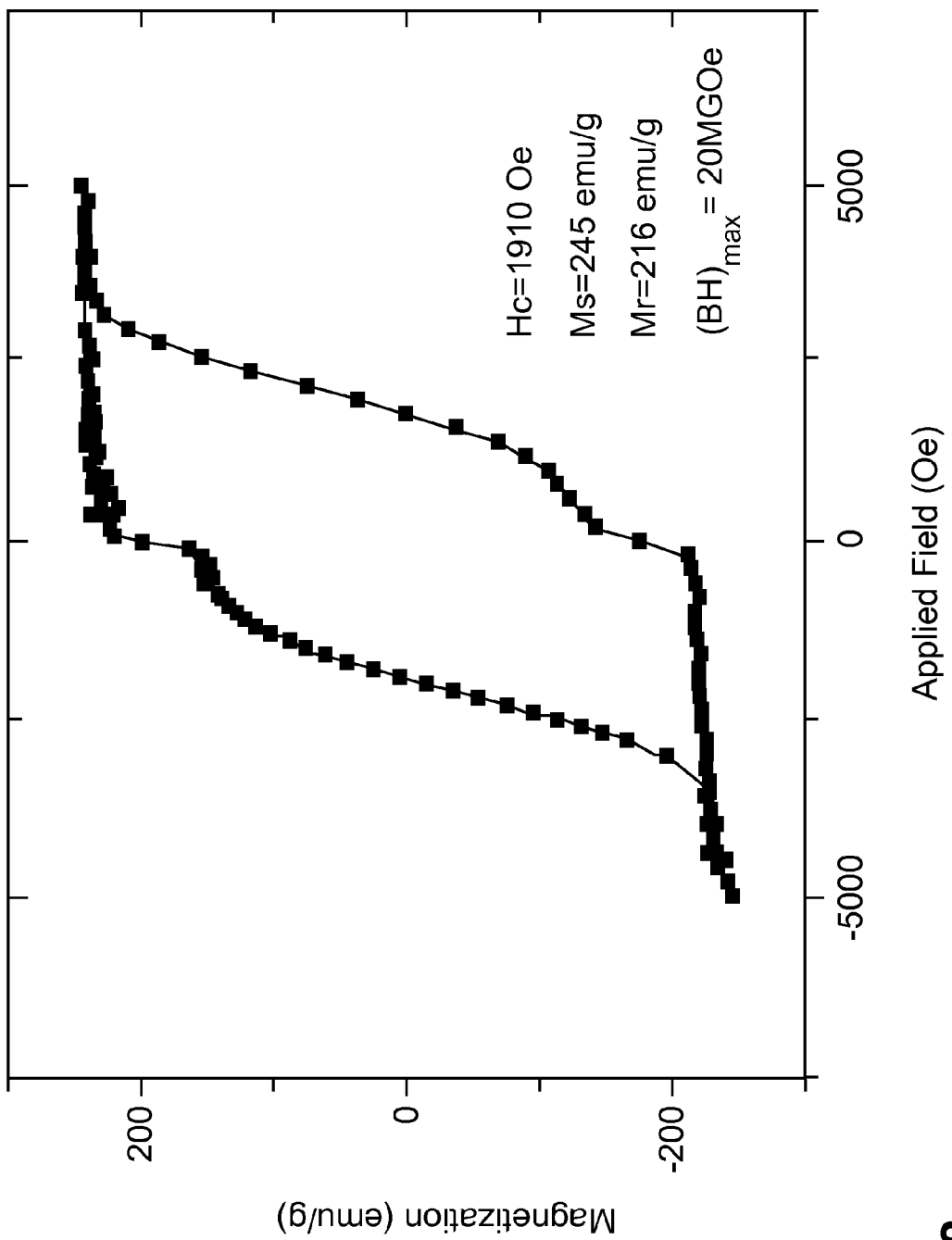
FIG. 38 is a diagram illustrating an example hysteresis loop of the sample prepared with $5\times10^{17}/cm^2$ fluence after post-annealing.
Figure 39:
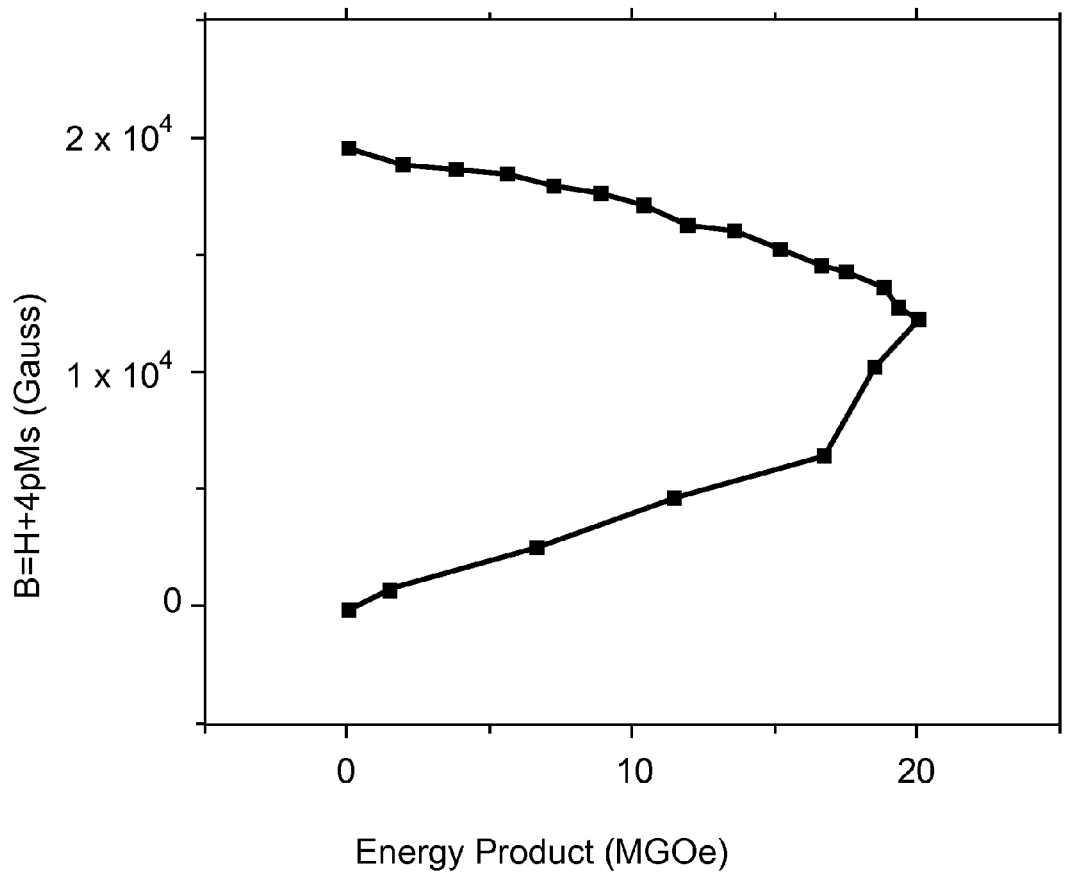
FIG. 39 is a diagram illustrating the calculated energy product of the film tested to obtain the results presented in FIG. 38.

For the sample with $5\times10^{17}/cm^2$ fluence, its magnetic property before annealing is substantially similar to the result shown in FIG. 37. However, the magnetic properties of the film change significantly after the post-annealing, as shown in FIGS. 38 and 39, with an obvious increment in coercivity and so, the maximum energy product. FIG. 38 is a diagram illustrating an example hysteresis loop of the sample prepared with $5\times10^{17}/cm^2$ fluence after post-annealing. The coercivity of the film is 1910 Oe, the saturation magnetization is 245 emu/g, and the energy product ((BH)$_{max}$) is about 20 MGOe. FIG. 39 is a diagram illustrating the calculated energy product of the film tested to obtain the results presented in FIG. 38. FIG. 39 illustrates that the maximum value of the energy product of the film is about 20 MGOe.

Figure 40:
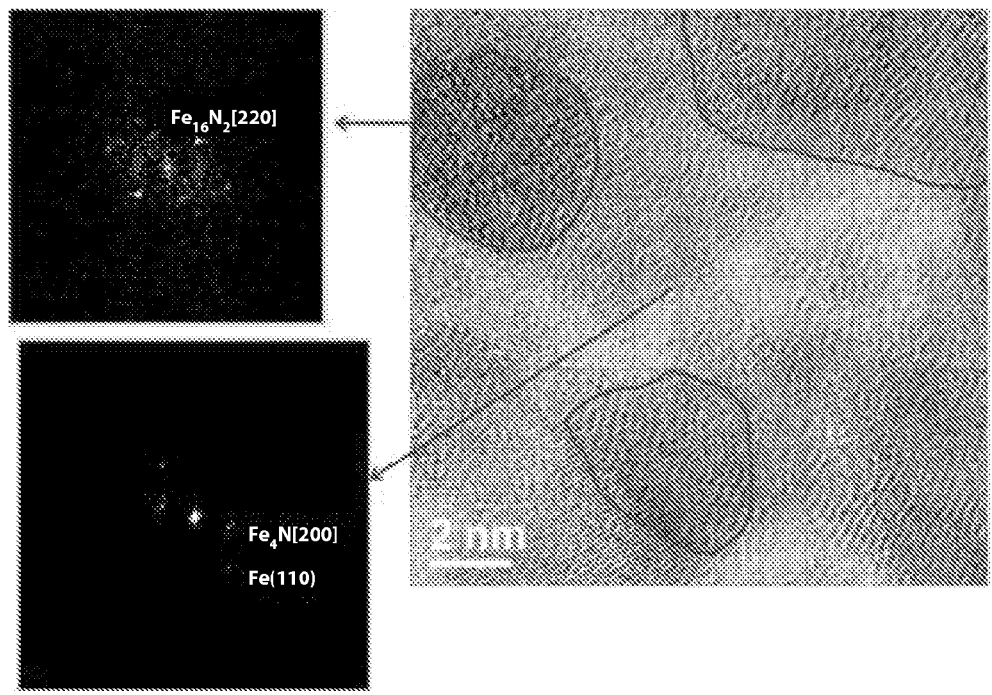
FIG. 40 is an example high resolution transmission electron microscopy (HRTEM) image of the film tested to obtain the results presented in FIGS. 38 and 39.
Figure 41:
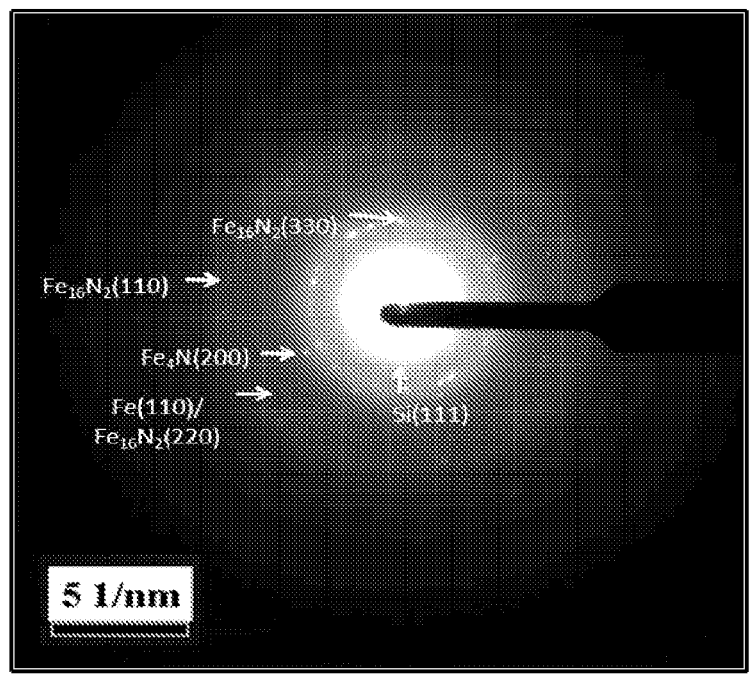
FIG. 41 is an example image showing an x-ray diffraction pattern for the sample tested to obtain the results presented in FIG. 40.

FIG. 40 is an example high resolution transmission electron microscopy (HRTEM) image of the film tested to obtain the results presented in FIGS. 38 and 39. The TEM sample was obtained by cutting and polishing the foil perpendicular to the surface by Focused Ion Beam (FIB) (FEI™ Quanta 200 3D, available from FEI™, Hillsboro, Oreg.). As shown in FIG. 40, the sample is consisted of granular structure. Sub-regions of the sample correspond different crystal structures, one with lattice fringe distance of 2.022 nm corresponding to $\alpha''$-$Fe_{16}N_2$(220), the other with lattice fringe distances of 1.897 nm and 2.027 nm corresponding to $Fe_4N$(200) and Fe(110), respectively. FIG. 41 is an example image showing an x-ray diffraction pattern for the sample tested to obtain the results presented in FIG. 40.

Various examples have been described. These and other examples are within the scope of the following claims.

The invention claimed is:

1. A bulk permanent magnetic material comprising:
   between about 5 volume percent and about 40 volume percent $Fe_{16}N_2$ phase domains;
   a plurality of nonmagnetic atoms or molecules forming domain wall pinning sites; and
   a balance soft magnetic material, wherein at least some of the soft magnetic material comprising $Fe_8N$ is magnetically coupled to the $Fe_{16}N_2$ phase domains via exchange spring coupling.

2. The bulk permanent magnetic material of claim 1, comprising between about 5 volume percent and about 20 volume percent $Fe_{16}N_2$ phase domains.

3. The bulk permanent magnetic material of claim 1, wherein the $Fe_{16}N_2$ phase domains are distributed throughout a volume of the bulk permanent magnetic material.

4. The bulk permanent magnetic material of claim 1, wherein the plurality of nonmagnetic atoms or molecules comprises an element or compound selected from the group consisting of Al, Cu, Ti, Mn, Zr, Ta, B, C, Ni, Ru, $SiO_2$, $Al_2O_3$, or combinations thereof.

5. The bulk permanent magnetic material of claim 1, wherein the soft magnetic material further comprises an element or compound selected from the group consisting of $Fe_4N$, Fe, and combinations thereof.

6. The bulk permanent magnetic material of claim 1, wherein the bulk permanent magnetic material comprises a plurality of workpieces of iron nitride, each workpiece of iron nitride including the soft magnetic material and between about 5 volume percent and about 40 volume percent $Fe_{16}N_2$ phase domains.

7. The bulk permanent magnetic material of claim 1, wherein a smallest dimension of the bulk permanent magnetic material is greater than about 100 nanometers.

8. The bulk permanent magnetic material of claim 7, wherein the smallest dimension is greater than about 100 micrometers.

9. The bulk permanent magnetic material of claim 1, wherein the magnetic material has an energy product of greater than about 10 MGOe.

10. The bulk permanent magnetic material of claim 9, wherein the magnetic material has an energy product of greater than about 30 MGOe.

11. The bulk permanent magnetic material of claim 1, wherein the bulk permanent magnetic material is naturally crystallographically coherent.

12. The bulk permanent magnetic material of claim 1, wherein the bulk permanent magnet does not include a powder phase.

13. The bulk permanent magnetic material of claim 1, wherein the domain wall pinning sites have sizes ranging from several nanometers to several hundred nanometers.

14. A method comprising:
   forming a plurality of workpieces of iron nitride material, each of the plurality of workpieces including between about 5 volume percent and about 40 volume percent of $Fe_{16}N_2$ phase domains and a soft magnetic material comprising $Fe_8N$;
   introducing a plurality of nonmagnetic atoms or molecules between the plurality of workpieces or within at least one of the plurality of workpieces of iron nitride material; and
   joining the plurality of workpieces of iron nitride to form a bulk permanent magnetic material including iron nitride with between about 5 volume percent and about 40 volume percent of $Fe_{16}N_2$ phase domains, the plurality of nonmagnetic atoms or molecules forming domain wall pinning sites, and a balance soft magnetic material comprising $Fe_8N$, wherein at least some of the soft magnetic material is magnetically coupled to the $Fe_{16}N_2$ phase domains via exchange spring coupling.

15. The method of claim 14, wherein forming the plurality of workpieces of iron nitride material comprises:
   implanting N+ ions in a textured iron workpiece using ion implantation to form a textured iron nitride workpiece; and
   post-annealing the textured iron nitride workpiece to form $Fe_{16}N_2$ phase domains within the textured iron nitride workpiece.

16. The method of claim 15, further comprising forming the textured iron workpiece using fast belt casting.

17. The method of claim 15, wherein implanting N+ ions in the textured workpiece using ion implantation to form the textured iron nitride workpiece comprises:
   accelerating N+ ions to an energy of less than about 180 kiloelectron volts.

18. The method of claim 15, wherein implanting N+ ions in the textured workpiece using ion implantation to form the textured iron nitride workpiece comprises:
   providing N+ ions at a fluence of between about $2 \times 10^{16}/cm^2$ and about $1 \times 10^{17}/cm^2$.

19. The method of claim 15, wherein implanting N+ ions in the textured workpiece using ion implantation to form the textured iron nitride workpiece comprises:
   providing sufficient N+ ions to form an average concentration of nitrogen in the textured iron nitride workpiece between about 8 atomic percent and about 15 atomic percent.

20. The method of claim 14, wherein forming the plurality of workpieces of iron nitride material comprises:
   mixing a nitrogen source in molten iron;
   fast belt casting the molten iron to form a textured iron nitride workpiece; and
   post-annealing the textured iron nitride workpiece to form $Fe_{16}N_2$ phase domains within the textured iron nitride workpiece.

21. The method of claim 20, wherein mixing nitrogen in molten iron comprises:
   mixing the nitrogen source in molten iron to result in a concentration of nitrogen atoms in the molten iron between about 8 atomic percent and about 15 atomic percent.

22. The method of claim 20, wherein the nitrogen source comprises at least one of ammonia, ammonium azide, or urea.

23. The method of claim 14, wherein the textured iron nitride workpiece includes a (100) or a (110) crystal structure.

24. The method of claim 14, wherein the textured iron nitride workpiece defines a dimension between about 1 micrometer and about 10 millimeters.

25. The method of claim 14, wherein post-annealing the textured iron nitride workpiece to form $Fe_{16}N_2$ phase domains within the textured iron nitride workpiece comprises:
   exerting a strain on the textured iron nitride workpiece between about 0.1% and about 7%; and
   while exerting the strain on the textured iron nitride workpiece, heating the textured iron nitride workpiece to a temperature between about 120° C. and about 250° C. for at least about 5 hours.

26. The method of claim 25, wherein heating the textured iron nitride workpiece to a temperature between about 120° C. and about 250° C. for at least about 5 hours comprises:
   heating the textured iron nitride workpiece to a temperature of about 150° C. for between about 20 hours and about 40 hours.

27. The method of claim 15, wherein post-annealing the textured iron nitride workpiece to form $Fe_{16}N_2$ phase domains within the textured iron nitride workpiece comprises:
   forming between about 5 volume percent and about 40 volume percent of $Fe_{16}N_2$ phase domains within the textured iron nitride workpiece.

28. The method of claim 15, wherein post-annealing the textured iron nitride workpiece to form $Fe_{16}N_2$ phase domains within the textured iron nitride workpiece comprises:
   forming between about 10 volume percent and about 17 volume percent of $Fe_{16}N_2$ phase domains within the textured iron nitride workpiece.

29. The method of claim 15, wherein post-annealing the textured iron nitride workpiece to form $Fe_{16}N_2$ phase domains within the textured iron nitride workpiece comprises:
   forming $Fe_{16}N_2$ distributed throughout a volume of the textured iron nitride workpiece.

30. The method of claim 14, wherein introducing the plurality of nonmagnetic material atoms or molecules between the plurality of workpieces or within at least one of the plurality of workpieces of iron nitride material comprises:
   implanting nonmagnetic ions within at least one of the plurality of workpieces of iron nitride material using ion implantation.

31. The method of claim 14, wherein introducing the plurality of nonmagnetic material atoms or molecules between the plurality of workpieces or within at least one of the plurality of workpieces of iron nitride material comprises:
   implanting nonmagnetic molecules within at least one of the plurality of workpieces of iron nitride material using cluster implantation.

32. The method of claim 14, wherein introducing the plurality of nonmagnetic material atoms or molecules between the plurality of workpieces or within at least one of the plurality of workpieces of iron nitride material comprises:
   introducing workpieces of the plurality of nonmagnetic material atoms or molecules between a first workpiece and a second workpiece of the plurality of workpieces of iron nitride material.

33. The method of claim 14, wherein introducing the plurality of nonmagnetic material atoms or molecules between the plurality of workpieces or within at least one of the plurality of workpieces of iron nitride material comprises:
   introducing a powder comprising at least one of iron or nonmagnetic material between a first workpiece and a second workpiece of the plurality of workpieces of iron nitride material.

34. The method of claim 14, wherein the plurality of nonmagnetic material atoms or molecules are selected from the group consisting of Al, Cu, Ti, Mn, Zr, Ta, B, C, Ni, Ru, $SiO_2$, $Al_2O_3$, or combinations thereof.

35. The method of claim 14, wherein joining the plurality of workpieces of iron nitride to form a bulk magnet including iron nitride with between about 5 volume percent and about 40 volume percent of $Fe_{16}N_2$ phase domains comprises:

heating the plurality of workpieces of iron nitride to a temperature below about 250° C. for at least about 5 hours while applying a pressure of between about 0.2 gigapascal and about 10 gigapascals to the plurality of workpieces of iron nitride.

* * * * *